United States Patent [19]
Maruyama et al.

[11] Patent Number: 5,267,346
[45] Date of Patent: Nov. 30, 1993

[54] COMBINATION PROBLEM SOLVING APPARATUS

[75] Inventors: Fumihiro Maruyama; Yoriko Minoda; Shuho Sawada; Yuka Takizawa; Hiroyuki Yoshida, all of Kawasaki, Japan

[73] Assignee: Fujitsu Limited, Kawasaki, Japan

[21] Appl. No.: 791,676

[22] Filed: Nov. 14, 1991

[30] Foreign Application Priority Data

Nov. 14, 1990 [JP] Japan .................................. 2-307915
Jan. 22, 1991 [JP] Japan .................................. 3-021617

[51] Int. Cl.⁵ ........................ G06F 15/16; G06F 15/31
[52] U.S. Cl. ........................................ 395/10; 395/50; 395/51
[58] Field of Search ...................... 364/402; 395/10, 51

[56] References Cited

U.S. PATENT DOCUMENTS 3,134,017 5/1964 Burhans et al. ..................... 364/402
4,744,027 5/1988 Bayer et al. .......................... 364/402
5,107,452 4/1992 Karmarker et al. ................. 364/402

OTHER PUBLICATIONS

Maruyama, F. et al., "Solving Combinatorial Constraint Satisfaction and Optimization Problems Using Sufficient Conditions for Constraint Violation", *Proceedings of International Symposium on Artificial Intelligence* 1991, Mexico, pp. 269-275.
Gavish, B., "Augmented Lagrangean Based Algorithms for Centralized Network Design", *IEEE Transactions on Communications*, vol. COM33, No. 12, Dec. 1985.
Feldman et al., "Optimization Algorithms for Student Scheduling via Constraint Satisfiability", *The Computer Journal*, vol. 33, No. 4, Aug. 1990, pp. 356-364.
Costa, M. C., "Une Etude Pratique de Découpes de Panneaux de Bois", *R.A.I.R.O. Recherche Operationnelle*, vol. 18, No. 3, Aug. 1984, pp. 211-219.
European Search Report, The Hague, Apr. 19, 1993.
Wah et al., "MANIP—A Multicomputer Architecture for Solving Combinatorial Extremum-Search Problems", IEEE Trans. on Computers, May 1984, 377-390.

de Kleer et al., "Diagnosing Multiple Faults", Artificial Intelligence, 1987, 97-130.
Baldwin, D., "Consul: A Parallel Constraint Language," IEEE Software, Jul. 1989, 62-69.
Minton et al., "Solving Large-Scale Constraint Satisfaction and Scheduling Problems Using a Heuristic Repass Method", AAAI-90, Jul. 1990; 17-24.
Cohen, J., "Constraint Logic Programming Languages", Comm. of the ACM, Jul. 1990, 52-68.

Primary Examiner—Michael R. Fleming
Assistant Examiner—Robert W. Downs
Attorney, Agent, or Firm—Staas & Halsey

[57] ABSTRACT

A computer based combination problem processor solves constrained combination satisfaction problems for determining discrete values of respective variables in which the constraint is externally specified by a set of inequalities and equalities, and solves combination optimization problems for determining the discrete values of respective variables to minimize or maximize the value of a given objective function. The computer includes an initial constraint violating inequality creator for creating constraint violating inequalities reciprocal to the set of inequalities; a variable value changer for changing a variable value for examination of meeting constraints; a variable selector for selecting a value of a variable whose value is unknown; a constraint violating condition creator for creating a new constraint violating condition obtained as a logical product of simplified inequalities by digitizing a variable appearing in the constraint violating conditions created from the constraint violating inequalities, when none of the values satisfy the constraints produced by the processes by the variable value changer or the variable value selector. A constraint violating condition storer stores constraint violating conditions created by the constraint violating condition creator. A variable value is changed or selected such that none of the constraint violating conditions stored in the constraint violating condition storer are satisfied. The above obtained variable value combination satisfying none of the constraint violating conditions is the solution to the constrained combination satisfaction problem or the constrained combination optimization problem.

20 Claims, 33 Drawing Sheets

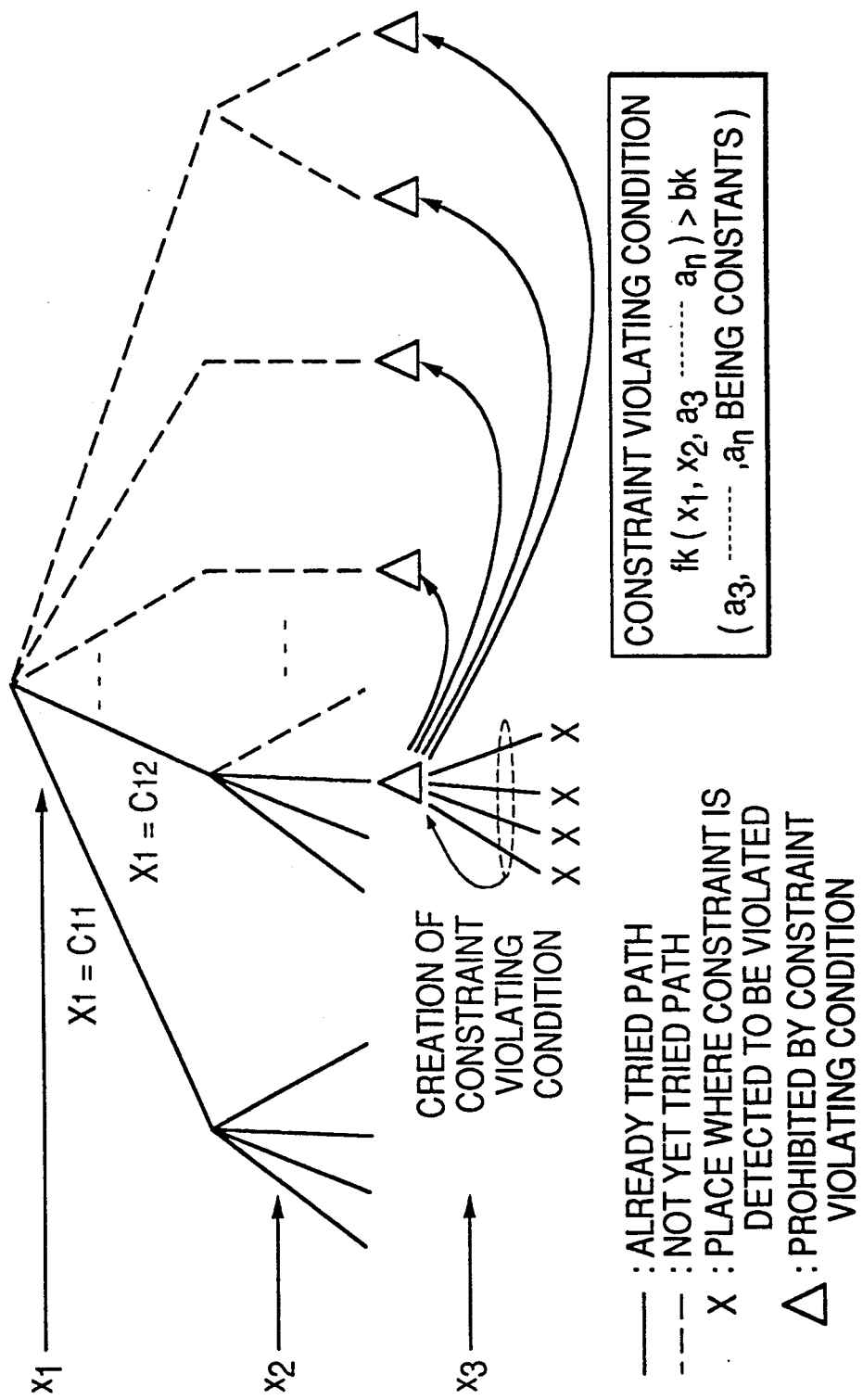

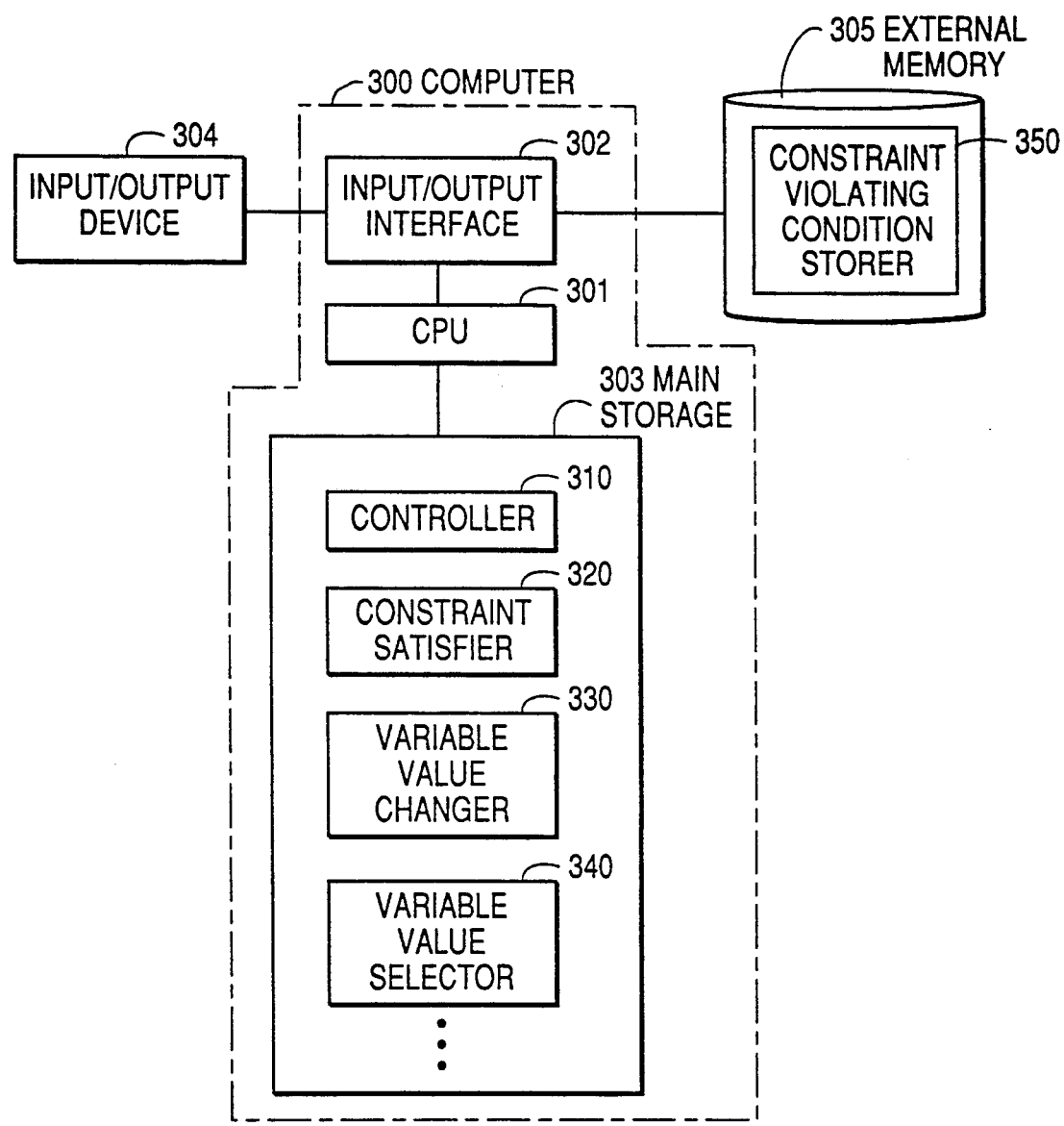

FIG. 8A

LIST OF VOLUMES AND UTILITIES BY ITEMS

|  | VOLUMES : 1 | EXPECTED UTILITIES : 2 |
|---|---|---|
| SNACK [ AGENT (0) ] | ( 0, 1 ) = 6 | ( 0, 2 ) = 1 |
| BOTTLE OF JUICE [ AGENT (1) ] | ( 1, 1 ) = 8 | ( 1, 2 ) = 3 |
| LUNCH BOX [ AGENT (2) ] | ( 2, 1 ) = 5 | ( 2, 2 ) = 7 |
| UMBRELLA [ AGENT (3) ] | ( 3, 1 ) = 2 | ( 3, 2 ) = 3 |

FIG. 8C

VOLUME SUM EXCEEDS CAPACITY LIMIT.

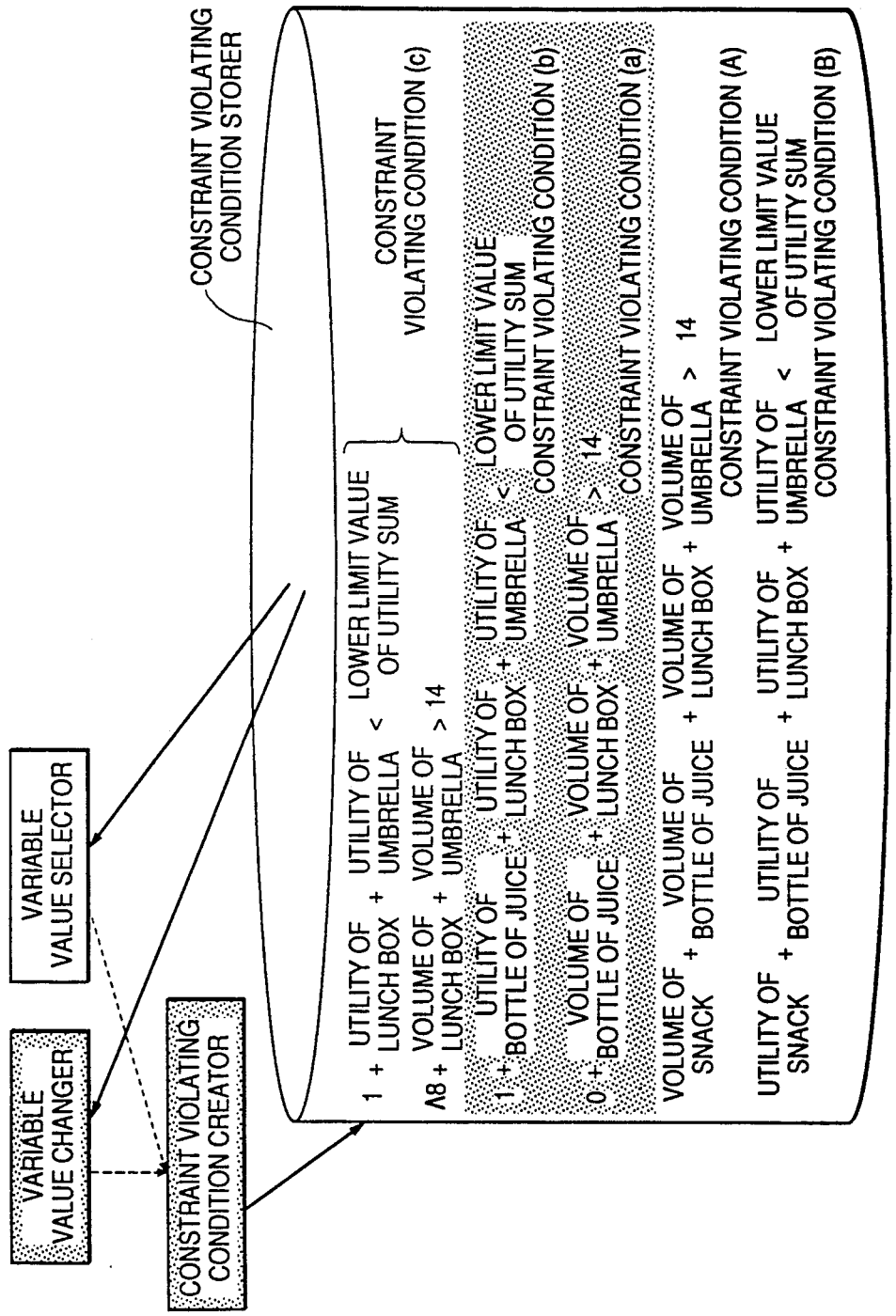

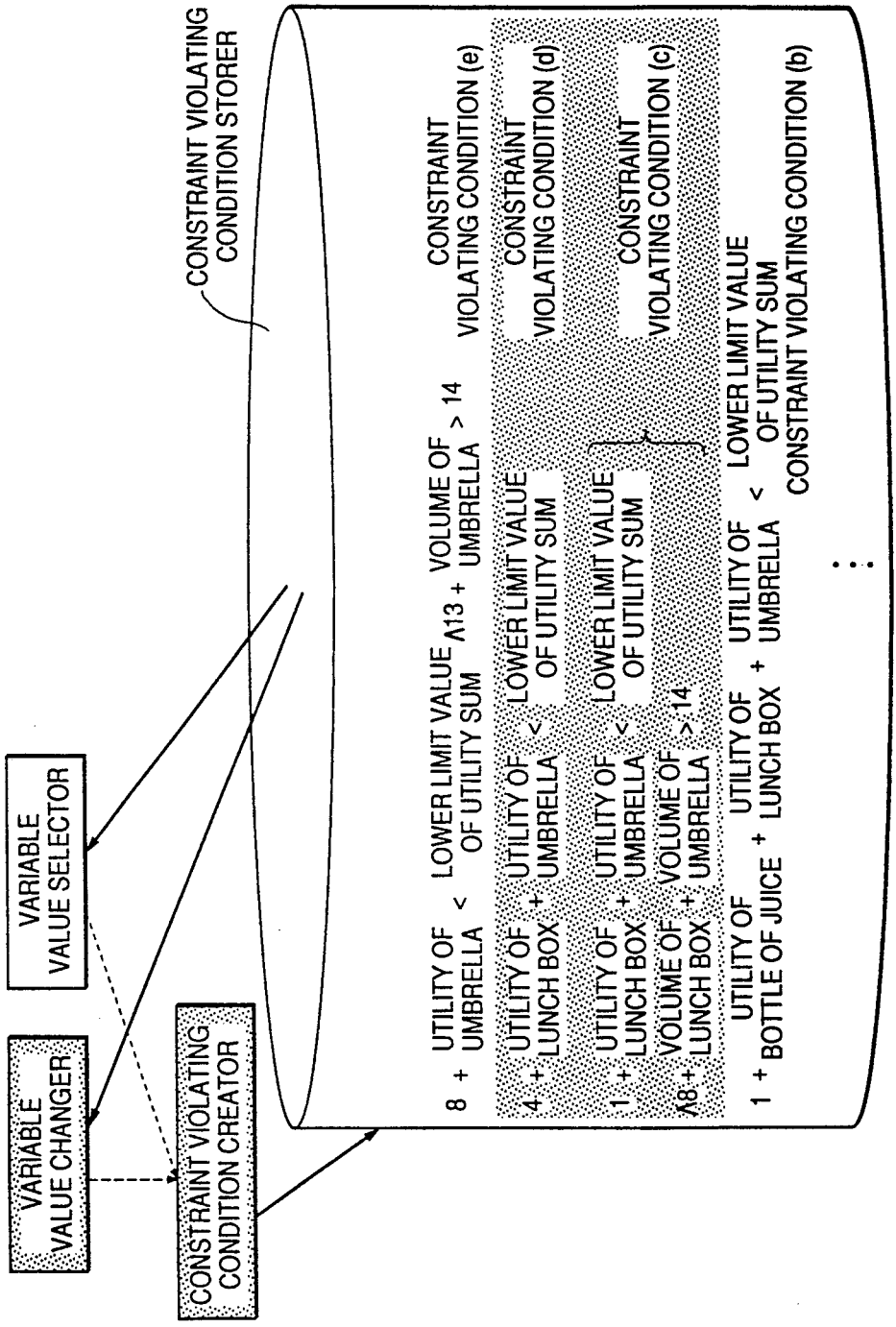

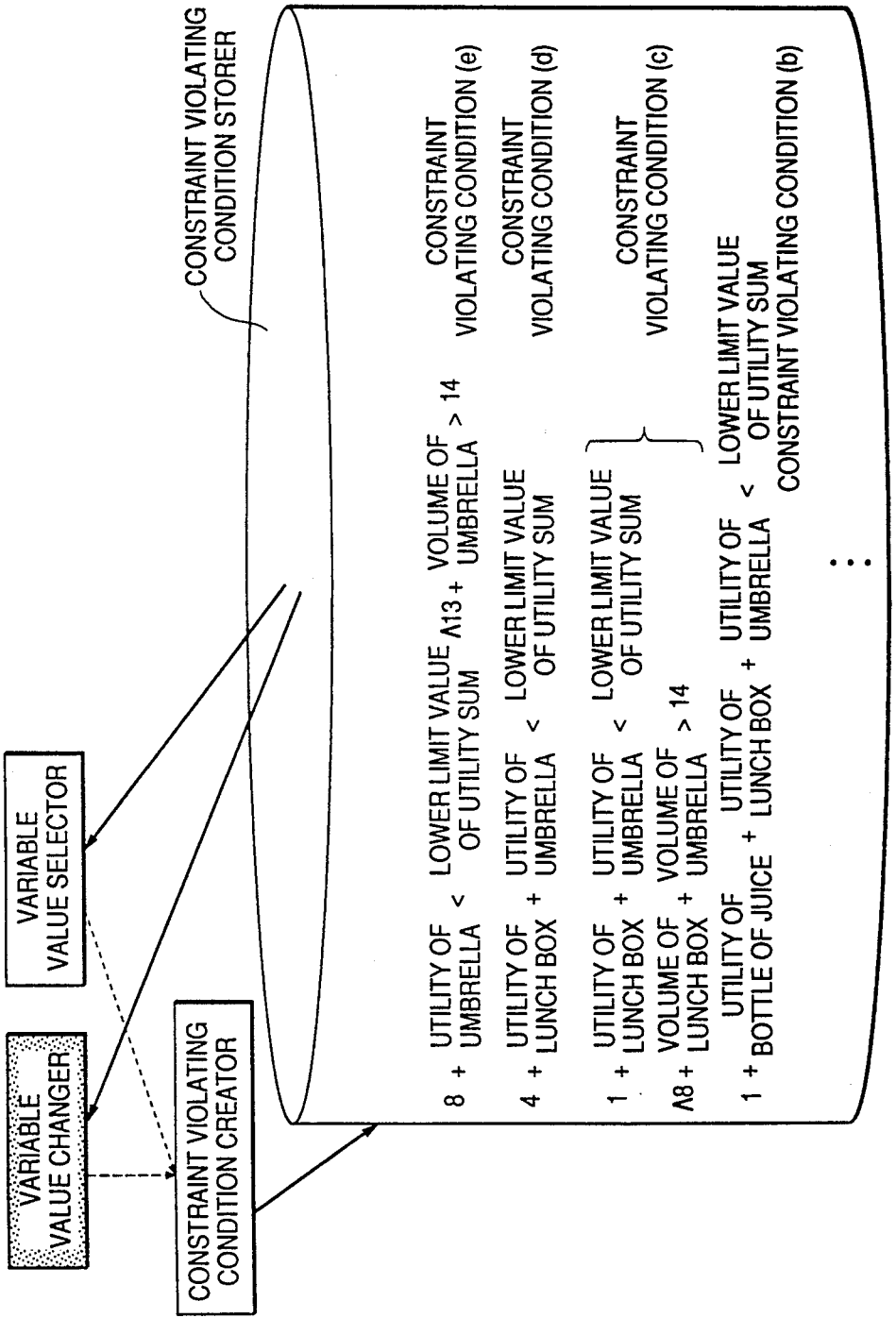

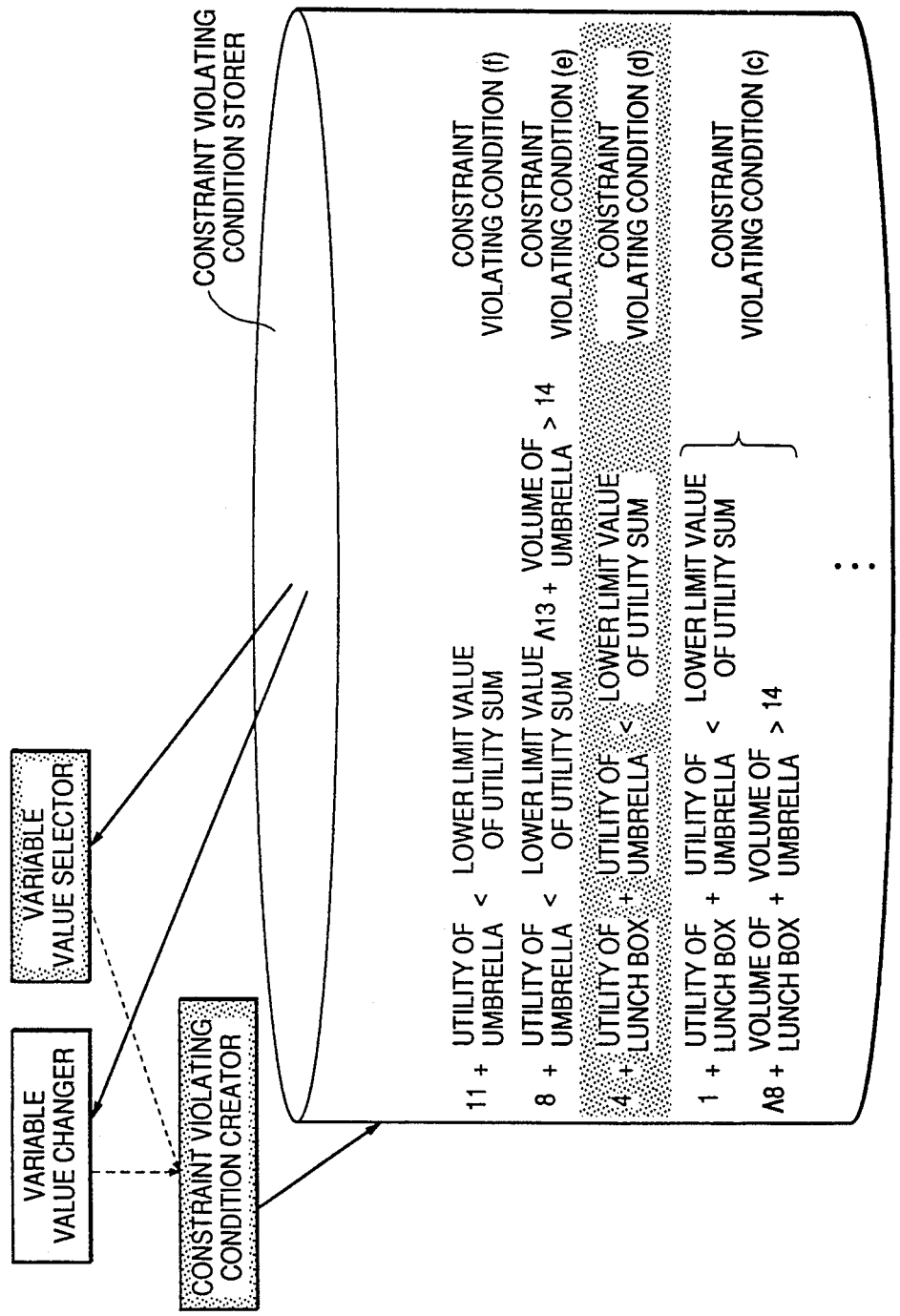

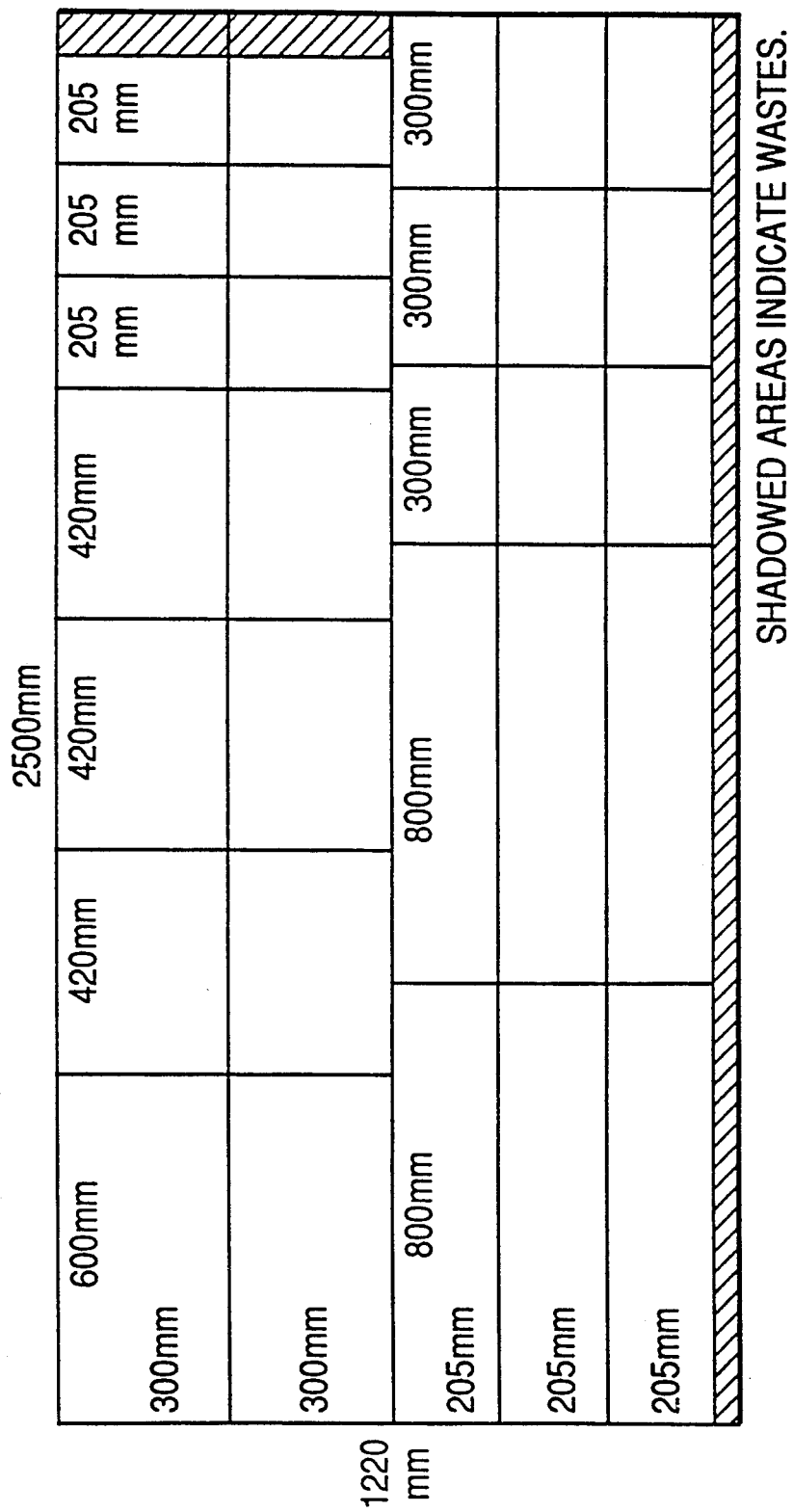

FIG. 11C

EXEMPLARY CONSTRAINT VIOLATING CONDITION $x_{16} + x_{26} + 1100 < 1600 \wedge x_{12} + x_{22} + 600 < 800 \wedge x_{13} + x_{23} + 150 < 200 \wedge x_{14} + x_{24} + < 600$

FIG. 11D

COMPARATIVE RESULTS WITH OTHER SOLUTIONS

| SOLUTIONS | WASTED AREAS (%) | COMPUTING TIME (SECONDS) | COMPUTERS | LANGUAGES |
|---|---|---|---|---|
| EXCLUSIVE PROGRAM | 6.44 | 20 | IBM370/168 | FORTRAN |
| INTEGER PROGRAMMING | 4.14 | 322 | VAX11/785 | CONSTRAINT LOGIC TYPE LANGUAGE CHIP |
| NON-INCONSISTENCY METHOD | 4.14 | 3 | VAX11/785 | CONSTRAINT LOGIC TYPE LANGUAGE CHIP |
| ART OF THIS INVENTION | 1.87 | 0.02 | SPARC STATION | C |

TRIAL 1 FOR COMPONENT A:
  30 GATES, 50ns
TRIAL 2 FOR COMPONENT A:
  60 GATES, 40ns

TRIAL 1 FOR COMPONENT B:
  70 GATES, 80ns
TRIAL 2 FOR COMPONENT B:
  80 GATES, 70ns

CONSTRAINT CONDITIONS : NO MORE THAN 110 GATES
& NO MORE THAN 110ns

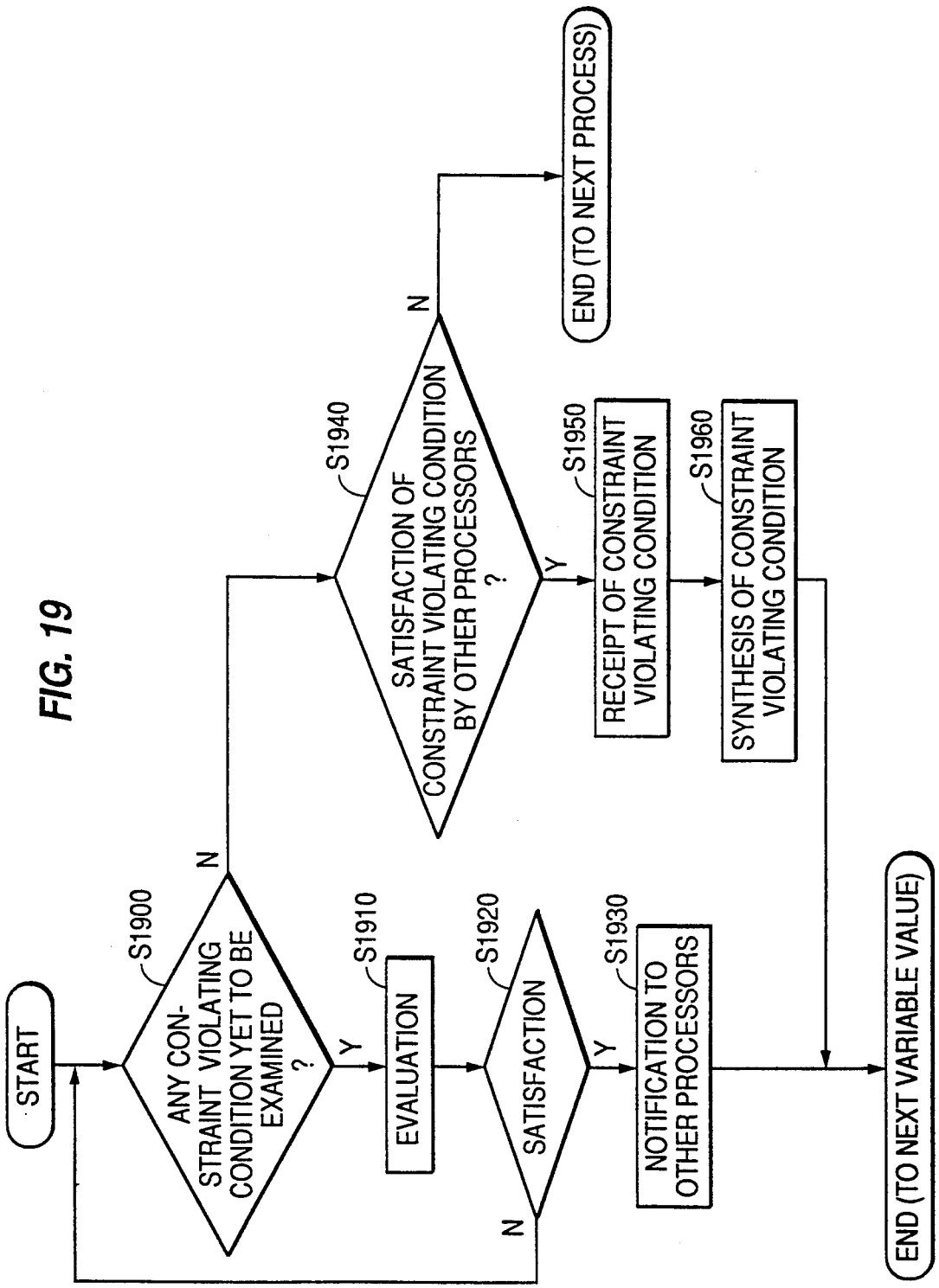

COMBINATION PROBLEM SOLVING APPARATUS

BACKGROUND OF THE INVENTION

Field of the Invention

This invention pertains to a combination problem solving apparatus, and more particularly to a computer for meeting or optimizing the constrained combinations of discrete variables.

Description of the Related Art

With recent advances in computer applications, it has become an urgent requirement to realize a computer that can quickly solve problems of satisfying or optimizing constrained combinations of discrete variables. The problems are as follows:

A set of inequalities about n variables $x_1, x_2, \ldots, x_n$ $f_k(x_1, x_2, \ldots, x_n) \leq b_k$ ($k=0, 1, \ldots, m$) are given.

Assume here that variables $x_i$ have discrete values $c_{ij}$ ($i=1, 2, \ldots, n; j=1, 2, 3, \ldots$). A constrained combination satisfaction problem is defined as a problem of determining (selecting) values of respective variables such that the above set of inequalities are all satisfied. In other words, a constrained combination satisfaction problem is defined as a problem of obtaining a map s: $\{1, 2, \ldots, n\} \to \{1, 2, 3, \ldots\}$ which satisfies another set of inequalities, $f_k(c_{1,s(1)}, c_{2,s(2)}, \ldots, c_{n,s(n)}) \leq b_k$ ($k=0, 1, \ldots, m$).

For instance, in an LSI logic design variables $x_1, x_2, \ldots, x_n$ are provided for respective components in a circuit. Under the following conditions,

[1] $b_O$ is the upper limit value for the number of gates,
[2] $b_k$ ($k=0, 1, \ldots, m$) is the upper limit value for the delay along path k (a k-th path),
[3] $a_{Oi}=1$ ($i=1, 2, \ldots, n$)
[4] $a_{ki}=1$ when path k ($k=0, 1, \ldots, m$) goes through an i-th component, and $a_{ki}=0$ otherwise,
[5] $d_O(x_i)$ is the number of gates in the i-th component,
[6] $d_k(x_i)$ ($k=1, 2, \ldots, m$) is the contribution by the i-th component to the delays along path k, (which is zero (0) when path k does not go through the i-th component,)

the following set of inequalities are considered.

$\text{SIGMA}(i=1 \text{ through } n) a_{ki} d_k(x_i) \leq b_k$ ($k=0, 1, \ldots, m$)

The set of inequalities express the constraints on circuit size and circuit speed.

Because variables $x_i$ have discrete values $c_{ij}$ ($i=1, 2, \ldots, n; j=1, 2, 3, \ldots$), i.e. because the methods for realizing respective components are discrete, the above set of inequalities reduce to a constrained combination satisfaction problem.

A combination optimization problem is a problem of both satisfying $f_k(x_1, x_2, x_n) \leq b_k$ ($k=1, \ldots, m$) and minimizing an objective function $f_O(x_1, x_2, \ldots, x_n)$ As an example of the combination optimization problem, a "cutting stock problem", is considered and is applicable to minimizing waste in cutting patterns from a paper roll or in cutting out various forms of shelves from a big piece of timber. Assume here, variables $x_1, x_2, \ldots, x_n$ correspond to pieces of timber (paper rolls), $b_k$ ($k=1, 2, \ldots, m$) is the minimum necessary number of the k-th shelf (pattern), and $d_k(x_i)$ ($k=1, 2, \ldots, m$) is the number of the k-th shelf (pattern) cut out from the i-th piece of timber (paper roll). The constraint is expressed by the following set of inequalities.

$\text{SIGMA}(i=1 \text{ through } n) d_k(x_i) \geq b_k$ ($k=1, 2, \ldots, m$)

The problem is reduced to minimize the following objective function:

$\text{SIGMA}(i=1 \text{ through } n) d_O(X_i)$ where $d_O(x_i)$ is a waste volume (or a waste area) from the i-th piece of timber (pattern).

Because respective variables $x_i$ have discrete values $c_{ij}$ ($i=1, 2, \ldots, n; j=1, 2, 3, \ldots$), i.e. because the ways of cutting are discrete, the above minimization is equivalent to a combination optimization problem.

Although the above presents a special case in which both the set of inequalities and the objective function are linear, they are not generally limited to linear. In a case of an LSI logic design, the delay along a path of a component, strictly speaking, depends on the method of realizing the component of the connectee. That is, the delay along path k of component C is calculated as

---

(basic delay of C)
+ (load capacitance dependency coefficient of C)
× [(wiring capacitance from C to the connectee)
+ SIGMA {(wiring capacitance in a component)
+ (sum of input capacitance)}]

--- where SIGMA represents the sum of the values of the components connected after C along path k. Thus, at least some inequalities have product terms of different variables, which make them nonlinear.

Constrained combination satisfaction problems such as the above are recognized as being more difficult than problems in which variables have continuous values, because potential solution space increases according to the order of combinations. Thus, it cannot be solved by a simplistic propagation method.

However, there are cases in which some parts of virtual solution space can be identified. Effective use of such a structure could enable solutions to be obtained efficiently.

Conventional techniques are known, such as (a) Integer Programming Method, (b) Branch and Bound Method, (c) Linear Programming Method and (d) ATMS Method. In these methods a computer solves constrained condition satisfaction problems or combination optimization problems.

(a) Integer Programming Method

For calculating variables with discrete values, variables having integer values, in particular zero (0) or one (1), are introduced. However, this causes the problem that the number of variables is increased. That is, per the earlier stated description, $c_{ij}$ ($i=1, 2, 3, \ldots, n; j=1, 2, 3, \ldots$) must all be substituted as variables for just n variables $x_1, x_2, \ldots, x_n$. Because the calculation time per the integer programming method increases exponentially with the number of variables, this increase in the number of variables causes a delay in calculation.

(b) Branch and Bound Method

When the values of variables are determined (selected), an objective function value is obtained by checking constraints by limiting the range of values. When neither a checking nor an objective function calculation can be performed (or when there is a possibility of a smaller objective function value than the hitherto obtained objective function value,) the range is further limited. When there is no possibility of a smaller objective function value than the one already obtained, the range is abandoned. However, because this method does not further utilize in subsequent stages the information about the process of checking the satisfaction of constraints in the range and of obtaining an objective function value, there is a potential problem that inappropriate variable values may be repeatedly selected.

(c) Linear Programming Method

An optimum value is obtained based on the assumption of continuous variable values, and the discrete value closest to the optimum value is obtained as the solution. However, such an approximation guarantees neither that the obtained solution meets the constraints nor that the solution is optimal. This is a major disadvantage of this method.

(d) ATMS (Assumption-based Truth Maintenance System) Method

The combinations of variable values not satisfying the constraints are stored and combinations including any of these combinations are discarded. However, because the numbers of variable values combinations are enormous, the sizes of problems handled by this method are limited. The following article presents a reference for the ATMS method. J. de Kleer: An Assumption-based Truth Maintenance System, Artificial Intelligence 28 (1986).

As described above, conventional arts have their particular problems.

SUMMARY OF THE INVENTION

This invention is conceived based on the above background. It aims at providing a means for efficiently solving constrained combination satisfaction problems and optimization problems for discrete variables, by using to the maximum, failure information obtained up to the current point in processing in subsequent processes.

This invention is premised on a computer-based combination problem processor for solving constrained combination satisfaction problems for determining discrete values of respective variables such that the constraints imposed by a set of inequalities and equalities, and for solving combination optimization problems for determining the discrete values of respective variables by minimizing or maximizing the value of a given objective function.

The computer includes an initial constraint violating inequality creator for creating a constraint violating inequalities reciprocal to a set of inequalities (including inequalities and equalities) which are externally specified constraints.

The computer also includes a variable value changer for changing the current, to a new variable value of the variable whose satisfaction of constraints is examined, and a variable selector for selecting a value of a variable whose value is unknown.

The computer further includes a constraint violating condition creator for creating a new constraint violating condition obtained as a logical product of simplified inequalities by digitizing either the constraint violating inequalities or the variable appearing in the constraint violating conditions created from the constraint violating inequalities, when none of the values satisfy the constraints on the processes by the variable value changer or the variable value selector (i.e. when at least one (1) constraint violating condition is satisfied).

Assume here $x_1=7$ and $x_2=5$, for an exemplary constraint violating condition: $x_1+x_2+4>14$. Because these values satisfy this constraint violating condition, all subsequent evaluation are prohibited or omitted. If $x_2$5, then $x_1+9>14$. If $x_1=7$, then $x_2+11>14$. The constraint violating condition, which is logically equivalent to $x_1+9>14$, is obtained as a logical product of these two (2) conditions. "Digitizing a variable" means that substituting 7 into $x_1$ or 5 into $x_2$ and consolidating constant terms. "Obtaining as a logical product of simplified inequalities" means making the constraint violating condition $x_1+9>14$.

A constraint violating condition storer for storing constraint violating conditions created by the constraint violating condition creator is provided either internally or externally.

With the first form of this invention configured as above, a variable value is changed or selected such that none of the constraint violating conditions stored in the constraint violating condition storer is satisfied. In other words, variable values are changed and selected such that the constraint violating condition is not satisfied, and evaluations of the combinations of variables satisfying a constraint violating condition are discarded. As a result, only the combination not satisfying the constraint violating condition is left.

The set theory translates this into a combination problem solving apparatus for obtaining the optimal combination from all the combinations of n variables $X_1, \ldots, X_n$ in a universal set U. The combination problem solving apparatus comprises a reciprocating means for obtaining the constraint violating condition reciprocal to a constraint condition giving a constraint on said variable, a detecting means for detecting a satisfaction by a subset of said universal set U of said constraint violating condition irrespective of a combination of variables included in a subset U-A complementary to a subset A, a deleting means for deleting a combination of variables included in said subset U-A complementary to said subset A, when said detecting means detects a satisfaction by said subset of said universal set U of said constraint violating condition irrespective of a combination of variables included in said subset U-A complementary to said subset A, and a creating means for creating a new constraint violating condition relevant only to variables included in said subset A.

The constraint violating inequalities created by the constraint violating inequality creator are stored in the constraint violating condition storer.

Upon storing a constraint violating condition, the constraint violating condition storer stores a new condition to be stored by deleting an outstanding condition, when the new condition is logically weaker (less constraining), i.e. when a new condition to be stored satisfies an already stored outstanding condition. This eliminates a search for the constraint violating condition having the same logic.

This invention can also be configured as a computer including an initial constraint meeting inequality creator for creating inequalities indicating a satisfaction of constraints from an externally specified set of inequalities (inequalities and equalities), a variable value changer for changing the current, to another variable value of the variable whose satisfaction of the constraints is examined, and a variable value selector for selecting the value of a variable having an undetermined value.

The computer further includes a constraint meeting condition creator for creating a constraint meeting condition obtained as a result of the logical sum of inequalities simplified by digitizing a variable appearing in a constraint meeting condition, when none of the values satisfy the constraints in the processes of the variable value changer and the variable value selector (i.e. when at least one (1) constraint meeting condition is not satisfied).

Finally, a constraint meeting condition storer for storing constraint meeting conditions created by the constraint meeting condition creator is provided either internally or externally.

With the second form of this invention configured as above, a variable value is changed or selected such that all of the constraint meeting conditions stored in the constraint meeting condition storer are satisfied. The constraint meeting inequalities created by the constraint meeting inequality creator are stored in the constraint meeting condition storer.

Upon storing a constraint meeting condition, the constraint meeting condition storer stores a new condition to be stored by deleting an outstanding condition, when the new condition is logically more constrained. This eliminates a search for the constraint meeting condition having the same logic.

In the first or second form of this invention, when the externally designated set of inequalities comprises constraint equalities, the initial constraint violating inequality creator or the initial constraint meeting inequality creator changes the constraint equalities to pairs of equivalent inequalities, thereby creating constraint violating inequalities or constraint meeting inequalities.

When a combination optimization problem for minimizing (or maximizing) the value of a given objective function is solved by meeting the constraint with the first or second form of this invention, the initial constraint violating inequality creator or the initial constraint meeting inequality creator creates a variable inequality corresponding to the objective function, in addition to a constraint violating inequality or a constraint meeting inequality. Then, a constrained combination satisfaction problem for a constraint per an inequality added with a variable inequality is solved. A constrained value of the variable inequality corresponding to the above objective function is updated to a value obtained by subtracting a small enough predetermined value from (or by adding a large enough predetermined value to) an obtained objective function value. By repeating the processes for a constrained combination satisfaction problem, the solution for a combination optimization problem is obtained.

Further, in the first or second form of this invention, when not all the variable values are known and new variable values could be added, either the constraint violating condition creator stores in the constraint violating condition storer an attached flag indicating that the created constraint violating conditions have no other variable values, or the constraint meeting condition creator stores in the constraint meeting condition storer an attached flag indicating that the constraint meeting conditions created by the constraint meeting condition creator have additional variable values. When the new variable values are actually used, either the constraint violating condition having the flag or the constraint meeting conditions having the flag is invalidated. This enables new variable values to be handled properly.

When a combination of variable values set by the variable value changer or the variable value selector does not satisfy constraints (i.e. when one of the constraint violating conditions is satisfied, or when one of the constraint meeting conditions is not satisfied) the constraint violating condition creator creates a new constraint violating condition or the constraint meeting condition creator creates a new constraint meeting condition by using a partial derivative coefficient on the left hand side of inequalities. This enables, the problem of an inequality having a monotonically increasing or decreasing function value to be solved efficiently by creating a new constraint violating condition or a new constraint meeting condition.

Finally, the first form of this invention can improve the processing speed by reducing the time required to examine the constraint violating conditions, which takes up the bulk of the processing time necessary to solve a constrained combination satisfaction problem or a constrained combination optimization problem. Four (4) parallel methods are distinguished by the examinations assigned to respective processors: the variable values changed by the variable value changer and selected by the variable value selector; the constraint violating conditions; the variable values changed by the variable value changer and selected by the variable value selector, as well as the constraint violating conditions; and the partial logical expressions split from the constraint violating conditions.

Alternatively, the second form of this invention can improve the processing speed by reducing the time required to examine the constraint meeting conditions, which takes up the bulk of the processing time necessary to solve a constrained combination satisfaction problem or a constrained combination optimization problem. Four (4) parallel methods are distinguished by the examinations assigned to respective processors: the variable values changed by the variable value changer and selected by the variable value selector; the constraint meeting conditions; the variable values changed by the variable value changer and selected by the variable value selector, as well as the constraint meeting conditions; and the partial logical expressions split from the constraint meeting conditions.

The first form of this invention produces, from a created constraint violating condition, a condition prohibiting not only the current combination of included variable values but also all the subsequent combinations satisfying the constraint violating conditions. The second form of this invention produces, from a created constraint meeting condition, a condition prohibiting not only the current combination of included variable values but also all the subsequent combinations not satisfying the constraint meeting conditions.

For instance, when a constraint violating condition (a constraint meeting condition) comprises a linear inequality whose coefficients are all one (1), the first form (the second form) of this invention prohibits all combinations whose sums are no less than the sum of current variable values [and no less than the difference between a constraining value and the sum of the already digitized part(, which does not exceed the sum of current variable values)]. This saves an unnecessary search and reduces the time required for solving a constrained combination satisfaction problem or a constrained combination optimization problem.

When a constraining value is used in meeting a constraint, a time comparison indicates that meeting the constraint initially by starting from a larger constraining value and updating it can take about three-tenths (3/10) less time than meeting the constraint immediately by the constraining value.

The method using a flag eliminates a conventional limit, "All variable values must be known initially." This makes it easy to solve a problem such as a LSI logic design costing a lot in computation to determine the variable values.

Further, when the partial derivative is used for solving the problem of an inequality having a monotonically increasing or decreasing function value as described above, a new constraint violating condition or a new constraint meeting condition is created for efficiently solving the problem.

Paralleling the elements of this invention by plural processors enables the time necessary for solving a constrained combination satisfaction problem or a constrained combination optimization problem to be greatly reduced.

BRIEF DESCRIPTION OF THE DRAWINGS

Those in the same field can easily understand additional features and objectives of this invention from the attached drawings together with the description of the preferred embodiment of this invention. In the drawings:

FIG. 2 illustrates an operation of this invention;

FIG. 3 shows the system configuration of a preferred embodiment of this invention (corresponding to the first form shown in FIG. 1A);

FIGS. 11A through 11D illustrate an application of this invention to a cutting stock problem;

FIG. 19 is a flowchart for examining a constraint violating condition for the parallel processing system shown in FIG. 16B.

DESCRIPTION OF THE PREFERRED EMBODIMENTS

Description of the Principles

Figure 1A:
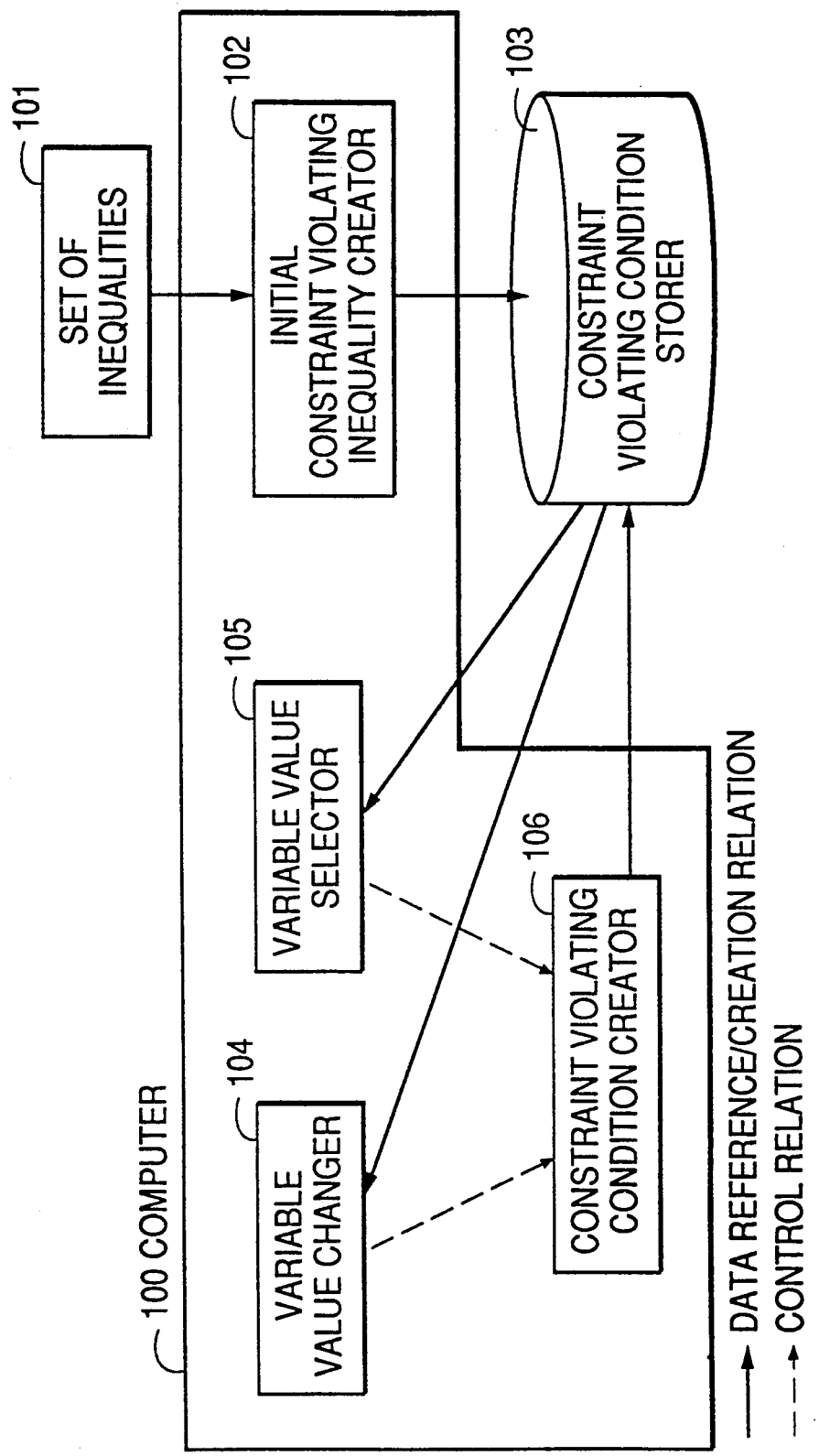
FIG. 1A is a block diagram of the first form of this invention.
Figure 1B:
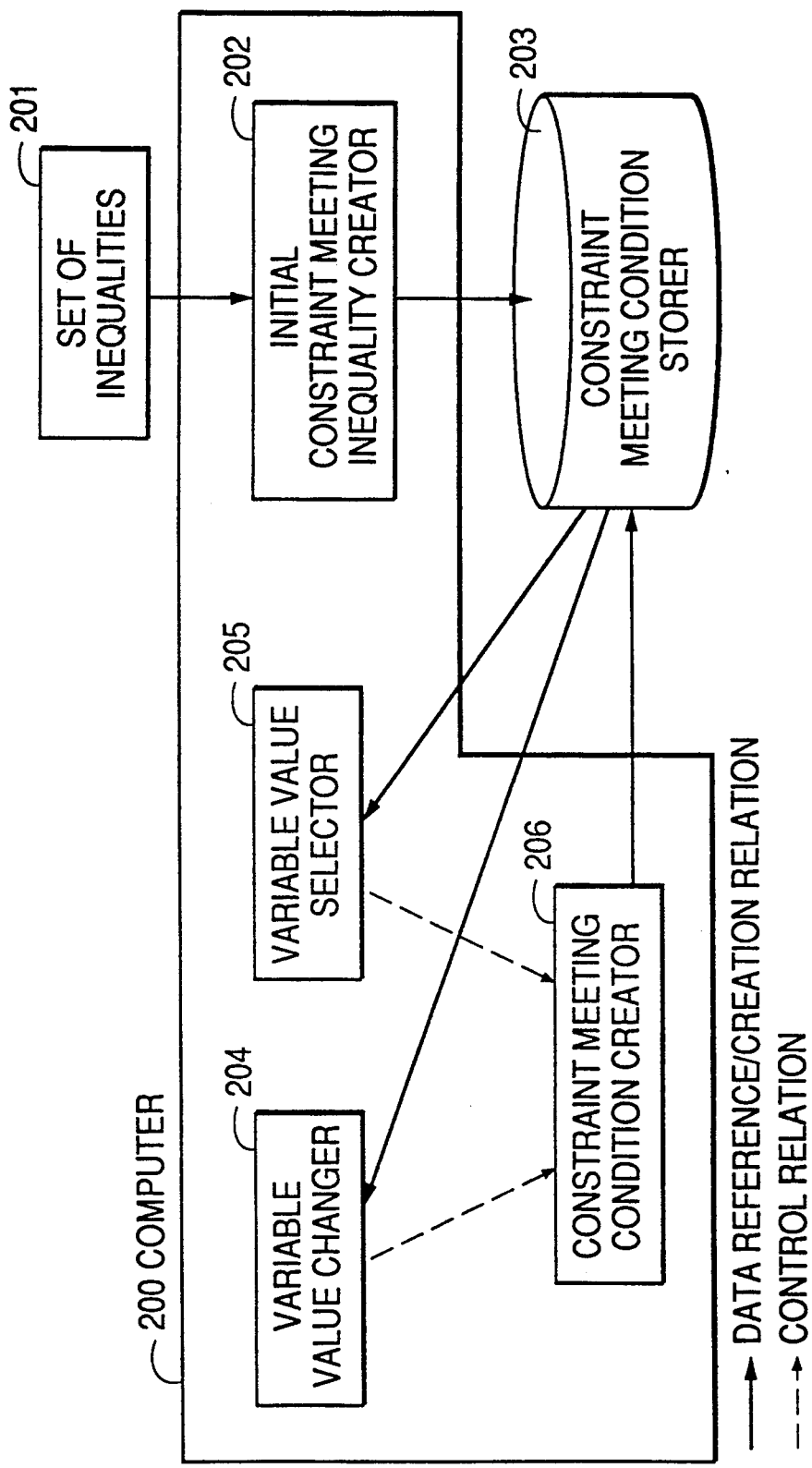
FIG. 1B is a block diagram of the second form of this invention.

FIG. 1A is a block diagram of the first form of this invention, and FIG. 1B is a block diagram of the second form of this invention.

This invention is premised on a combination problem solving apparatus, built on a computer comprising a CPU and a memory, for solving a constrained combination satisfaction problem or a constrained combination optimization problem about an externally given set of inequalities (including inequalities and equalities) expressing constraints.

More specifically, FIG. 1A shows a solution obtained by creating a constraint violating condition.

In FIG. 1A, an initial constraint violating inequality creator 102 provided in a computer 100 creates the constraint violating inequalities reciprocal to an externally given set of inequalities 101. Examples of constraint violating inequalities are a "left hand side">"right hand side" inequality reciprocal to a "left hand side"≦"right hand side" inequality and a "left hand side"<"right hand side" inequality reciprocal to a "left hand side"≧"right hand side" inequality.

A constraint violating condition storer 103 provided in a secondary storage device connected to the computer 100 stores a constraint violating inequality created by the initial constraint violating creator 102 and a constraint violating condition created during a constraint satisfaction process. Although FIG. 1A shows the constraint violating condition storer 103 provided in a secondary storage device or memory external to the computer 100, it is possible to provide the constraint violating condition storer 103 in a memory within the computer 100.

A variable value changer 104 provided also in the computer 100 changes the current variable value to some other variable value. This change is performed such that none of the constraint violating conditions stored in the constraint violating condition storer 103 are satisfied. A constraint violating condition including a variable having an unknown value is not deemed to be satisfied.

A variable value selector 105 also provided in the computer 100 selects a value for a variable having an unknown value, such that none of the constraint violating conditions stored in the constraint violating condition storer 103 are satisfied. A constraint violating condition including a variable having an unknown value is no deemed to be satisfied.

A constraint violating condition creator 106 also provided in the computer 100 creates a new constraint violating condition when neither the variable value changer 104 can change a variable value nor the variable value selector 105 can select a variable value. The constraint violating condition storer 103 stores a newly created constraint violating condition.

As a result, the constraint violating condition storer 103 stores only the initial constraint violating inequality set by the initial constraint violating inequality creator 102 immediately after starting the process and then sequentially the constraint violating conditions created by the constraint violating condition creator 106.

More specifically, FIG. 1B shows a solution by creating a constraint meeting condition.

In FIG. 1B, an initial constraint meeting inequality creator 202 provided in a computer 200 creates constraint meeting inequalities from an externally given set of inequalities 201.

A constraint meeting condition storer 203 provided in a secondary storage device connected to the computer 200 stores a constraint meeting inequality created by the initial constraint meeting creator 202. Although FIG. 1B shows the constraint meeting condition storer 203 provided in a secondary storage device externally to the computer 200, it is possible to provide the constraint meeting condition storer 203 in a memory within the computer 200.

A variable value changer 204 provided also in the computer 200 changes the current variable value to some other variable value. This change is performed such that none of the constraint meeting conditions stored in the constraint meeting condition storer 203 are satisfied. A constraint meeting condition including a variable having an unknown value is not deemed to be satisfied.

A variable value selector 205 also provided in the computer 200 selects a value for a variable having an unknown value, such that none of the constraint meeting conditions stored in the constraint meeting condition storer 203 are satisfied. A constraint meeting condition including a variable having an unknown value is not deemed to be satisfied.

A constraint meeting condition creator 206 also provided in the computer 200 creates a new constraint meeting condition when neither can the variable value changer 204 change a variable value nor can the variable value selector 205 select a variable value. The constraint meeting condition storer 203 stores a newly created constraint meeting condition.

As a result, the constraint meeting condition storer 203 stores only the initial constraint meeting inequality set by the initial constraint meeting inequality creator 202 immediately after starting the process and then sequentially the constraint meeting conditions created by the constraint meeting condition creator 206.

Operations of the above forms are explained below.

The operations of the solution by creating a constraint violating condition shown in FIG. 1A are described first.

A user inputs to the computer 100 the set of inequalities 101 for a combination problem he wishes to solve. On receiving the set of inequalities 101, the computer 100 invokes the initial constraint violating condition creator 102, and creates initial constraint violating inequalities reciprocal to the set of inequalities 101. Then, the constraint violating condition storer 103 stores the initial constraint violating inequalities. When the set of inequalities 101 include not only a pure inequality setting forth a relation for one value being greater or less than the other but also an equality, the set of inequalities 101 including the equality given as a constraint are satisfied through a conversion of the equality into a pair of equivalent inequalities.

After the constraint violating condition storer 103 stores the initial constraint violating inequalities, the variable value changer 104 and the variable value selector 105 are invoked. The variable value changer 104 changes a variable value which results in changes in the constraint violating conditions stored in the constraint violating condition storer 103 such that none of the constraint violating conditions stored in the constraint violating condition storer 103 are satisfied. When a variable has an unknown variable value, the variable value selector 105 selects the variable value such that none of the constraint violating conditions stored in the constraint violating condition storer 103 are satisfied.

When both the variable value changer 104 fails to change a variable value and the variable value selector 105 fails to select a variable value, i.e. when at least one (1) constraint violating condition for each variable value is satisfied, the constraint violating condition creator 106 is invoked. The constraint violating condition creator 106 selects on a one-to-one basis satisfying constraint violating conditions for corresponding variable values, substitutes the variable values into the variables (whose variable values fail to be changed or selected) in the corresponding constraint violating conditions for simplification, and makes the logical product of all the constraint violating conditions. The constraint violating condition storer 103 stores the logical product as a new constraint violating condition, which no longer includes the variables (whose values fail to be changed or selected).

Because the new constraint violating condition is currently satisfied, it naturally acts as a condition for prohibiting a combination of current variable values corresponding to the variables included in it. At the same time, not only the current combinations but also all subsequent combinations satisfying the new constraint violating condition are prohibited.

After the constraint violating condition creator 106 creates the new constraint violating condition, the variable value changer 104 is reinvoked and changes the variable values of the new constraint violating condition such that the new constraint violating condition is not satisfied. When the variable value changer 104 fails to change any one of the variable values, the constraint violating condition creator 106 recreates a new constraint violating condition, which the constraint violating condition storer 103 stores. When the variable value changer 104 succeeds in changing all the variable values, it further checks the presence of a variable having an unknown value. If the presence of such a variable is detected, the variable value selector 105 selects a value for it. If the presence of a variable is not detected, the solution is obtained.

The operations of the solution by creating a constraint meeting condition shown in FIG. 1B are described second.

A user inputs to the computer 200 the set of inequalities 201 for a combination problem he wishes to solve. On receiving the set of inequalities 201, the computer 200 invokes the initial constraint meeting condition creator 202, and the constraint meeting condition storer 203 ordinarily stores the set of inequalities 201 "as is" as the initial constraint meeting inequalities. When the set of inequalities 201 include not only a pure inequality setting forth a relation of one value being greater or less than the other but also an equality, the set of inequalities 201 including the equality given as a constraint are satisfied through a conversion of the equality into a pair of two (2) equivalent inequalities.

After the constraint meeting condition storer 203 stores the initial constraint meeting inequalities, the variable value changer 204 and the variable value selector 205 are invoked. The variable value changer 204 changes the constraint meeting conditions stored in the constraint meeting condition storer 203 such that all the constraint meeting conditions stored in the constraint meeting condition storer 203 are satisfied. When a variable has an unknown value, the variable value selector 205 selects a value such that all the constraint meeting conditions stored in the constraint meeting condition storer 203 are satisfied.

When both the variable value changer 204 fails to change a variable value and the variable value selector 205 fails to select a variable value, i.e. when at least one (1) constraint meeting condition for each variable value is not satisfied, the constraint meeting condition creator 206 is invoked. The constraint meeting condition creator 206 selects on a one-to-one basis non-satisfying constraint meeting conditions for corresponding variable values, substitutes the variable values into the variables (whose values fail to be changed or selected) in the corresponding constraint meeting conditions for simplification, and makes the logical sum of all the constraint meeting conditions. The constraint meeting condition storer 203 stores the logical sum as a new constraint meeting condition, which no longer includes the variables (whose values fail to be changed or selected).

Because the new constraint meeting condition is not currently satisfied, it naturally acts as a condition for prohibiting a combination of current variable values corresponding to the variables included in it. At the same time, not only the current combinations but also all the subsequent combinations satisfying the new constraint meeting condition are prohibited.

After the constraint meeting condition creator 206 creates the new constraint meeting condition, the variable value changer 204 is reinvoked and changes the variable values of the new constraint meeting condition such that the new constraint meeting condition is satisfied. When the variable value changer 204 fails to change any one of the variable values, the constraint meeting condition creator 206 recreates a new constraint meeting condition, which is then stored by the constraint meeting condition storer 203. When the variable value changer 204 succeeds in changing all the variable values, it further checks the presence of a variable having an unknown value. If the presence of a variable is detected, the variable value selector 205 selects a value for it. If the presence of such a variable is not detected, the solution is obtained.

FIG. 2 illustrates an operation of this invention.

A solid line indicates an already tried path, and a dashed line indicates an untried path. When a constraint is detected to be met at a point indicated by an "X", a constraint meeting condition $f_k(x_1, x_2, a_3, \ldots, a_n) > b_k$ (where $a_3, \ldots, a_n$ are constants) is created. All the combinations satisfying this constraint meeting condition are prohibited as shown by the "delta" sign in FIG. 2, thereby eliminating an unnecessary process.

When a constrained combination optimization problem is a problem of determining discrete values of respective values, such that constraints given by a set of inequalities are met and the value of a given objective function is minimized, it is solved with the configurations shown in FIGS. 1A, 1B and 2 as follows.

Inequalities (hereafter referred to as variable inequalities) are provided in correspondence with an objective function, and a constrained combination satisfaction problem for a given set of inequalities to which variable inequalities are attached are solved per the principles whose configurations are illustrated in the corresponding one of FIGS. 1A, 1B and 2. The constraining values of the variable inequalities are updated to "(obtained value of objective function)—epsilon" [where epsilon is a small enough positive number], and the method for solving a constrained combination satisfaction problem is repeated to obtain an optimal value. A creation of a constraint violating condition or a constraint meeting condition not including a variable causes the process to terminate. The solution obtained immediately before it is the optimal solution. Constraints are satisfied by referring to the constraint violating condition or the preceding constraint meeting condition created before the constraining value becoming the current value. Consequently, information obtained by a failure in satisfying a constraint before updating a constraining value eliminates an unnecessary search.

When a constrained combination optimization problem is a problem of determining discrete values of respective values such that constraints given by a set of inequalities are met and the value of a given objective function is maximized, the constraining values of the variable inequalities are updated to "(obtained value of objective function)+epsilon" [where epsilon is a small enough positive number], and the method for solving a constrained combination satisfaction problem is repeated to obtain an optimal value.

When not all the variable values are known and new variable values are added, a flag indicating that there is no more corresponding variable value is attached to a constraint violating condition created by the constraint violating condition creator 106 or a constraint meeting condition created by the constraint meeting condition creator 206 for enabling the constraint violating condition or the constraint meeting condition having the flag to be invalidated. This allows new variable values to be handled properly.

The first form of this invention, shown in FIG. 1A, causes a flag indicating that there is no more corresponding variable value (which is true when the flag is attached) is attached to the logical product of constraint violating conditions, such that the constraint violating condition having the flag is invalidated by turning the flag from true to false on actually using a new variable value of the corresponding variable. In addition, all the subsequent constraint violating conditions created from the current constraint violating condition are invalidated, whereas all the other constraint violating conditions continue to be referenced.

The second form of this invention shown in FIG. 1B causes a flag indicating that there is no more corresponding variable value (which is false when the flag is attached) is attached to the logical sum of constraint meeting conditions, such that the constraint meeting condition having the flag is invalidated by turning the flag from false to true on actually using a new variable value of the corresponding variable. In addition, all the subsequent constraint meeting conditions created from the current constraint meeting condition are invalidated, whereas all the other constraint meeting conditions continue to be referenced.

These processes cause only the information obtained from a hypothesis that there is no more value of the corresponding variable to be canceled, thereby enabling a new variable value to be handled properly concurrently with utilization of the failed conditions satisfying preceding constraints.

When there is a problem in which the function in an inequality has a monotonically increasing or decreasing tendency, the first form of this invention shown in FIG.

1A and the second form of this invention shown in FIG. 1B enables the problem to be solved efficiently as follows. When the combination of variable values set by the variable value changer 104 and the variable value selector 105 does not meet any of the constraints (i.e. when at least one of the constraint violating inequalities is satisfied,) the constraint violating condition creator 106 creates a new constraint violating condition from the partial derivative coefficients on the left hand side of the constraint violating condition inequality. When the combination of variable values set by the variable value changer 204 and the variable value selector 205 does not meet any of the constraints (i.e. when at least one of the constraint violating inequalities is not satisfied,) the constraint meeting condition creator 206 creates a new constraint meeting condition from the partial derivative coefficients on the left hand side of the constraint meeting condition inequality.

That is, the first form of this invention causes the left hand side of the constraint violating inequality of the set of inequalities 101 created by the initial constraint violating inequality creator 103 to be partially differentiated by respective variables, in order to analyze whether or not the value on the left hand side of the constraint violating inequality is monotonously increased or decreased by any of the variables. When the value in fact increases or decreases monotonously, the partial derivative coefficient identified by the above analysis is stored. When both the variable value changer 104 fails to change a variable value and the variable value selector 105 fails to select a variable value, the constraint violating condition creator 106 is invoked and creates a new constraint violating condition by using the stored partial derivative coefficient. The constraint violating condition storer 103 stores the new constraint violating condition. A new constraint violating condition added by using a partial derivative coefficient enables a problem to be solved efficiently.

On the other hand, the second form of this invention causes the left hand side of the constraint violating inequality of the set of inequalities 201 created by the initial constraint meeting inequality creator 203 to be partially differentiated by respective variables, in order to analyze whether or not the value on the left hand side of the constraint meeting inequality is monotonously increased or decreased by any of the variables. When the value in fact increases or decreases monotonously, the partial derivative coefficient identified by the above analysis is stored. When either the variable value changer 104 fails to change a variable value or the variable value selector 105 fails to select a variable value the constraint violating condition creator 206 is invoked and creates a new constraint meeting condition by using the stored partial derivative coefficient. The constraint violating condition storer 203 stores the new constraint violating condition. A new constraint meeting condition added by using a partial derivative coefficient enables a problem to be solved efficiently.

Finally, both the first and second forms of this invention can improve processing speed by parallelly using a plurality of processors in executing respective operations. That is, the first form of this invention causes respective processors to process partial logics splitting from a constraint violating condition obtained as a logical product of plural conditions. Similarly, the second form of this invention causes respective processors to process partial logics splitting from a constraint meeting condition obtained as a logical sum of plural conditions.

Explanation of an Actual Embodiment

An Actual Embodiment of this embodiment is explained below by referring to attached drawings.

FIG. 3 shows the system configuration of a preferred embodiment of this invention (corresponding to the first form shown in FIG. 1A).

The system of this embodiment solves constrained combination related problems by creating a constraint violating condition.

A computer 300 comprises a CPU 301, an I/O interface 302 and a main memory 303. The CPU 301 executes processes per the software stored in the main memory 303. The I/O interface 302 performs data exchanges for the computer 300 with an input/output device 304 and an external memory 305, per commands from the CPU 301.

The system of this invention is realized mainly by software stored in the main memory 303. A controller 310 oversees the solution of a constrained combination problem. A constraint satisfier 320 executes the solution of a constrained combination satisfying problem per a request from the controller 310. A variable value changer 330 changes a variable value per a request from the constraint satisfier 320. A variable value selector 340 selects a variable value per a request from the constraint satisfier 320.

The external memory 305 has a constraint violating condition storer 350 for storing a created constraint violating condition. The constraint violating condition storer 350 can alternatively be provided in the main memory 303 of the computer 300, when a fast processing is critical.

After the system is booted up, the controller 310 requests a user to input a set of inequalities expressing a constrained combination related problem. The user inputs a set of inequalities from the input/output device 304. Then, the controller 310 invokes the constraint satisfier 320 for executing a constraint satisfaction process. After the constraint satisfaction process is over, the controller 310 outputs a solution through the I/O interface 302 to the input/output device 304.

An example of a data structure is explained, assuming that constraining inequalities form linear inequalities whose coefficients are all one (1).

| Numbering | |
| --- | --- |
| variable numbers: | $0, 1, \ldots,$ n-agent-1 |
| variable value numbers (variable "i"): | $1, 2, \ldots,$ alt[i] |
| attribute value numbers: | $1, 2, 3, \ldots,$ |

Here, "n-agent" represents the number of variables. "alt[i]" will be explained later.

Constraint Violating Inequality Table (int dnj [DNJ] [AGENT])

"DNJ" represents an upper limit of the number of initial constraint violating inequalities and "AGENT" represents an upper limit of the number of variables. Because a constraint violating condition is called a "No-good Justification" and expressed as an "NJ", the initial constraint violating inequalities are called a default NJ or "dnj" for short.

"dnj [i] [j]" expresses the attribute value number of a variable "j" referenced by an initial constraint violating inequality "i". In an example of logic designing, attribute value number 1 corresponds to a gate number and attribute value numbers 2 and above correspond to delays along intra-component paths. Attribute value number 0 corresponds to "not applicable", i.e. inequalities do not have the corresponding variables.

Constraining Value Table (int constraint [DNJ])

"constraint(i)" (where $0 \leq i \leq$ n-path) is a constraining value corresponding to the initial constraint violating inequality "i". "n-path" represents the total number of the inequalities minus one (1). In the example of logic designing, "n-path" represents the number of paths to which delay constraints accrue.

Data Table (float des [AGENT] [ALT] [ATR])

"ALT" represents an upper limit of the variable value number. "ATR" represents an upper limit of the attribute value number. "des [i] [j] [k]" represents the value of attribute value number "k+1" of the "j+1"-th variable value of variable "i".

Variable Value Table (int alt [AGENT])

"alt [i]" (where $0 \leq i \leq$ n-agent-1) represents the total number of the variable values of variable "i".

In Table (int in [AGENT])

"in [i]" represents the variable value "in" of variable "i". "in [i]" being zero (0) indicates that all variable values are "out". "in" represents the current variable value. When the variable value is unknown, all variable values are called "out".

Out Variable Stack (int out [AGENT])

This is a stack storing the variable number whose entry in the "In Table" is zero (0), i.e. all variable values are "out".

Conjunct

"conjunct" is a term forming the logical product of constraint violating conditions. "conjunct" has the following structure.

```
struct cng
{
int dnj;
int table [AGENT];
float value;
struct cnj *next;
};
```

The member "dnj" indicates the number of initial constraint violating inequalities. The member "table" indicates the information on the variables. "table [i]" being zero (0) indicates that nothing corresponds to variable "i" from the inception, i.e. that the initial constraint violating inequalities do not include variable "i", or that variable "i" is already digitized as a fixed value and is no longer a variable. The member "value" stores the sum of the already digitized parts. The member "next" stores a pointer to the next "conjunct" if any. The member "next" is "NULL", if the next "conjunct" is none.

Constraint Violating Condition Table (struct cnj *nj [NJ])

NJ represents an upper limit of the number of constraint violating conditions, excepting initial constraint violating inequalities.

Figure 4:
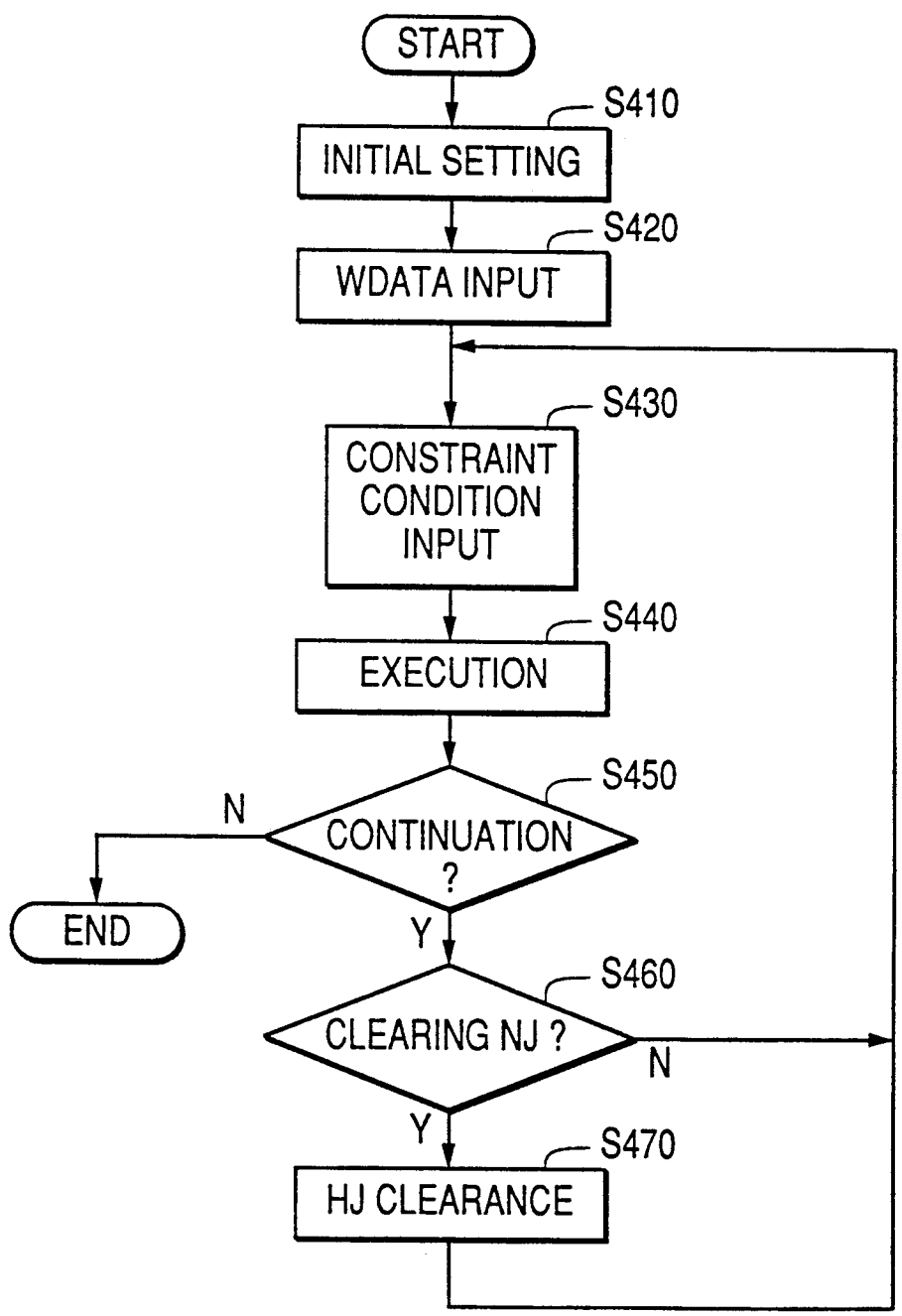
FIG. 4 is a process flowchart of a constraint meeting system.

FIG. 4 is a process flowchart of a constraint meeting system.

The processes shown in FIG. 4 correspond to the software in the controller 310 illustrated in FIG. 3, which shows the system configuration of a preferred embodiment of this invention.

S410: After the process starts, the controller 310 asks a user to set initial values for solving a constrained combination satisfying problem by the input/output device 304. That is, the controller 310 has the user set the number of variables (n-agent) and the number (n-path) representing the total number of the inequalities minus one (1), thereby completing the constraint violating inequality table (dnj ). The process then continues to S420.

S420: A data input enables the controller 310 to complete the variable value table (alt) and a data table (des). That is, the controller 310 sets the sum total number of the variable values and the data about respective attribute values of respective variable values of respective variables. The controller 310 sets all entries of the "In Table" to one (1). The process continues to S430.

S430: The controller 310 interactively requests the user to input constraint conditions comprising constraining values for respective inequalities. The controller 310 writes constraining values into the "Constraining Value Table" (constraint). The process continues to S440.

S440: Upon completion of the initial processes, represented by S410, S420 and S430, for solving a constrained combination satisfying problem, the controller 310 executes the constraint satisfaction process. This will be elaborated later. (Refer to FIG. 5.) If the controller 310 succeeds in satisfying the constraint, it outputs the results (entries of "In Table") and the attribute values (the gate numbers and the entire path delay in the example of logic designing) corresponding to respective inequalities. If the controller 310 fails in satisfying the constraint, it digitizes the final constraint violating condition, i.e. the left hand sides of all the terms (conjunct) forming the logical product of constraint violating conditions. The process then continues to S450.

S450: In response to the result of S440, the controller 310 asks the user to judge the continuation of the processes. If he judges negatively (N), the process terminates. If he judges affirmatively (Y), the process continues to S460.

S460: The controller 310 asks the user whether or not it is necessary to clear constraint violating conditions "NJ". If he judges negatively (N), the process reverts to S430 in a loop form. If he judges affirmatively (Y), the process continues to S470.

S470: The controller 310 clears all constraint violating conditions accumulated in the execution of the constraint satisfying process in S440. The process then reverts to S430 in a loop form.

Figure 5:
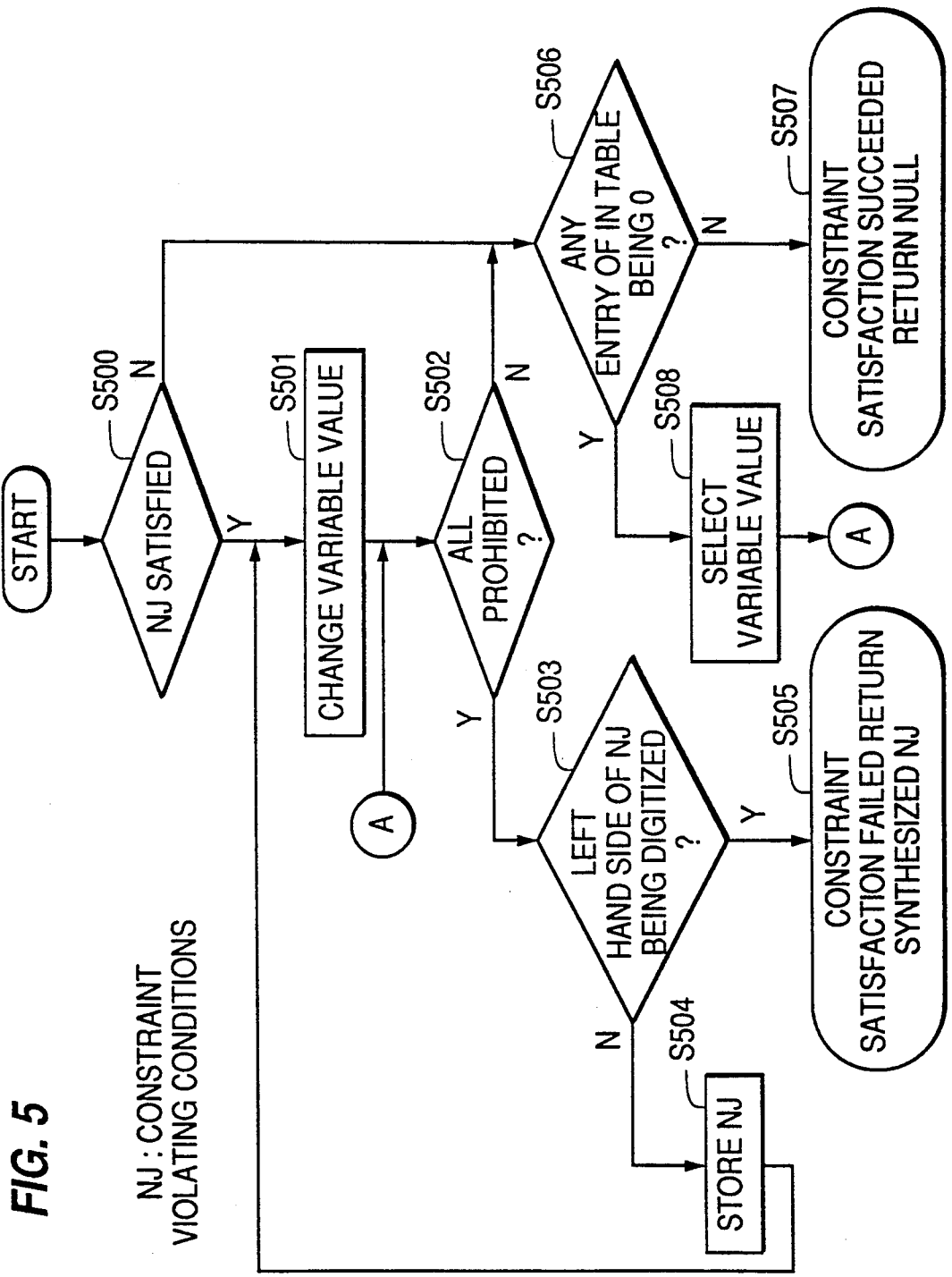
FIG. 5 illustrates a constraint meeting process.

FIG. 5 illustrates a constraint meeting process. It breaks down S440, shown in FIG. 4. This is performed by the controller 310 shown in FIG. 3.

S500: After the process starts, the controller 310 judges whether or not any of the constraint violating conditions are satisfied. If the controller 310 judges affirmatively (Y), the process continues to S501. If the controller 310 judges negatively (N), the process skips to S506.

S501: The controller 310 has the variable value changer 330 change a variable value Then, the controller 310 has the variable value selector 340 select the one having the least positive variable number from among the terms "conjunct" forming logical products of constraint violating conditions of the currently referenced constraint violating condition. The controller 310 further has the variable value selector 340 select the greatest current attribute value "i", from among the present variables. This is when the corresponding field value is not zero (0). The controller 310 has the variable value changer 330 change the entry of "in [i]" to some other variable value. The controller 310 does not have the variable value selector 340 select the one that is banned by the constraint violating conditions. Hence, the controller 310 does not select a variable whose attribute value is less than that of the one currently referenced. When the variable value changer 330 changes a variable value, the controller 310 parallelly synthesizes a new constraint violating condition. When the variable value changer 330 fails in changing a variable value, i.e. when all the variable values are banned, the controller 310 outputs the hitherto synthesized constraint violating conditions. Although the controller 310 has the variable value selector 340 select the variable value having the greatest current contribution in S500, the controller 310 can also have the variable value selector 340 select the variable value in a fixed sequence. The process then continues to S502.

S502: The controller 310 judges whether or not all the variable values are banned in the variable value change process by the variable value changer 330. If the controller 310 judges affirmatively (Y), the process continues to S503. If the controller 310 judges negatively (N), the process skips to S506.

S503: The controller 310 judges whether or not the left hand side of the constraint violating condition "NJ" synthesized by the variable value change process in S501 is digitized. If the controller 310 judges negatively (N), the process continues to S504. If the controller 310 judges affirmatively (Y), i.e. if the constraint satisfier 320 fails in satisfying the constraint, the process skips to S505.

S504: The controller 310 registers the synthesized constraint violating condition to the constraint violating condition table and copies it for a later processing. The process then reverts to S501 in a loop form.

S505: The controller 310 outputs the synthesized constraint violating condition "NJ". Because the constraint satisfier 320 fails in the constraint satisfaction, the process terminates.

S506: The controller 310 judges whether or not any of the entries of the "In Table" is zero (0), i.e. whether an unknown variable value exists [one being zero (0)] or not [all being one (1)]. If the controller 310 judges negatively (N), i.e. if the constraints are satisfied, the process proceeds to S507. If the controller 310 judges affirmatively (Y), i.e. if the constraints are not satisfied, the process skips to S508.

S507: Because all the constraints are satisfied, the controller 310 returns "NULL", and the process terminates.

S508: Because not all the constraints are satisfied, the controller 310 has the variable value selector 340 select a variable value. That is, the controller 310 has the variable value selector 340 select a variable whose entry in the "In Table" is zero (0), which is at the top of the "out variable stack". The controller 310 has the variable value selector 340 set one of its variable values to "in". However, the controller 310 does not have the variable value selector 340 set the variable values prohibited by the constraint violating conditions to "in". When the variable value selector 340 selects a variable value, the controller 310 parallelly synthesizes a new constraint violating condition, just as when the variable value changer 330 changes a variable value.

When the controller 310 synthesizes a new constraint violating condition, it selects the constraint violating conditions satisfied by respective variable values. The controller 310 simplifies the variables in the corresponding constraint violating conditions by substituting the attribute values of the variable values. For instance, the controller 310 substitutes the attribute value [e.g. two (2)] of value $c_{21}$ into $x_2$ in a constraint violating condition "NJ"

$$x_1 + x_2 10 > 13$$

the controller 310 rewrites the constraint violating condition "NJ" as $$x_1 + 12 > 13$$

and the logical product of the simplified constraint violating conditions are further simplified in a similar manner. For example, $$x_1 + 12 > 13 \ \& \ x_1 + 11 > 13$$

after the controller 310 substitutes attribute value [e.g. one (1)] of value $c_{22}$ into $x_2$ of the constraint violating condition, $$x_1 + 11 > 13$$

is obtained from the simplification.

An algorithm for satisfying a set of constraints SIGMA (i=1 through n) $a_k d_k(x_i) \leq b_k$ (k=1, 2, ..., m) using NJs can be generalized as follows.

We can consider necessary conditions for constraint satisfaction, which include the given inequalities, and their logical sums, instead of NJs and logical products.

Algorithm

Step 0: Assign a value t each variable. Proceed to Step 1.

Step 1: Check to see if there is any satisfied NJ. If so, proceed to Step 2. Otherwise, go to Step 3.

Step 2: Select a variable among those to which values are assigned. Change its value from the current one to another. If there is a value that makes all NJs false, proceed to Step 3. Otherwise, generate a new NJ by a definition of an NJ, which is:

"If at least one NJ (say $D_j$) holds for each value $c_{ij}$ of a particular variable $x_i$, the logical product of $D_j$ (j=1, 2, 3, ...) is also an NJ, where $D_j$ is a substitute of $D_j$ with its every occurrence of $x_i$ replaced with $c_{ij}$. If no value is assigned to a variable appearing in an NJ, that is, the NJ refers to an indefinite variable, we regard the NJ as false." and go to Step 5 with the variable changed to indefinite.

Step 3: If there are any indefinite variables left, proceed to Step 4. Otherwise, all the constraints have been satisfied and solution found so exit.

Step 4: Select an indefinite variable and assign a value to it. If there is a value that makes all NJs false, return to Step 3. Otherwise, generate a new NJ having the definition described in Step 2 and proceed to Step 5 with the variable remaining indefinite.

Step 5: If there are no variables in the generated NJ, constraint satisfaction has failed and exit. Otherwise, return to Step 2. (End of Algorithm)

In Step 4, select the variable that was made indefinite last. There are two (2) methods for selecting the variable in Step 2. The fixed order method, which uses a predetermined order of variables, and the criterion-based selection method, which uses a criterion. One criterion-based method selects the variable having the largest attribute value with respect to the violated constraint.

Figure 6:
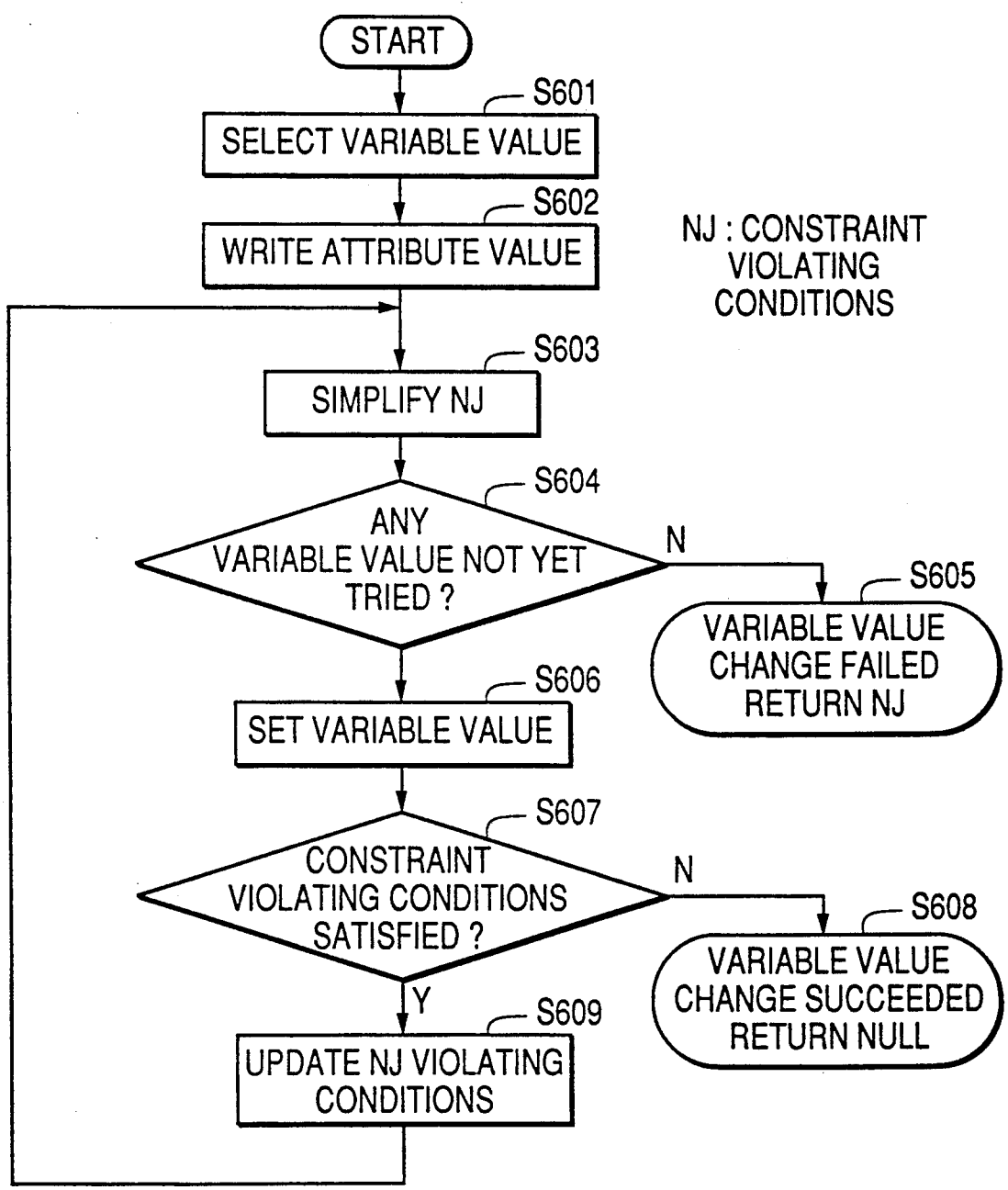
FIG. 6 illustrates a variable value changing process.

FIG. 6 illustrates a variable value change process.

More specifically, FIG. 6 illustrates in detail the procedure of the variable value change process in S501 (including S502) shown in FIG. 5, which is performed by the variable value changer 330 shown in FIG. 3 under control of the controller 310. S601: After the process starts, the controller 310 has the variable value changer 330 choose the variable having the greatest current contribution. Alternatively, the variables can be chosen in a fixed sequence in a predetermined manner. The process continues to S602.

S602: The controller 310 has the variable value changer 330 write the attribute value of the current variable value of the variable selected for the currently referenced constraint violating condition into the field corresponding to the variable. When this is implemented for variable "i", for each term "conjunct" (forming a logical product of constraint violating conditions of the currently referenced constraint violating condition) whose table [i] about the currently referenced constraint violating condition is not zero (0), the value is increased by the attribute value corresponding to the current variable value of variable "i" by substituting zero (0) into table [i]. The process continues to S603.

S603: The controller 310 has the variable value changer 330 simplify constraint violating condition "NJ". This simplification is similar to what is explained in the description of FIG. 5. That is, $x_1 12 > 13$ and $x_1 + 11 > 13$ is simplified to $x_1 + 11 > 13$ The process continues to S604.

S604: The controller 310 has the variable value changer 330 judge whether or not there is any variable value not yet tried. If the variable value changer 330 judges negatively (N), the process continues to S605. If the variable value changer 330 judges affirmatively (Y), the process skips to S606.

S605: By judging that the variable value changer 330 fails in changing a variable value, the controller 310 moves the control over to the call originator, and returns the constraint violating condition "NJ". Then, the process terminates.

S606: The controller 310 has the variable value changer 330 set one of the variable values not yet tried to variable "i". The process then continues to S607.

S607: The controller 310 has the variable value changer 330 check whether or not the accumulated constraint violating conditions are satisfied. If the variable value changer 330 judges negatively (N), the process continues to S608. If the variable value changer 330 judges affirmatively (Y), the process skips to S609.

S608: Because the variable value changer 330 succeeds in changing a variable value, the controller 310 has the variable value changer 330 return "NULL" to the call originator. Then, the process terminates.

S609: The controller 310 has the constraint satisfier 320 create the logical product of the constraint violating conditions to which the corresponding attribute value is written and the hitherto synthesized constraint violating conditions, thereby updating the constraint violating condition "NJ". Then, the process reverts to S603 in a loop form.

The controller 310 registers to the constraint violating condition table the constraint violating condition "NJ" returned as a result of a variable value change by the variable value changer 330 or a variable value selection by the variable value selector 340 and copies it. Immediately thereafter in a variable value change by the variable value changer 330, the controller 310 has the variable value changer 330 write the attribute value in the attribute value writing process in S602.

Although the above processes corresponding to the first form of this invention shown in FIG. 1A checks the satisfaction of the constraint violating conditions, it is also possible to achieve the same purpose by checking the satisfaction of the constraint meeting conditions per the second form of this invention shown in FIG. 1B.

Figure 7:
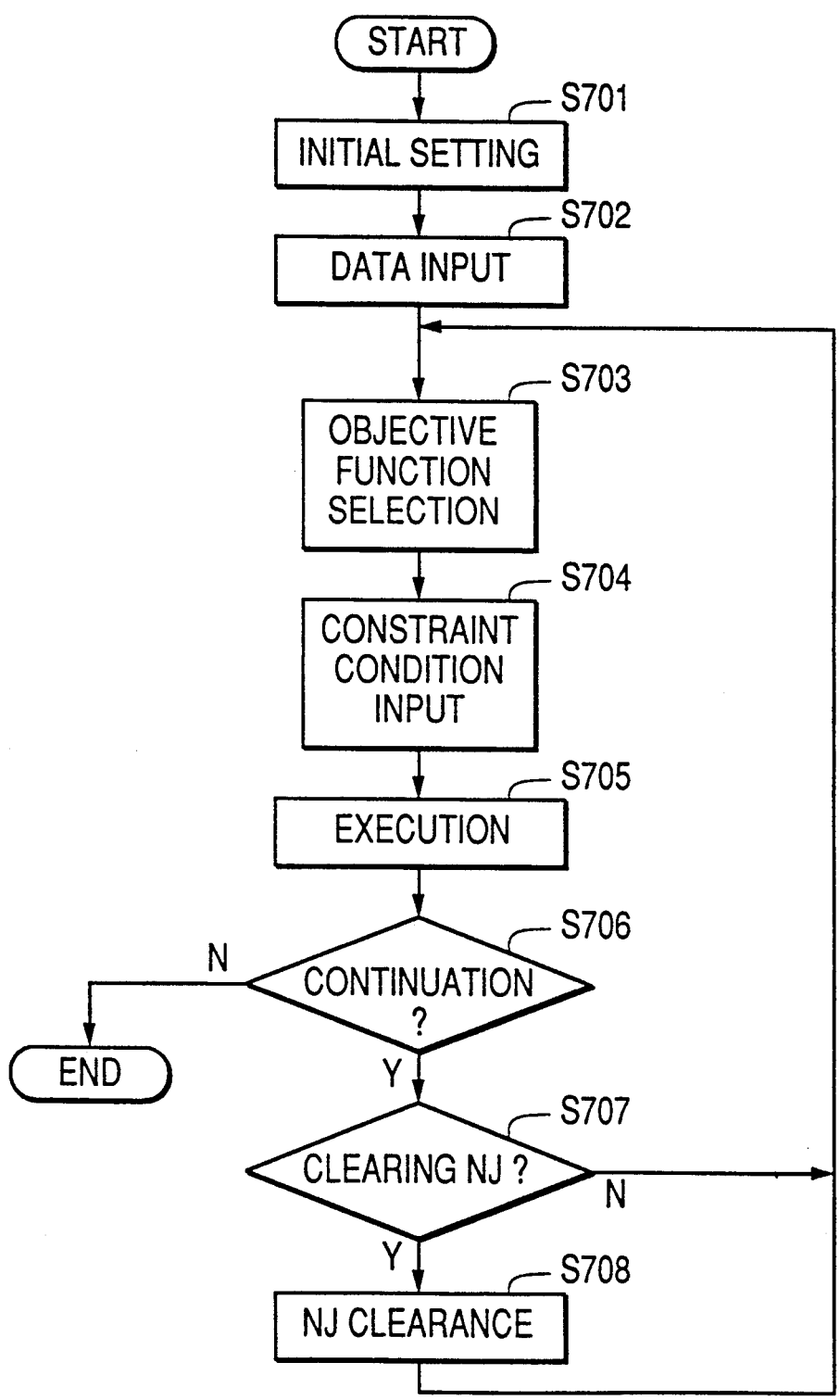
FIG. 7 is a process flowchart of an optimizing system.

FIG. 7 is a process flowchart of an optimizing system.

The optimizing system aims at solving the constrained combination optimizing problem illustrated in the preferred embodiment, whose solution is executed by the constraint satisfier 320 under the control of the controller 310 shown in FIG. 3. Here, for simplicity of explanation, it is assumed that all the processed data are integers. Accordingly, it need only set the constraint of the variable inequality corresponding to the objective function to an integer less (greater) than the greatest (least) objective function value obtained. Similar processing can be performed even if not all the processed data are integers.

S701: After the process starts, the controller 310 has the constraint satisfier 320 make an initial setting. That is, the controller 310 has the constraint satisfier 320 set "n-agent", which is the number of variables, and "n-path", which is the total number of the inequalities minus one (1), thereby completing the constraint violating inequality table "dnj". The process continues to S702.

S702: The controller 310 has the constraint satisfier 320 complete the variable value table "alt" and the data table "des". That is, the controller 310 has the constraint satisfier 320 set the total number of variable values and data on the attribute value of respective variable values of respective variables. The controller 310 also has the constraint satisfier 320 set all the entries of the "In Table" to one (1). The process continues to S703.

S703: The controller 310 has the constraint satisfier 320 select an objective function. That is, the controller 310 has the constraint satisfier 320 select the optimizing objective function from among the constraint conditions from "0" to "n-path", inputs the initial value as the constraining value, and writes it into the constraining value table "constraint". The process continues to S704.

S704: The controller 310 asks the user to input respective constrained combination inequalities interactively. That is, the controller 310 requests the user to input constraining values of respective constrained combination inequalities (except the objective function) and writes the result to the constraining value table "constraint". The process then continues to S705.

S705: The controller 310 has the constraint satisfier 320 execute the constraint satisfaction process, in which an array "in-save (int in-save [AGENT])" the constraint satisfier 320 initializes to zero (0), thereby executing a constraint satisfaction algorithm. If the constraint satisfier 320 succeeds in satisfying a constraint, it copies (overwrites) the result (entry to the "In Table") to the array "in-save", calculates the value of the objective function, writes as the new constraining value the greatest (least) integer less (greater) than the value to the constraining value table "constraint", and repeats the constraint satisfaction process until the constraint satisfier 320 fails in satisfying the constrain process. When the constraint satisfier 320 finally fails in a satisfying constraint, the controller 310 has the constraint satisfier 320 output the result (entry of the array "in-save") and the attribute values corresponding to respective constrained combination inequalities. In the example of logic designing, the attribute values are the gate number and the entire path delay. When no constraint satisfaction succeeds, the controller 310 has the constraint satisfier 320 output the final constraint violating condition, all of whose terms "conjunct" (forming logical products of constraint violating conditions of the currently referenced constraint violating condition) have their left hand side digitized. When the above constraint satisfaction process terminates and its result is obtained, the process continues to S706.

S706: The controller 310 asks the user whether he has decided to repeat the above processings. If he decides negatively (N), the process terminates. If he decides affirmatively (Y), the process continues to S707.

S707: The controller 310 further asks the user to decide whether it is necessary to clear the constraint violating condition "NJ". If he decides affirmatively (Y), the process continues to S708. If he decides negatively (N), the process reverts to S703 in a loop form.

S708: The controller 310 clears the constraint violating condition "NJ". Then, the process reverts to S703 in a loop form.

A knapsack problem is taken up as a concrete example of an application of this invention to a solution of a constrained combination optimizing problem. The problem is as follows.

Problem

"There are four (4) kinds of goods as candidates to be put into a knapsack before a departure on a tour. The sum of the expected utilities needs to be maximized within a capacity limit.

A first item (e.g. a snack) is designated as AGENT(0). Its volume is six (6). Its expected utility is one (1). There are two (2) alternatives, to put it in (AGENT(0)=1) and not to put it in (AGENT(0)=2). (This is the same for the other items.)

The variable corresponding to the size of the first item is expressed as (0, 1) and the variable corresponding to the expected utility is expressed as (0, 2). (This is the same for other items.)

A second item (e.g. a bottle of juice) is designated as AGENT(1). Its size is eight (8). Its expected utility is three (3).

A third item (e.g. a lunch box) is designated as AGENT(2). Its size is five (5). Its expected utility is seven (7).

A fourth item (e.g. an umbrella) is designated as AGENT(3). Its size is two (2). Its expected utility is three (3).

When an item is not put into the knapsack, its size and expected utility are both zero (0)."

The capacity limit of this problem is set to fourteen (14). The system shown in the preferred embodiment of this invention is used for solving this constrained combination optimizing problem.

FIGS. 8A through 8G illustrate an application of this invention to a knapsack problem.

FIG. 8A shows in a list form the volumes and utilities of respective items.

Figure 8B:
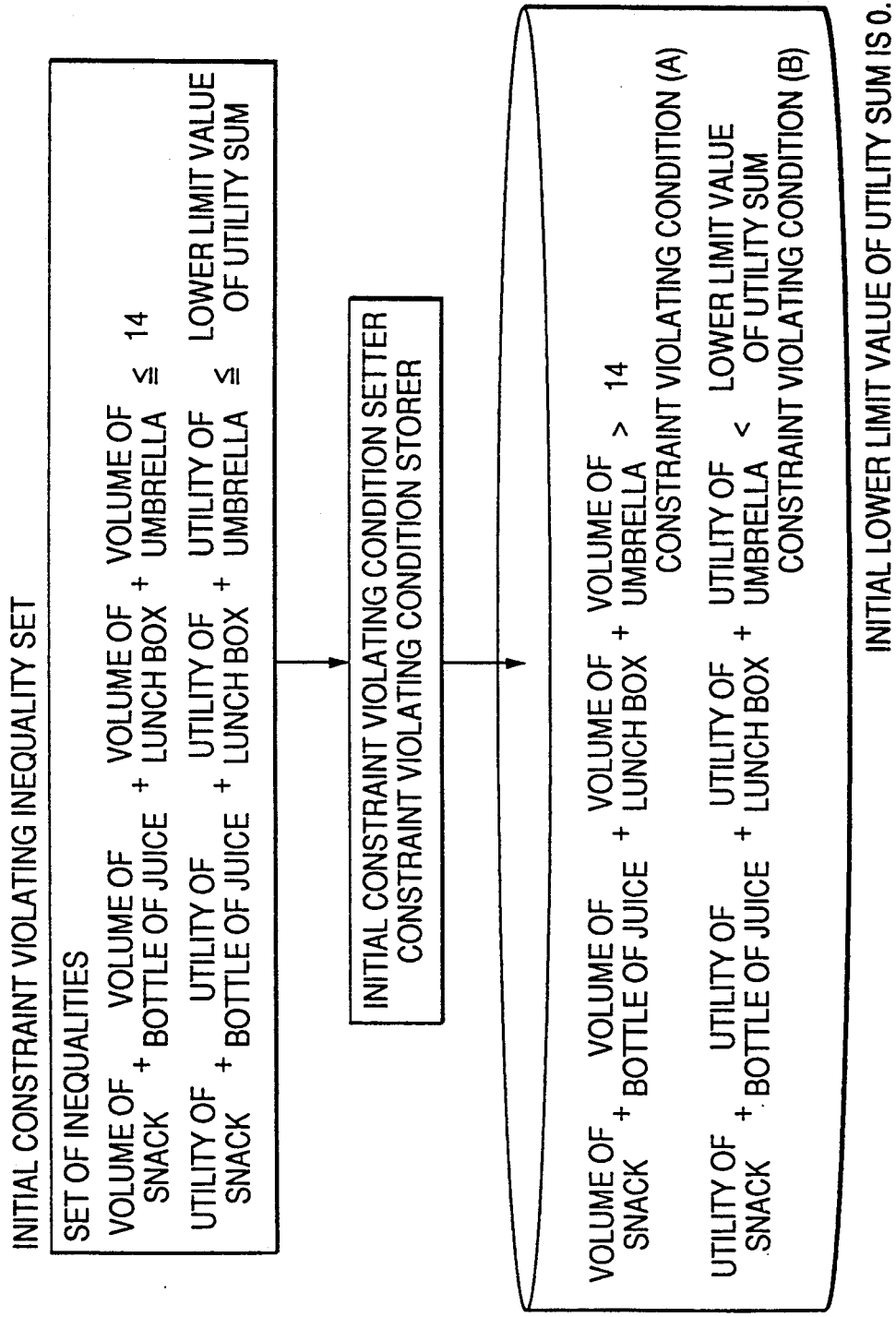
FIGS. 8A through 8N illustrate an application of this invention to a knapsack problem.

FIG. 8B shows the process of setting initial constraint violating inequalities.

An initial constraint violating condition setter sets the initial constraint meeting inequality, $$(0, 1)+(1, 1)+(2, 1)+(3, 1) \leq \text{constraint}(0)$$

where, constraint(0) represents the capacity limit of the knapsack. Thus, by reciprocating the above initial constraint meeting inequality, the initial constraint violating inequality is obtained as $$(0, 1)+(1, 1)+(2, 1)+(3, 1) > \text{constraint}(0) \quad (A)$$

The objective function to be maximized is defined as $(0, 2)+(1, 2)+(2, 2)+(3, 2)$, which is further expressed as the following variable inequality.

$$(0, 2)+(1, 2)+(2, 2)+(3, 2) \geq \text{constraint}(1) \quad (B)$$

A constraint violating condition storer stores those two (2) inequalities (A) and (B). Then, the constraint satisfaction process is executed by setting the lower limit "constraint(1)" of the initial value to zero (0).

FIG. 8C shows the sum of volumes exceeding the capacity limit.

First, the constraint satisfaction process is executed by putting all items in. That is, AGENT(0)=1, AGENT(1)=1, AGENT(2)=1, and AGENT(3)=1

However, because the total volume is 21, this exceeds the capacity limit. Because there exists a constraint violating condition [(Y) in S500 shown in FIG. 5], a variable value change process [S501 shown in FIG. 5] is executed.

Figure 8D:
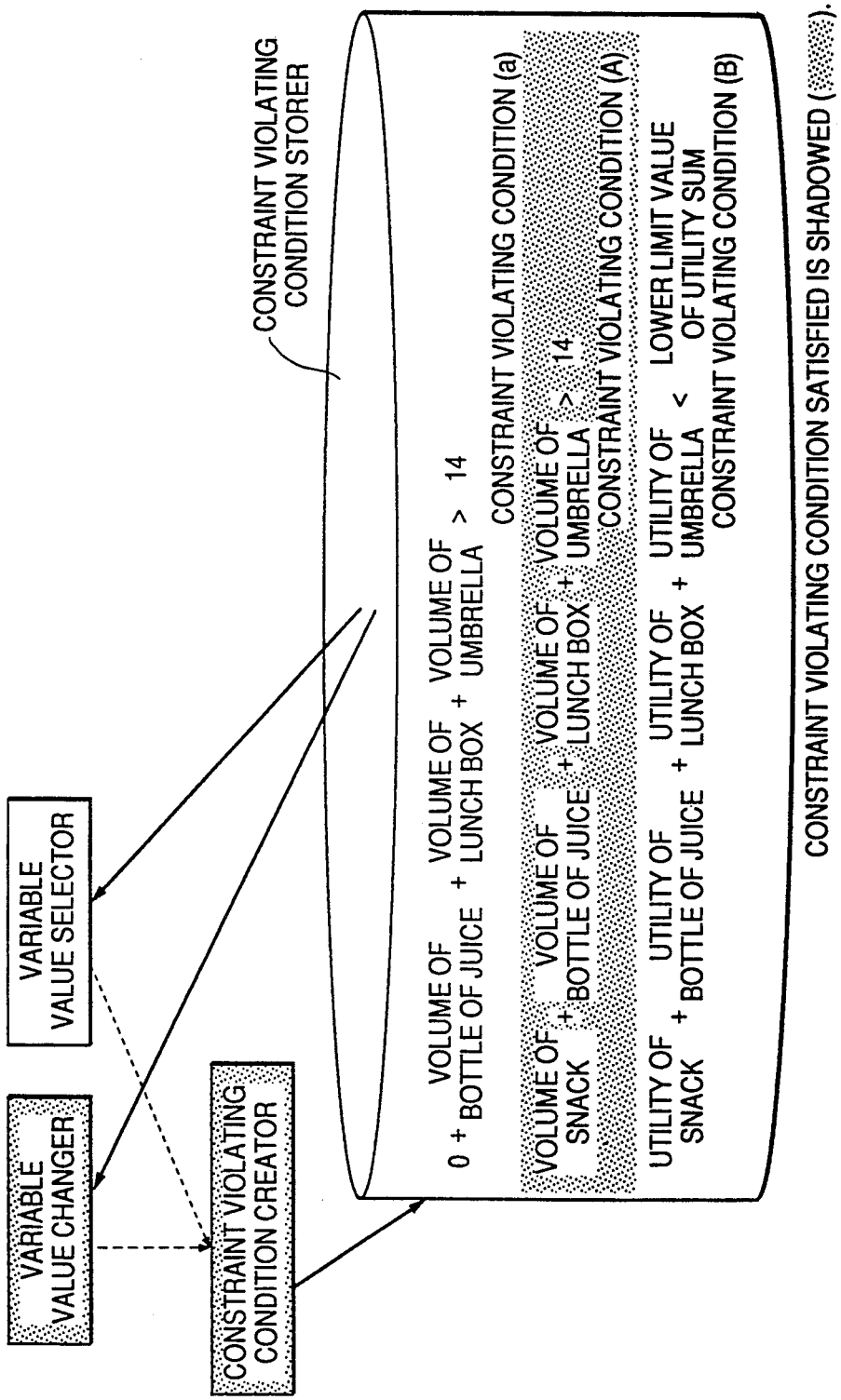

FIG. 8D shows a creation of a new constraint violating condition (a) after a failed trial of a variable value change for the snack.

In the variable value change process, an initial attempt is made to change the variable value of the snack [AGENT(0)]. Whether the snack is put in [AGENT(0)=1] or not [AGENT(0)=2], the constraint violating inequality (A) is satisfied. Because the constraint violating inequality (A) is satisfied no matter how the constraint value is changed [S502 shown in FIG. 5], a new constraint violating condition (a) is created [S504 shown in FIG. 5] by making a logical product between the inequality obtained by substituting six (6) [the volume of the snack when it is put in the knapsack] into the left hand side of constraint violating condition (A) and the inequality obtained by substituting zero (0) [the volume of the snack when it is not put in the knapsack] into the left hand side of constraint violating condition (A). The state at this time is expressed as, AGENT(0)=x (unknown), AGENT(1)=1, AGENT(2)=1, and AGENT(3)=1.

Figure 8E:
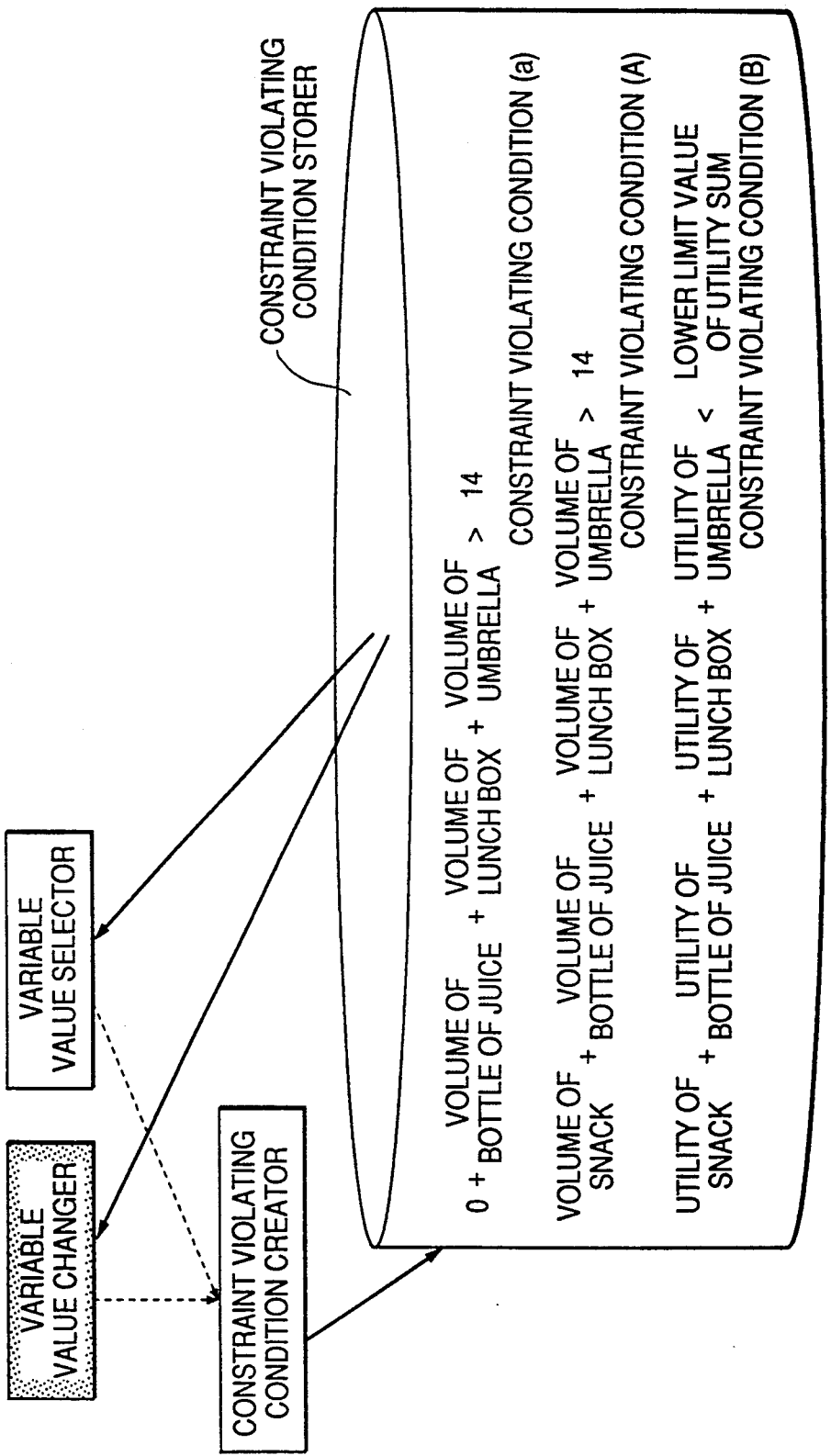

FIG. 8E shows a successful execution of a variable value change for the bottle of juice.

After a new constraint violating condition is created, the variable value change process [S501 shown in FIG. 5] is restarted. That is, an attempt is made to change the variable value of the bottle of juice [AGENT(1)] next. When the bottle of juice is not put in [AGENT(0)=x (unknown), AGENT(1)=2, AGENT(2)=1, and AGENT(3)=1], none of the constraint violating inequalities (a), (A) and (B) are satisfied. Hence, the variable value change for the bottle of juice is successful. [(N) in S502 shown in FIG. 5]

Figure 8F:
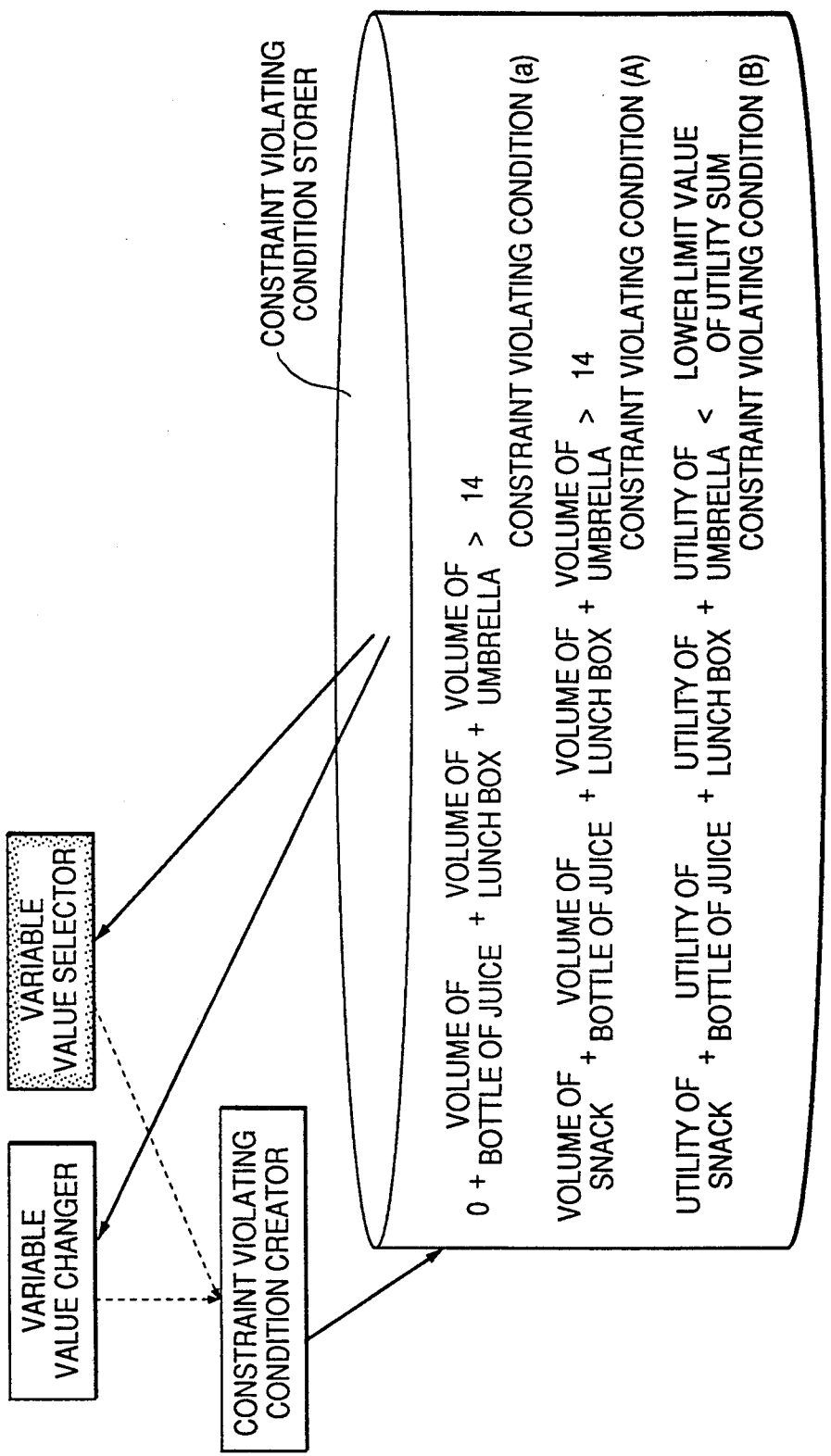

FIG. 8F shows a successful execution of a variable value selection for the snack.

Because the snack remains a variable whose variable value is unknown [(Y) in S506 shown in FIG. 5], its variable value selection process [S508 shown in FIG. 5] is executed. This reveals that the variable value selection for the snack is successful [(N) in S502 shown in FIG. 5], when AGENT(0)=1, AGENT(1)=2, AGENT(2)=1, and AGENT(3)=1. Because there are no more unknown variable values, the constraints are all satisfied. The sum of the expected utilities is eleven (11) at this time. [S507 shown in FIG. 5]

The process continues to find the combination with a larger sum of expected utilities. [(Y) in S706 shown in FIG. 7] In this case, the constraint violating conditions stored in the constraint violating condition storer are not cleared. A new constraint value is set to twelve (12), which is the minimum value greater than the currently obtained sum of the expected utilities. [S703 in FIG. 7] Then, the constraint satisfaction process is executed. [S705 in FIG. 7]

Figure 8G:
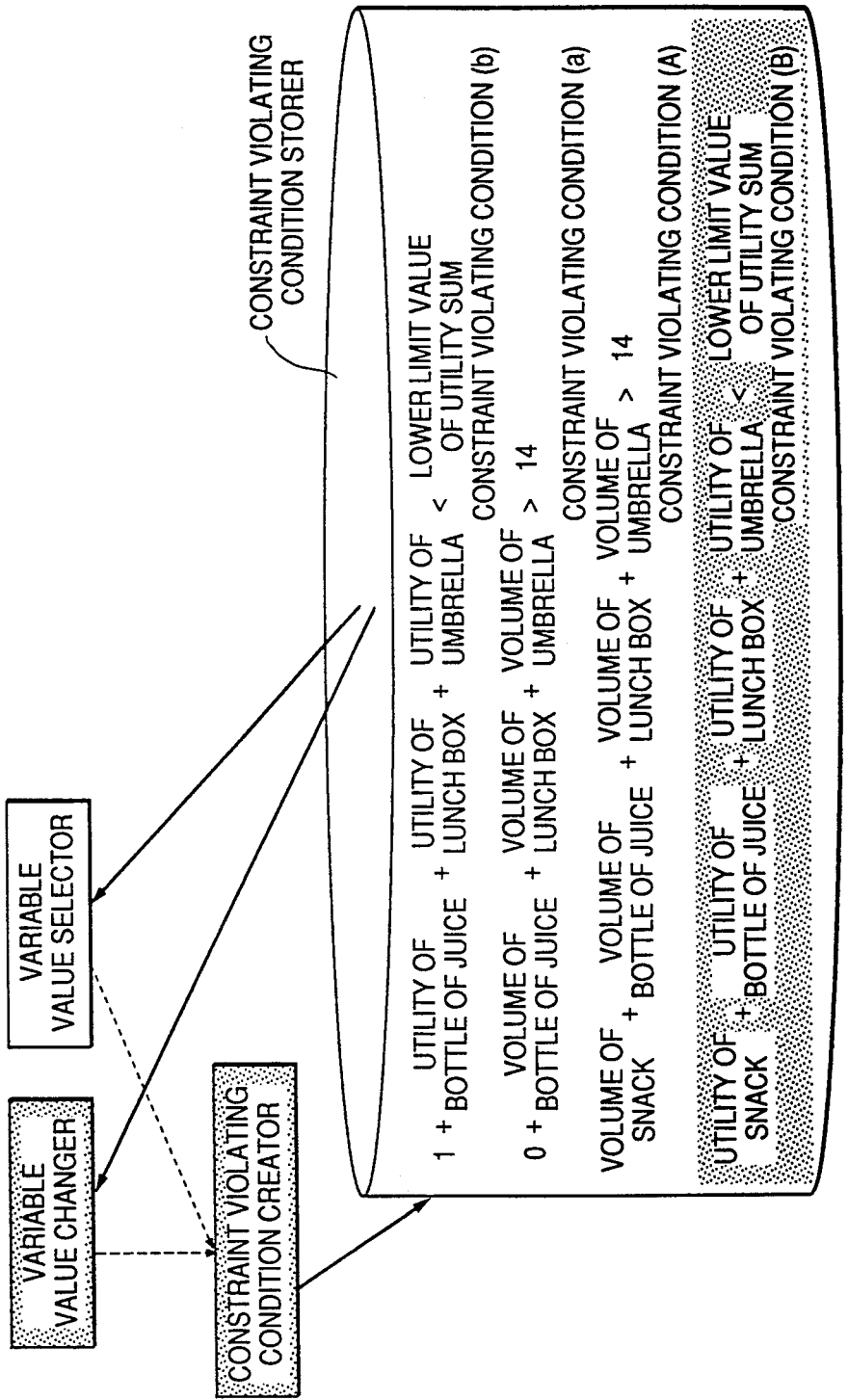

FIG. 8G shows a creation of a new constraint violating condition (b) after a failed trial of a variable value change for the snack.

The state [AGENT(0)=1, AGENT(1)=2, AGENT(2)=1, and AGENT(3)=1] producing the currently obtained sum of the expected utilities is re-evaluated by the newly set constraint value twelve (12), which is the lower limit of the sum of the expected utilities. Because the currently obtained sum of the expected utilities is naturally less than twelve (12), constraint violating inequality (B) is satisfied. [(Y) in S500 shown in FIG. 5]

Thus, another variable value change process is executed [S501 shown in FIG. 5] An attempt is made to change the variable value of the snack. This attempt results in a failure, however. When a part [AGENT(1)=2, AGENT(2)=1, and AGENT(3)=1] of the above state is maintained, whether the snack is put in [AGENT(0)=1] or not [AGENT(0)=2], the constraint violating inequality (B) is satisfied. Because the constraint violating inequality (B) is satisfied no matter how the constraint value is changed [S502 shown in FIG. 5], a new constraint violating condition (b) is created [S504 shown in FIG. 5] by making a logical product between the inequality obtained by substituting one (1) [the utility of the snack when it is put in the knapsack] into the left hand side of constraint violating condition (B) and the inequality obtained by substituting zero (0) [the utility of the snack when it is not put in the knapsack] into the left hand side of constraint violating condition (B). The state at this time is expressed as, AGENT(0)=x (unknown), AGENT(1)=2, AGENT(2)=1, and AGENT(3)=1.

FIG. 8H shows a creation of a new constraint violating condition (c) after a failed trial of a variable value change for the bottle of juice.

After constraint violating condition (b) is created, another variable value change process [S501 shown in FIG. 5] is started. That is, an attempt is made to change the variable value of the bottle of juice [AGENT(1)] next. When the bottle of juice is put in [AGENT(0)=x (unknown), AGENT(1)=1, AGENT(2)=1, and AGENT(3)=1], constraint violating inequality (a) is satisfied. When the bottle of juice is not put in [AGENT(0)=x (unknown), AGENT(1)=2, AGENT(2)=1, and AGENT(3)=1], constraint violating inequality (b) is satisfied. Therefore, a new constraint violating condition (c) is created [S504 shown in FIG. 5].

A first inequality is created as a logical product between the inequality obtained by substituting eight (8) [the volume of the bottle of juice when it is put in the knapsack] into the left hand side of constraint violating condition (a) and the inequality obtained by substituting zero (0) [the volume of the bottle of juice when it is not put in the knapsack] into the left hand side of constraint violating condition (a).

A second inequality is created as a logical product between the inequality obtained by substituting three (3) [the utility of the bottle of juice when it is put in the knapsack] into the left hand side of constraint violating condition (b) and the inequality obtained by substituting zero (0) [the utility of the bottle of juice when it is not put in the knapsack] into the left hand side of constraint violating condition (b).

Constraint violating condition (c) is created as a logical product between the first inequality and the second inequality.

The state at this time is expressed as, AGENT(0)=x (unknown), AGENT(1)=x (unknown), AGENT(2)=2, and AGENT(3)=1.

Figure 8I:
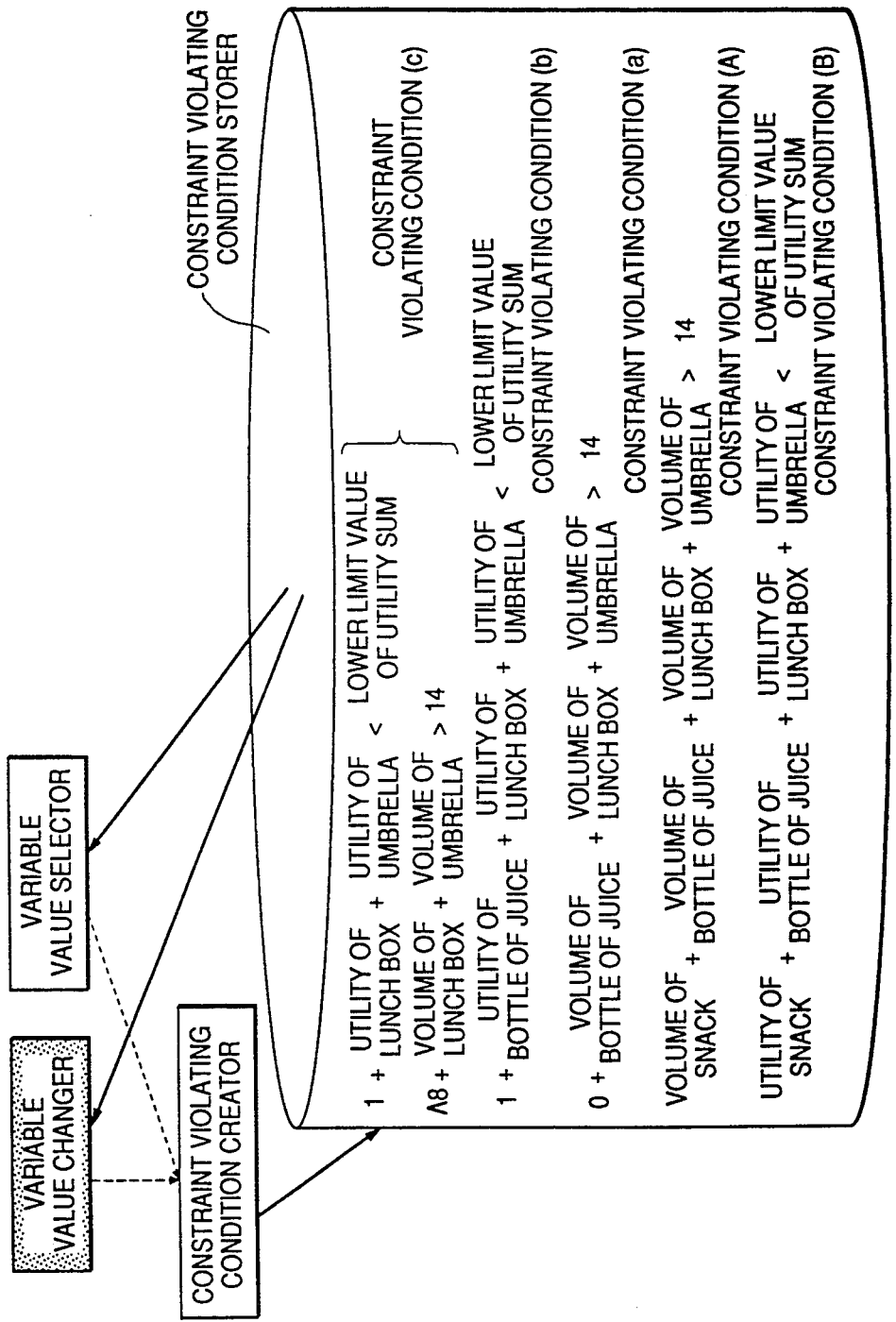

FIG. 8I shows a successful execution of a variable value change for a lunch box.

After constraint violating condition (c) is created, another variable value change process [S501 shown in FIG. 5] is started. That is, an attempt is made to change the variable value of the lunch box [AGENT(2)] next. When the lunch box is not put in [AGENT(0)=x (unknown), AGENT(1)=x (unknown), AGENT(2)=2, and AGENT(3)=1], none of constraint violating inequalities (A), (B), (a), (b) and (c) are satisfied. Hence, the variable value change for the lunch box is successful. [(N) in S502 shown in FIG. 5] Because the bottle of juice remains as a variable whose variable value is unknown [(Y) in S506 shown in FIG. 5], its variable value selection process [S508 shown in FIG. 5] is executed.

Figure 8J:
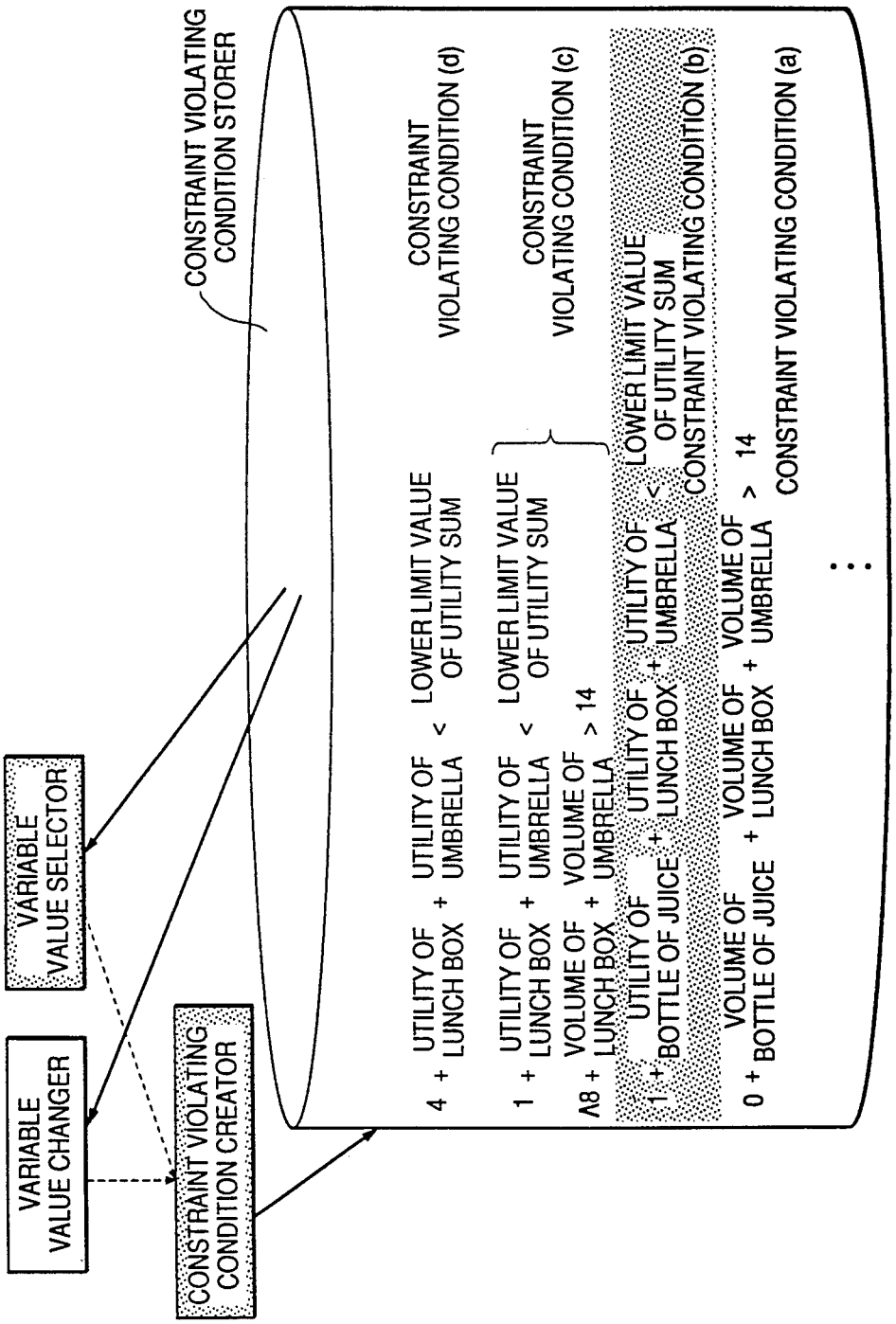

FIG. 8J shows a creation of a new constraint violating condition (d) after a failed trial of a variable value selection for the bottle of juice.

When a part [AGENT(0)=x (unknown), AGENT(2)=1, and AGENT(3)=1] of the above state is maintained, whether the snack is put in [AGENT(1)=1] or not [AGENT(1)=2], the constraint violating inequality (b) is satisfied. Because the constraint violating inequality (b) is satisfied no matter how the constraint value is changed [S502 shown in FIG. 5], a new constraint violating condition (d) is created [S504 shown in FIG. 5] by making a logical product between the inequality obtained by substituting three (3) [the utility of the bottle of juice when it is put in the knapsack] into the left hand side of constraint violating condition (b) and the inequality obtained by substituting zero (0) [the utility of the bottle of juice when it is not put in the knapsack] into the left hand side of constraint violating condition (b). The state at this time is expressed as, AGENT(0) TM x (unknown), AGENT(1)=x (unknown), AGENT(2)=2, and AGENT(3)=1.

FIG. 8K shows a creation of a new constraint violating condition (e) after a failed trial of a variable value change for the lunch box.

After constraint violating condition (d) is created, another variable value change process [S501 shown in FIG. 5] is started. That is, an attempt is made to change the variable value of the lunch box [AGENT(2)] next. When the lunch box is put in [AGENT(0)=x (unknown), AGENT(1)=x (unknown), AGENT(2)=1, and AGENT(3)=1], constraint violating inequalities (c) and (d) are satisfied. Therefore, a new constraint violating condition (e) is created [S504 shown in FIG. 5].

A third inequality is created as a logical product between the inequality obtained by substituting five (5) [the volume of the lunch box when it is put in the knapsack] into the left hand side of the volume expression of constraint violating condition (c) and the inequality obtained by substituting zero (0) [the volume of the lunch box when it is not put in the knapsack] into the left hand side of the volume expression of constraint violating condition (c).

A fourth inequality is created as a logical product between the inequality obtained by substituting seven (7) [the utility of the lunch box when it is put in the knapsack] into the left hand side of constraint violating condition (d) and the inequality obtained by substituting zero (0) [the utility of the lunch box when it is not put in the knapsack] into the left hand side of constraint violating condition (d).

Constraint violating condition (e) is created as a logical product between the third inequality and the fourth inequality.

The state at this time is expressed as, AGENT(0)=x (unknown), AGENT(1)=x (unknown), AGENT(2)=x (unknown), and AGENT(3)=1.

FIG. 8L shows a successful execution of a variable value change for a lunch box.

After a constraint violating condition (e) is created, another variable value change process [S501 shown in FIG. 5] is started. That is, an attempt is made to change the variable value of the umbrella [AGENT(3)] next. When the umbrella is not put in [AGENT(0)=x (unknown), AGENT(1)=x (unknown), AGENT(2)=x (unknown), and AGENT(3)=2], none of constraint violating inequalities (A), (B), (a), (b), (c), (d) and (e) are satisfied. Hence, the variable value change for the umbrella is successful. [(N) in S502 shown in FIG. 5] Because the lunch box remains as a variable whose value is unknown [(Y) in S506 shown in FIG. 5], its variable value selection process [S508 shown in FIG. 5] is executed.

FIG. 8M shows a creation of a new constraint violating condition (f) after a failed trial of a variable value selection for the lunch box.

When a part [AGENT(0)=x (unknown), AGENT(1)=x (unknown), and AGENT(3)=2] of the above state is maintained, whether the lunch box is put in [AGENT(2)=1] or not [AGENT(2)=2], the constraint violating inequality (d) is satisfied. Because the constraint violating inequality (d) is satisfied no matter how the constraint value is changed [S502 shown in FIG. 5], a new constraint violating condition (f) is created [S504 shown in FIG. 5] by making a logical product between the inequality obtained by substituting seven (7) [the utility of the lunch box when it is put in the knapsack] into the left hand side of constraint violating condition (d) and the inequality obtained by substituting zero (0) [the utility of the lunch box when it is not put in the knapsack] into the left hand side of constraint violating condition (d). The state at this time is expressed as, AGENT(0)=x (unknown), AGENT(1)=x (unknown), AGENT(2)=x (unknown), and AGENT(3)=2.

Figure 8N:
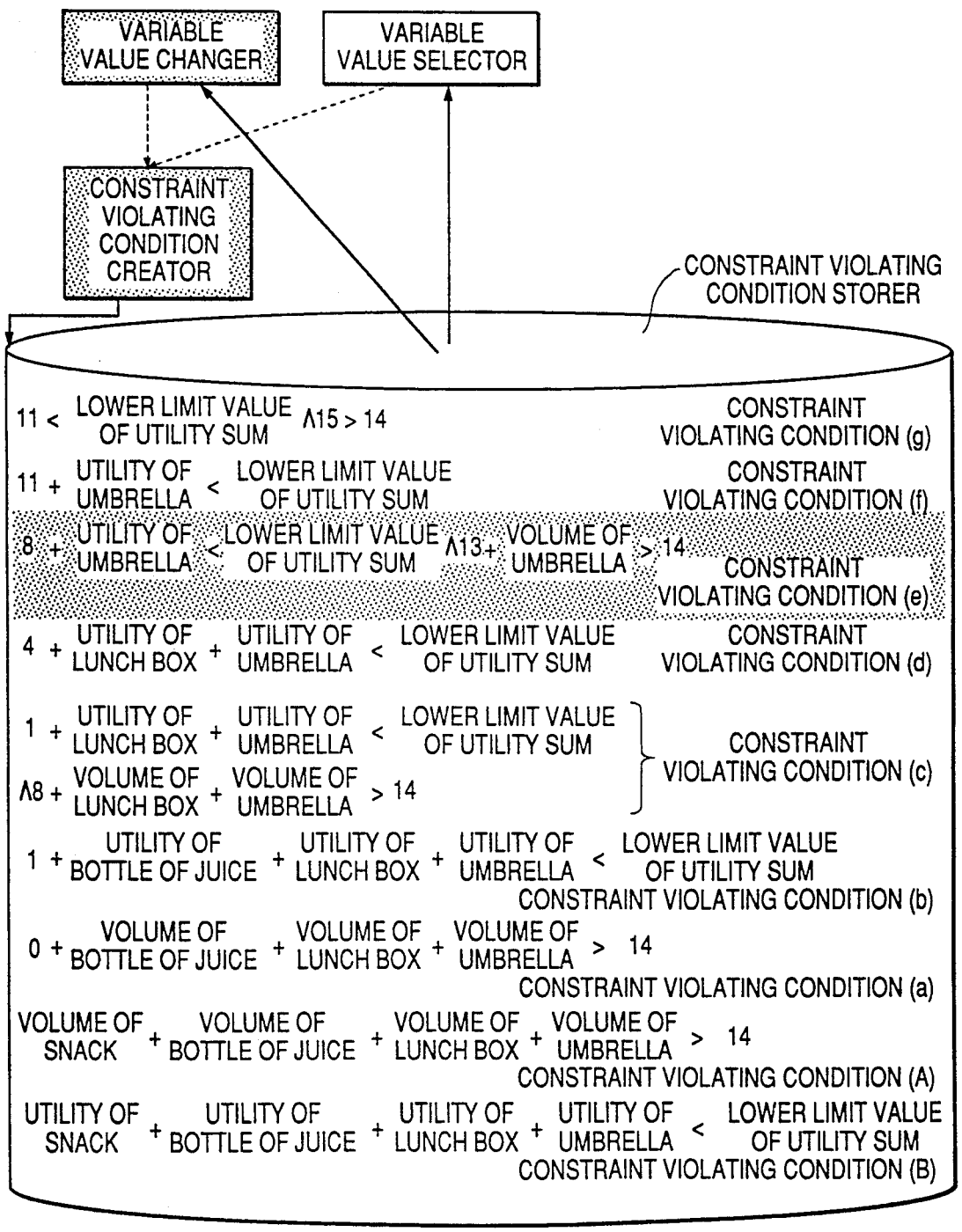

FIG. 8N shows a creation of a new constraint violating condition (e) after a failed trial of a variable value change for the umbrella.

After constraint violating condition (e) is created, another variable value change process [S501 shown in FIG. 5] is started. That is, an attempt is made to change the variable value of the umbrella AGENT(3)] next. When the umbrella is put in [AGENT(0)=x (unknown), AGENT(1)=x (unknown), AGENT(2)=x (unknown), and AGENT(3)=1], constraint violating inequality (e) is satisfied. Therefore, a new constraint violating condition (g) is created. [S504 shown in FIG. 5]

A fifth inequality is created as a logical product between the inequality obtained by substituting two (2) [the volume of the umbrella when it is put in the knapsack] into the left hand side of the volume expression of constraint violating condition (e) and the inequality obtained by substituting zero (0) [the volume of the lunch box when it is not put in the knapsack] into the left hand side of the volume expression of constraint violating condition (e).

A sixth inequality is created as a logical product between the inequality obtained by substituting three (3)

[the utility of the umbrella when it is put in the knapsack] into the left hand side of the utility expression of constraint violating condition (e) and the inequality obtained by substituting zero (0) [the utility of the umbrella when it is not put in the knapsack] into the left hand side of the utility expression of constraint violating condition (e).

Constraint violating condition (g) is created as a logical product between the fifth inequality and the sixth inequality.

The state at this time is expressed as, AGENT(0)=x (unknown), AGENT(1)=x (unknown), AGENT(2)=x (unknown), and AGENT(3)=x (unknown).

Because a condition whose left hand side is digitized is created now, [(Y) in S503 shown in FIG. 5], this restriction satisfaction process fails and terminates. [S505 shown in FIG. 5]

The execution of the above processes produces the following output example.

0+(1, 1)+(2, 1)+(3, 1)>constraint(0) has been generated. [NJ(a)]

1+(1, 2)+(2, 2)+(3, 2)<constraint(1) has been generated. [NJ(b)]

1+(2, 2)+(3, 2)<constraint(1) & 8+(2, 1)+(3, 1)>constraint(0) has been generated. [NJ(c)]

4+(2, 2)+(3, 2)<constraint(1) has been generated. [NJ(d)]

8+(3, 2)<constraint(1) & 13+(3, 1)>constraint(0) has been generated. [NJ(e)]

11+(3, 2)<constraint(1) has been generated. [NJ(f)]

11<constraint(1) & 15>constraint(0) has been generated. [NJ(g)]

Design completed

The alternative of each agent is:

AGENT(0)=1, AGENT(1)=2, AGENT(2)=1, and AGENT(3)=1

Figure 9:
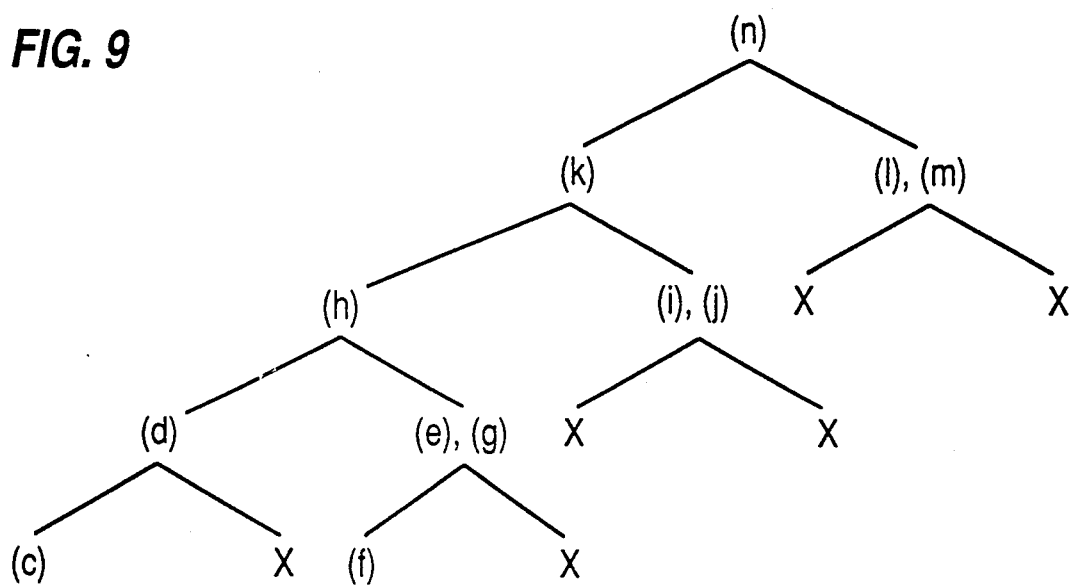
FIG. 9 illustrates an execution of an optimization through searching by this invention.

FIG. 9 illustrates an execution of an optimization through searching by this invention.

Points (c) through (n) shown in FIG. 9 correspond respectively to descriptions for FIGS. 8C through 8N. "X" indicates a point where no further searching is necessary being prohibited by a constraint condition.

This invention is compared with the related arts.
The difference from a constraint logic programming (Dincbas, etc.)

A constraint logic programming carries a constraint arising when a particular variable value of a variable disables a restriction to be satisfied (optimization to be made), by banning the particular variable value. However, there is no means for prohibiting a combination of variable values of plural variables. The following forms a good reference for constraint logic programming.

M. Dincbas et al.: Solving A Cutting Stock Problem In Constraint Logic Programming, Proceedings of the Fifth International Conference and Symposium on Logic Programming, pp. 42–58 (1988).

The difference from a dependency-directed backtrack

A dependency-directed backtrack skips the branching points irrelevant to resolving a constraint violation and changes an alternative option only at a branching point relevant to resolving a constraint. However, it does not aim at carrying the constraint.

The difference from an integer programming

An integer programming requires that all variable values be known. However, the method of this invention has the advantage that the variable values can be specified when a particular variable value is changed.

The difference from a dynamic programming

Although a dynamic programming can formulate an optimizing problem with a function $G_k(y_1, y_2, \ldots, y_m)$ having m arguments, the m arguments need to be concrete numbers. That is, a dynamic programming cannot make an argument for a constraint irrelevant to the problem under a particular circumstance something which does not matter. This means that the concrete values of the arguments cannot be substantiated as a group. The method of this invention can cope with this problem by not generating a constraint violating condition for such a constraint.

$$G_k(y_1, y_2, \ldots, y_m) = \max\{G_{i-1}[y_1 - c_{i1}(1)], \ldots, \\ y_m - c_{i1}(m)] + c_{i1}(0), \\ G_{i-1}[y_1 - c_{i2}(1)], \ldots, \\ y_m - c_{i2}(m)] + c_{i2}(0), \ldots\}$$

where $c_{ij}(j)$ is a contribution to the k-th constraint by the j-th value $c_{ij}$ of variable $x_i$, and $c_{ij}(k)$ is a contribution to the objective function by the j-th value $c_{ij}$ of variable $x_j$.

Figure 10:
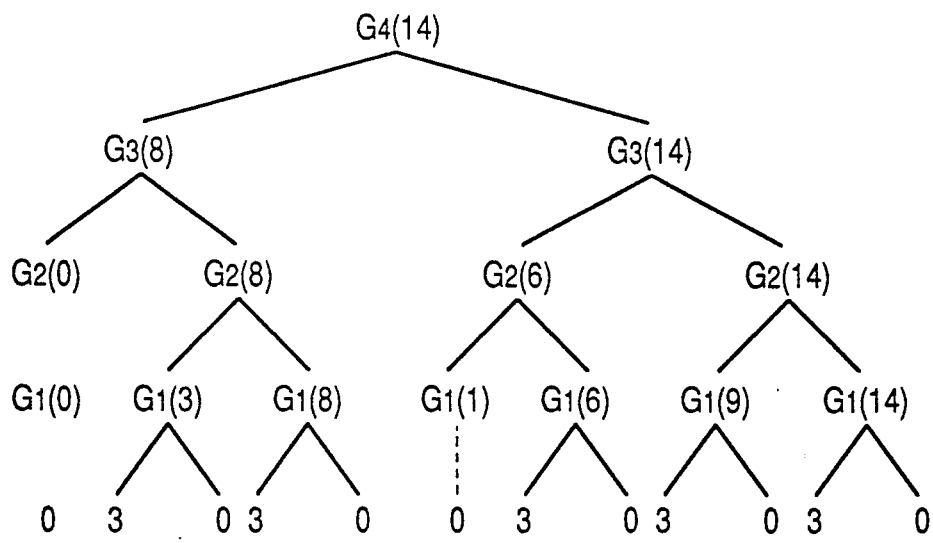
FIG. 10 illustrates a searching by a conventional dynamic programming.

In the case of the knapsack problem, when the constraint value is fourteen (14), $G_4(14) = \max\{G_3(14), G_3(8)+1\}$
$G_3(14) = \max\{G_2(14), G_2(6)+3\}$
$G_3(8) = \max\{G_2(8), G_2(0)+3\}$
$G_2(14) = \max\{G_1(14), G_1(9)+7\}$
$G_2(8) = \max\{G_1(8), G_1(3)+7\}$
$G_2(6) = \max\{G_1(6), G_1(1)+7\}$
$G_2(0) = \max\{G_1(0), G_1(-5)+7\} = G_1(0)$
$G_1(14) = \max\{(G_1(14), G_0(12)+3\} = 3$
$G_1(9) = \max\{(G_0(9), G_0(7)+3\} = 3$
$G_1(8) = \max\{G_0(8), G_0(6)+3\} = 3$
$G_1(6) = \max\{G_0(6), G_0(4)+3\} = 3$
$G_1(3) = \max\{G_0(3), G_0(1)+3\} = 3$
$G_1(1) = \max\{G_0(1), G_0(-1)+3\} = 0$
$G_1(0) = \max\{G_0(0), G_0(-2)+3\} = 0$ FIG. 10 illustrates a searching by a conventional dynamic programming.

As is evident from FIG. 10, a conventional dynamic programming searches almost all combinations.

A cutting stock problem such as Dincbas starts from $G_4(4, 16, 4, 16, 32, 12)$ to create $G_3(4, 10, 4, 14, 17, -4)$. $G_1(\cdot)$ only first produces minus infinity. If there is a positive value among a, b, c, d, e and f, $G_0(a, b, c, d, e, f)$ = minus infinity Therefore, a considerable number of unnecessary $G_3$, $G_2$ and $G_1$ are generated.

It is possible to assign a constraint violating condition NJ (whose variables are digitized) to each alternative.

FIGS. 11A through 11D illustrate an application of this invention to a cutting stock problem.

An evaluation on the preferred embodiment of this invention is explained by taking an exemplary cutting stock problem, which is as follows.

Figure 11A:
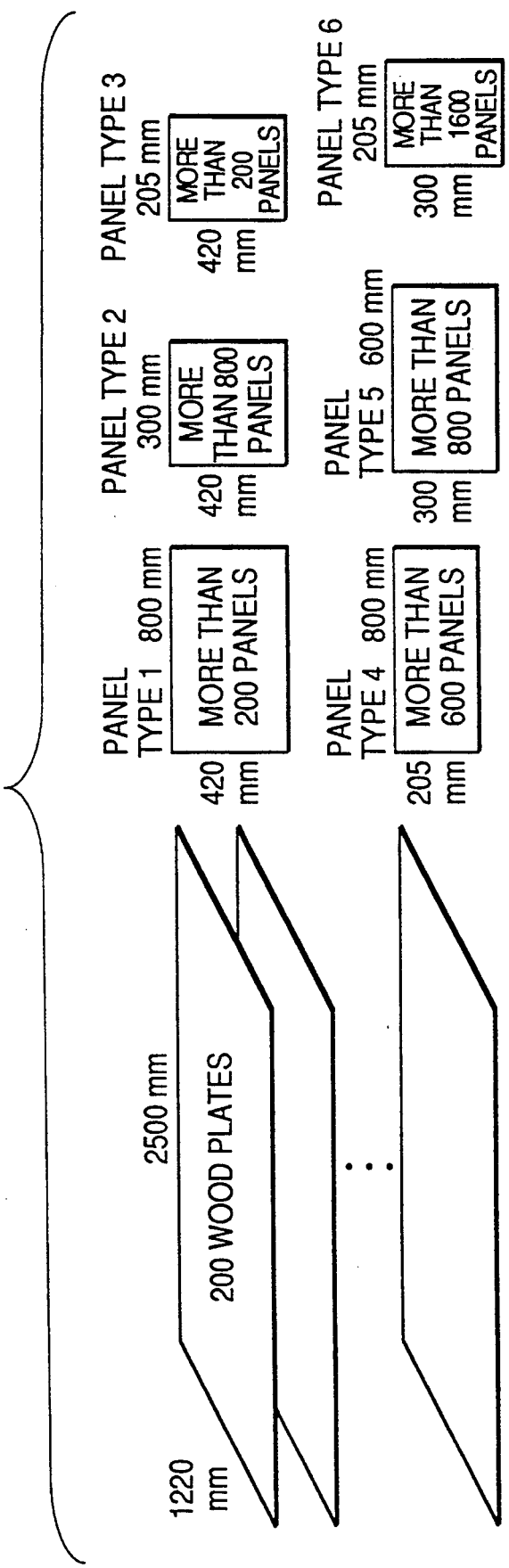

FIG. 11A shows an example of wood plates used in the cutting stock problem.

There are two hundred (200) wood plates having a dimension of two thousand five hundred millimeters by one thousand two hundred twenty millimeters (2,500 mm × 1,220 mm). Six (6) types of panels are cut out from those wood plates at least by required numbers. There could be panels cut out more than the required numbers. The two hundred (200) wood plates are grouped into four (40) equal lots each comprising fifty (50). All wood plates in the same lot are cut in the same manner. The task is to minimize the wastes.

FIG. 11B shows a cutting example, where the shadowed areas represent wastes. A cutter can contemporaneously manipulate one (1) set of horizontal blades and two (2) sets of vertical blades. The cutter first cuts the wood plates in the horizontal direction to produce slender plates, and further cuts the slender plates into panels by either of the two (2) vertical sets of blades. Although the cutter could cut the wood plates in many ways, both the cutting sequence and the total cutting number are constrained. The reference published by M. Dincbas show seventy-two (72) cutting sequences. We consider here a total of ninety-two (92) cutting sequences, comprising twenty (20) new cutting sequences in addition to the above seventy-two (72) cutting sequences.

Four (4) variables are provided in correspondence with the number of lots. Six (6) inequalities are provided in correspondence with the number of panel types. One (1) objective function is furnished for the waste. FIG. 11C shows an example of constraint violating condition.

FIG. 11D shows comparative execution results obtained by the solution of this invention and others.

The "EXCLUSIVE PROGRAM" refers to a program written exclusively for solving this problem based on the method explained in a reference by M. C. Costa "Une etude pratique de coupes de panneaux de bois" ["A practical study of cutting wood panels"] RAIRO Rechereche Operationnelle, [RAIRO quest for operation] Vol. 18, No. 3, [pages two hundred eleven (211) through two hundred nineteen (219)] (1984). The arts of "INTEGER PROGRAMMING" and "NO INCONSISTENCY" are also according to the reference by Dincbas.

Even by taking the different computer performances [SPARCstation is about ten (10) times faster than VAX-11/785 and IBM 370/168 is faster than VAX-11/785] into consideration, the art of this invention enables a solution to be obtained ten (10) times faster than the other arts. Further, the art of this invention enables the problem to be solved in about ten (10) minutes, when the number of lots is increased from four (4) to twenty (20) such that predetermined numbers of panels are cut out from a total of one thousand (1000) wood plates.

Figure 12:
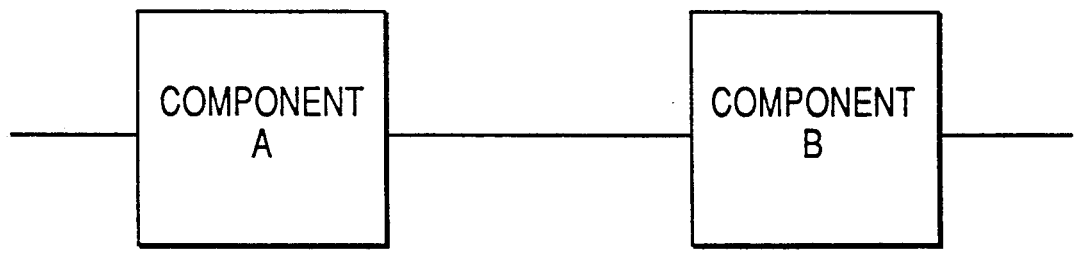
FIG. 12 illustrates an application of this invention to an LSI logic designing problem.

FIG. 12 illustrates an application of this invention to an LSI logic designing problem.

An evaluation on the preferred embodiment of this invention is explained by taking an exemplary LSI logic designing problem, which is as follows.

An LSI is designed by combining component A and component B. There are two methods of realizing components A and B. The total constraints are that the number of gates be no more than one hundred ten (110) gates and the entire delay be no more than one hundred ten nano seconds (110 ns).

The gate number of component A, the entire delay of component A, the gate number of component B, and the entire delay of component B are expressed respectively as "$d_0(x_1)$", "$d_1(x_1)$", "$d_0(x_2)$", and "$d_1(x_2)$". The constraint conditions are as follows.

$$d_0(x_1) + d_0(x_2) \leq 110$$

$$d_1(x_1) + d_1(x_2) \leq 110$$

Here, an initial constraint violating condition (1) is set as follows.

$$[d_0(x_1) + d_0(x_2)] [d_1(x_1) + d_1(x_2)] > \text{Constraint (1)}$$

where the value of "Constraint" is twelve thousand one hundred (12100), in this example.

Because trial 1 made for components A and B satisfies the initial constraint violating condition (1), trial 2 is made for component A. However, because this also satisfies the initial constraint violating condition (1) the following constraint violating condition is produced.

$$[30 + d_0(x_2)] [50 + d_1(x_2)] > \text{Constraint}$$

$$\& [60 + d_0(x_2)] [40 + d_1(x_2)] > \text{Constraint}$$

This is transformed to a constraint violating condition (2).

$$[30 + d_0(x_2)] [40 + d_1(x_2)] + 300 > \text{Constraint (2)}$$

Next, while the trial for component A is kept uncertain, the trial for component B is changed to trial 2. Because this also satisfies constraint violating condition (2), the following constraint violating condition is created.

12300 > Constraint & 12400 > Constraint

This is transformed to a constraint violating condition (3).

12300 > Constraint

Because this does not include a variable, the constraint satisfaction fails.

An introduction of the initial constraint violating condition as above enables a constraint satisfaction to be processed efficiently, when a tradeoff exists between attribute values (e.g. the gate number and the entire delay).

Figure 13:
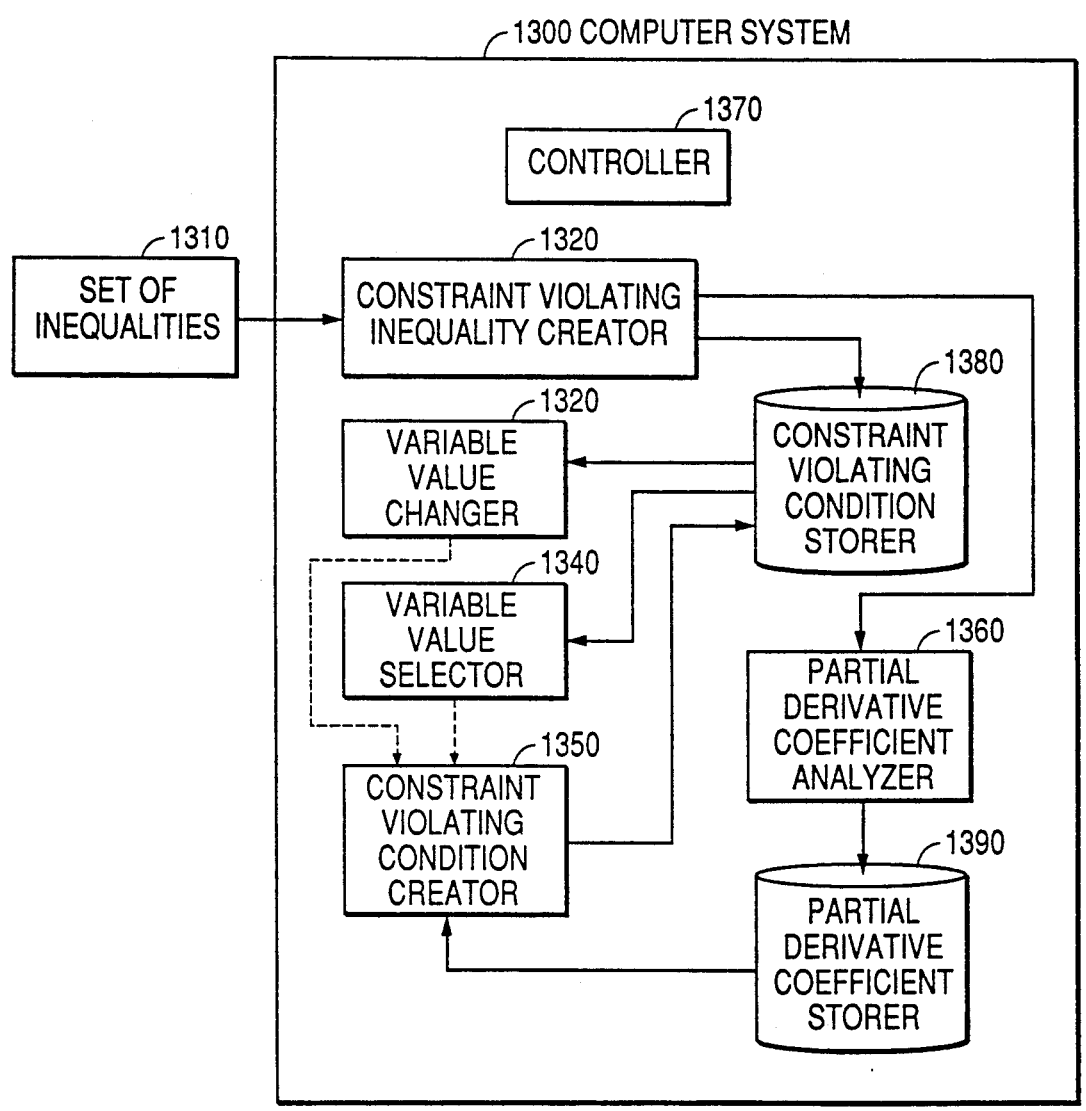
FIG. 13 illustrates a system configuration where a partial derivative coefficient is used for a constraint condition.

FIG. 13 illustrates a system configuration where a partial derivative coefficient is used for a constraint condition.

As with the system configuration shown in FIG. 3, which uses a constraint violating conditions, software for a general purpose computer can realize the system configuration shown in FIG. 13.

A computer system 1300 stores software for realizing this system in its main memory.

The software comprises steps for controlling a constraint violating inequality creator 1320, a variable value changer 1330, a variable value selector 1340, a constraint violating condition creator 1350, a partial derivative coefficient analyzer 1360 and a controller 1370.

The constraint violating inequality creator 1320 converts a set of inequalities 1310 expressing a combination problem to an initial restriction violating inequality. The variable value changer 1330 changes a variable value. The variable value selector 1340 selects a variable value for an unknown variable value. The constraint violating condition creator 1350 creates a new constraint violating condition when a variable value change or selection fails. The partial derivative coefficient analyzer 1360 analyzes partial derivative coefficients. The controller 1370 controls the whole process.

A secondary memory or the main memory of the computer system 1300 comprises a constraint violating condition storer 1380 and a partial derivative coefficient storer 1390. The constraint violating condition storer 1380 stores a constraint violating condition created by the constraint violating inequality creator 1320. The partial derivative coefficient storer 1390 stores information on the partial derivative coefficient analyzed by the partial derivative coefficient analyzer 1360.

The controller 1370 performs the same processes as those shown in the process flowcharts for the system configuration shown in FIG. 3. (FIG. 4 is a process flowchart for a constraint satisfaction system. FIG. 7 is a process flowchart for a constraint optimization system.)

That is, the controller 1370 requests a user to input the set of inequalities 1310 expressing a problem. The constraint violating condition creator 1320 creates inequalities reciprocal to the set of inequalities 1310 stores them in the constraint violating condition storer 1380, and notifies the partial derivative coefficient analyzer 1360. The partial derivative coefficient analyzer 1360 partially differentiate by respective variables the left hand side of the initial constraint violating inequality supplied from the constraint violating inequality creator 1320 to determine whether or not there is a tendency of monotonic increase or a monotonic decrease for each variable. The partial derivative coefficient storer 1390 stores the partial derivative having such a tendency.

After completing the above, the process follows the steps shown in FIG. 5, which is the process flowchart for constraint satisfaction. The processes for the variable value changer 1330 and the variable value selector 1340 are entirely similar. When the variable value changer 1330 fails to change a variable value and the variable value selector 1340 fails to select a variable value, the constraint violating condition creator 1350 is invoked. The constraint violating condition creator 1350 creates a new constraint violating condition by utilizing a partial derivative coefficient stored in the partial derivative coefficient storer 1390, which the constraint violating condition storer 1380 stores.

The partial derivative coefficient analyzer 1360 analyzes a tendency a monotonic increase or monotonous decrease on the left hand side $f_k(x_1, x_2, \ldots, x_n)$ of the initial constraint violating inequality $f_k(x_1, x_2, \ldots, x_n) > b_k$ by partially differentiating respective variables $x_i$.

When $f_k(x_1, x_2, \ldots, x_n)$ is expressed as a linear combination of respective variables $x_1, x_2, \ldots, x_n$, because $\partial f_k/\partial x_i$ is a constant term, it is quite easy to judge whether respective partial derivative coefficients are positive or negative.

Also, a tendency of a monotonic increase or a monotonous decrease of a functional expression such as $f(x,y) = x^2 + 2xy + y^2$ can be analyzed comparatively easily, if there is additional conditions such as $x > 0$ and $y > 0$, e.g. because $\partial f/\partial x = 2x + 2y > 0$.

The information stored in the partial derivative storer 1390 is a table whose rows are for constraint violating inequalities and columns are for variables. When the partial derivative coefficient is identically positive, negative or zero the corresponding space in the table is filled with "+", "−", or "0". Otherwise, it is filled with "?".

When the variable value changer 1330 fails to change a variable value and the variable value selector 1340 fails to select a variable value, i.e. when a variable value combination $(x_1, x_2, \ldots, x_n) = (a_1, a_2, \ldots, a_n)$ satisfies a particular constraint violating condition $f_k(x_1, x_2, \ldots, x_n) > b_k$, the constraint violating condition creator 1350 creates a new constraint violating condition. Here, $a_i = \phi$ expresses that $x_i$ is unknown. During the course of this process, the following conditions $C_i$ for respective variables are created by utilizing information on partial derivatives $\partial f_k/\partial x_i$ stored in the partial derivative coefficient storer 1390.

$C_i$: true (when $a_i = \phi$.)

$C_i$: $x_i \geq a_i$ (when the corresponding space in the partial derivative coefficient table is "+".)

$C_i$: $x_i \leq a_i$ (when the corresponding space in the partial derivative coefficient table is "−".)

$C_i$: true (when the corresponding space in the partial derivative coefficient table is "0".)

$C_i$: $x_i = a_i$ (when the corresponding space in the partial derivative coefficient table is "?".)

The constraint violating condition storer 1380 stores the logical product of all these conditions $C_i$ produced as a constraint violating condition.

Here, when the constraint violating condition storer 1380 registers a new constraint violating condition, it is judged whether the new constraint violating condition to be registered is logically stronger or weaker than a current constraint violating condition already stored. The constraint violating condition storer can delete a current constraint violating condition, when a weaker new constraint violating condition is registered. For example, when the constraint violating condition storer 1380 stores a new constraint violating condition $x_1 \geq 10$ & $x_2 \leq 6$, if it stores a current constraint violating condition $x_1 \geq 10$ & $x_2 \leq 6$, it deletes the latter condition and stores the former. This eliminates an unnecessary searching for a constraint violating condition which is logically represented by some other constraint violating condition and improves processing efficiency.

The system using a constraint violating condition has been explained so far. A similar system can be configured using a constraint meeting condition. However, its explanation is omitted here.

An example of solving a constrained combination satisfaction problem by using partial coefficients is explained next. A system shown in FIG. 13 using a constraint violating condition is employed for solving the problem.

Problem

"A three by three (3×3) magic grid is provided, in which different numbers one (1) through nine (9) are assigned to respective spaces such that the horizontal sums, the vertical sums, and the diagonal sums are all equal."

Variables are assigned to the spaces as follows.

| A | B | C |
|---|---|---|
| D | E | F |
| G | H | I |

Because the sum of all numbers are forty-five (45), the horizontal sums, the vertical sums, and the diagonal sums are all fifteen (15). Because of the following relations,

C = 15 - A - B
F = 15 - D - E
G = 15 - A - D
H = 15 - B - E
I = 15 - A - E

When A, B, D and E are selected for independent variables, their variable values are one (1) through nine (9).

$$A \leq 9 \qquad -A \leq -1$$
$$B \leq 9 \qquad -B \leq -1$$
$$15 - A - B \leq 9 \qquad -15 + A + B \leq -1 \ldots$$

A constraint violating inequality f=15-A-B>9 is considered here. Elements in row f of the table stored in the partial derivative coefficient storer 1390 for variables A, B, C and D are "−", "−", "0" and "0". An exemplary variable value combination (A=3, B=2, D=1, E=9) satisfies the constraint violating inequality f. Thus, the constraint violating condition creator 1350 creates the following constraint violating conditions for respective variables.

$C_A$: $A \leq 3$
$C_B$: $B \leq 2$
$C_C$: true
$C_D$: true

The constraint violating condition storer 1380 stores as a new constraint violating condition the logical product of all these constraint violating conditions, which is $A \leq 3$ & $B \leq 2$. This enables variable value combinations [(A=1, B=2), (A=2, B=1), etc.] satisfying the new constraint violating condition to be eliminated from the searching.

As described above, when a constraint violating inequality has a tendency of a monotonous decrease or a monotonous increase, a use of partial derivative coefficients enables constraint violating conditions to be created efficiently.

Generally, it requires a very sophisticated processing to precisely judge the sign of $\partial f_k / \partial x_i$. As described later, this invention has an advantage of enabling a sign to be judged precisely. Thus, the analytical ability of the partial derivative coefficient analyzer 1360 determines the scope of the problems to which this invention can be applied effectively.

The above preferred embodiment of this invention shows examples of a method and an execution of having a single processor computer system realize a constrained combination satisfying system or a constrained combination optimizing system. However, when the number of variables or that of constraint violating conditions (or constraint meeting conditions) increases, even the system based on the above method may have to incur a considerably longer computing time. Therefore, yet another embodiment is shown below, where a multiple processor computer system is used to configure a combination problem solving apparatus.

Figure 14:
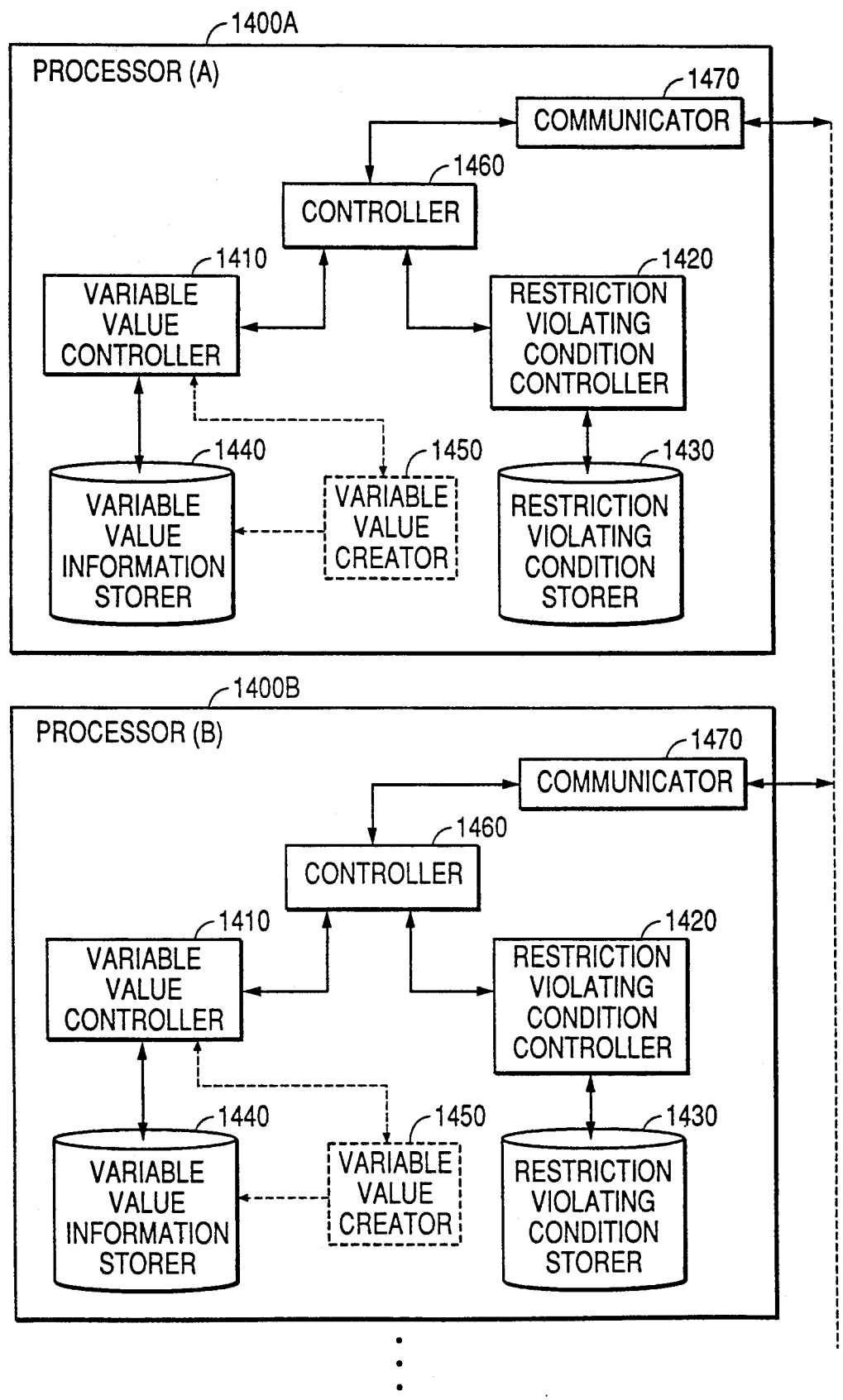
FIG. 14 shows the configuration of an embodiment of a parallel processing system.

FIG. 14 shows the configuration of an embodiment of a parallel processing system.

The system comprises a plurality of processors A, B, ... (1400A, 1400b, ... ), which work together to form a combination problem solving apparatus. Respective configurations of the processors A, B, ... (1400A, 1400B, ... ) are essentially the same as the system configuration shown in FIG. 3.

The processors A, B, ... (1400A, 1400B, ... ) each comprise a variable value controller 1410 and a constraint violating condition controller 1420. The variable value controller 1410 changes and selects the variable values. The constraint violating condition controller 1420 judges whether or not any of the currently effective variable values satisfy any of the stored constraint violating conditions, creates a new constraint violating condition if it is necessary, and registers the new constraint violating condition.

The processors A, B, ... (1400A, 1400B, ... ) each further comprise a constraint violating condition storer 1430 and a variable value information storer 1440 in their respective memories or files. The constraint violating condition storer 1430 stores a constraint violating condition, which is a logical expression representing a sufficient condition for causing a restriction to be violated. The variable value information storer 1440 stores attribute value information for respective values. Variable value information can be created as necessary during a combination satisfaction process, in which case, a variable value creator 1450 creates variable value information.

Although the single processor system shown in FIG. 3 has the controller 310 control the entire combination satisfaction process, a controller 1460 for each of the processors A, B, ... (1400A, 1400B, ... ) controls a partial combination satisfaction process by taking information set from another one of the processors A, B, ... (1400A, 1400B, ... ) into consideration.

In addition, the processors A, B, ... (1400A, 1400B, ... ) each further comprise a communicator 1470 as a part peculiar to the parallel processing system. The communicator 1470 takes charge of a communication with other ones of the processors A, B, ... (1400A, 1400B, ... ). That is, the communicator 1470 notifies the foreign ones of the processors A, B, ... (1400A, 1400B, ... ) of the home result and receives the foreign results from them.

Figure 15A:
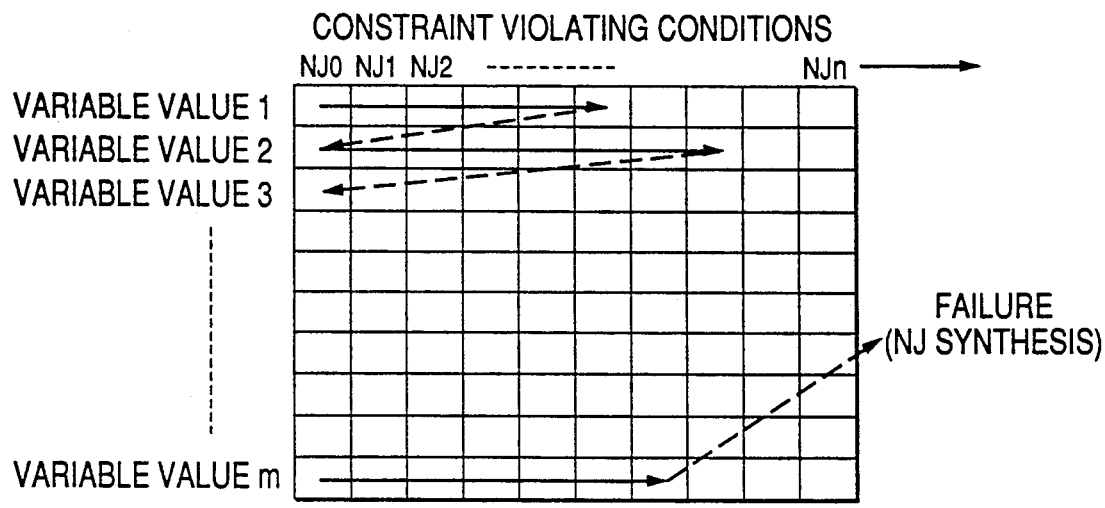
FIGS. 15A and 15B illustrate operations of the parallel processing system.
Figure 15B:
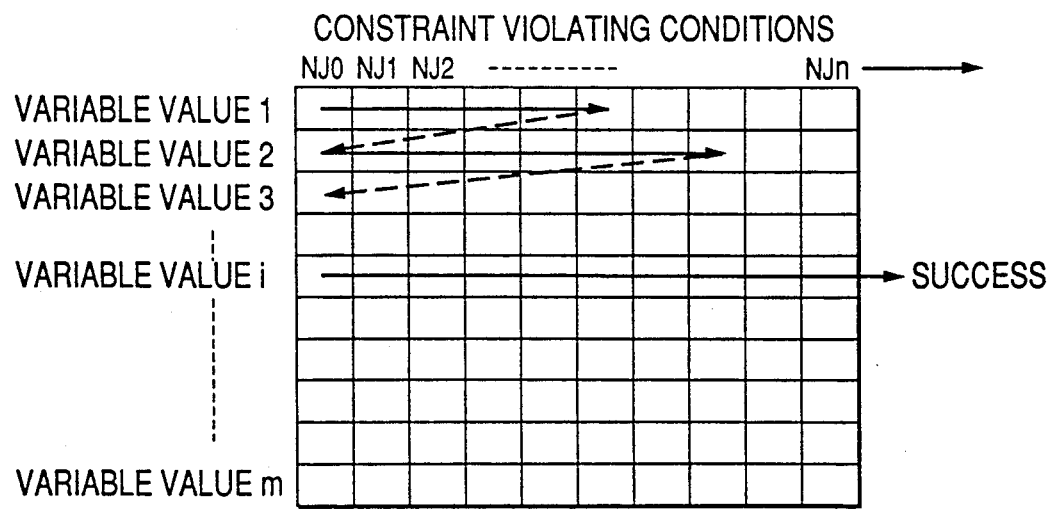

FIGS. 15A and 15B illustrate operations of the parallel processing system.

Assuming that NJ0 through NJn are constraint violating conditions and that the alternatives for variable values are variable value 1 through variable value m, there are two (2) cases shown as FIGS. 15A and 15B, when an examination is made to judge whether or not a constraint violating condition is satisfied.

The case shown in FIG. 15A illustrates an example where all variable values 1 through m satisfy any of the sequentially examined constraint violating conditions NJ0 through NJn. That is, all the variable values are prohibited from a change or a selection, and a constraint violating condition is synthesized to utilize the result in the next process.

The case shown in FIG. 15B illustrates an example where variable value i satisfies none of the constraint violating conditions NJ0 through NJn.

As explained above, it generally takes an awful lot of time to examine a large number of variable values whether or not the variable values satisfy a multitude of constraint violating conditions. When this invention is applied to solving an actual problem, because the number of constraint violating conditions is extremely large, it takes a large amount of time is required for obtaining a solution. For instance, more than ninety-four percents (94%) of the computing time for solving such a combination problem is spent for examining constraint violating conditions.

Under such a circumstance, it is deemed to be appropriate to parallel the processes in further expediting the satisfaction and the optimization of a constrained combination.

FIGS. 16A through 16D illustrate four (4) methods for paralleling the solving processes.

Figure 16A:
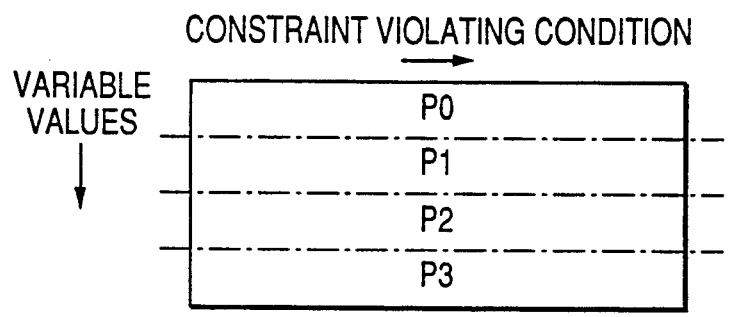
FIG. 16A through 16D illustrate four (4) methods for paralleling the solving processes.

FIG. 16A shows a case where a plurality of processors share respective variable values. Assuming four (4)

processors P0 through P3 are available for use, they share variable values of examination objects. Because the processors P0 through P3 need only examine the hitherto created and stored constraint violating conditions about the assigned variable values, the time necessary for obtaining a variable value not satisfying any of the constraint violating conditions is shortened than the time required in a case where the solving processes are executed by a single processor system.

Figure 16B:
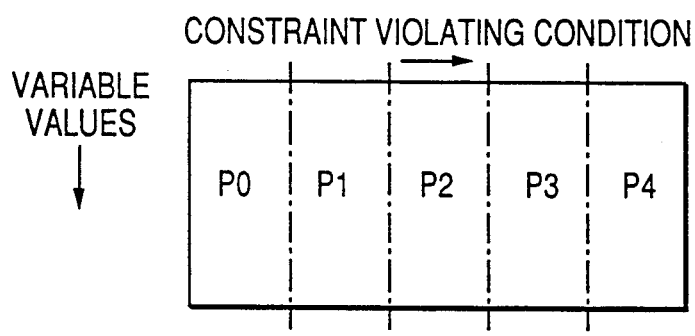

FIG. 16B shows a case where a plurality of processors share respective constraint violating conditions. Assuming five (5) processors P0 through P4 are available for use, they share respective constraint violating conditions. Because this enables the constraint violating conditions assigned to respective processors to decrease in number, the time necessary for examining an existence of a satisfied one of the constraint violating conditions is shortened than the time required by a single processor system.

Figure 16C:
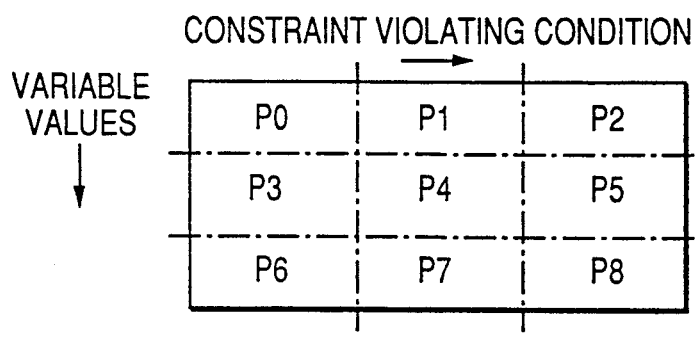

FIG. 16C shows a case where a plurality of processors share respective variable values and constraint violating conditions, which is a combination of the cases shown in FIGS. 16A and 16B. Assuming nine (9) processors P0 through P8 are available for use, they share variable values of examination objects and constraint violating conditions. Because the processors P0 through P8 need only examine the assigned constraint violating conditions about the assigned variable values, the time necessary for changing and selecting a variable value is shortened than the time required in a case where the solving processes are executed by a single processor system.

Figure 16D:
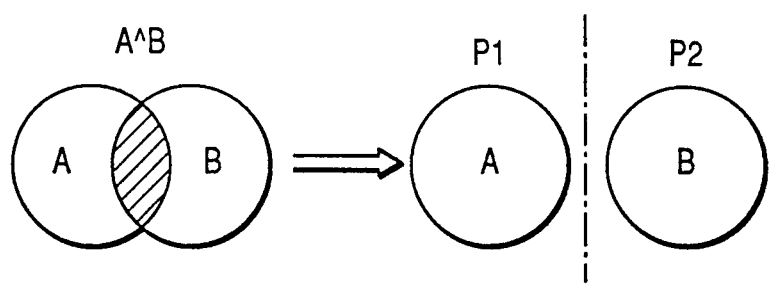

FIG. 16D shows a case where a plurality of processors share respective partial constraint violating conditions, where a constraint violating condition is obtained as their logical product. Assuming two (2) processors P1 and P2 are available for use, they share respective partial constraint violating conditions. For example, a constraint violating condition being the logical product of conditions A and B is split into partial logical expressions of the conditions A and B. Processor P1 examines condition A and processor P2 examines condition B. Because this enables the constraint violating conditions assigned to respective processors to decrease in length, the time necessary for examining an existence of a satisfied one of the constraint violating conditions is shortened than the time required by a single processor system.

Figure 17:
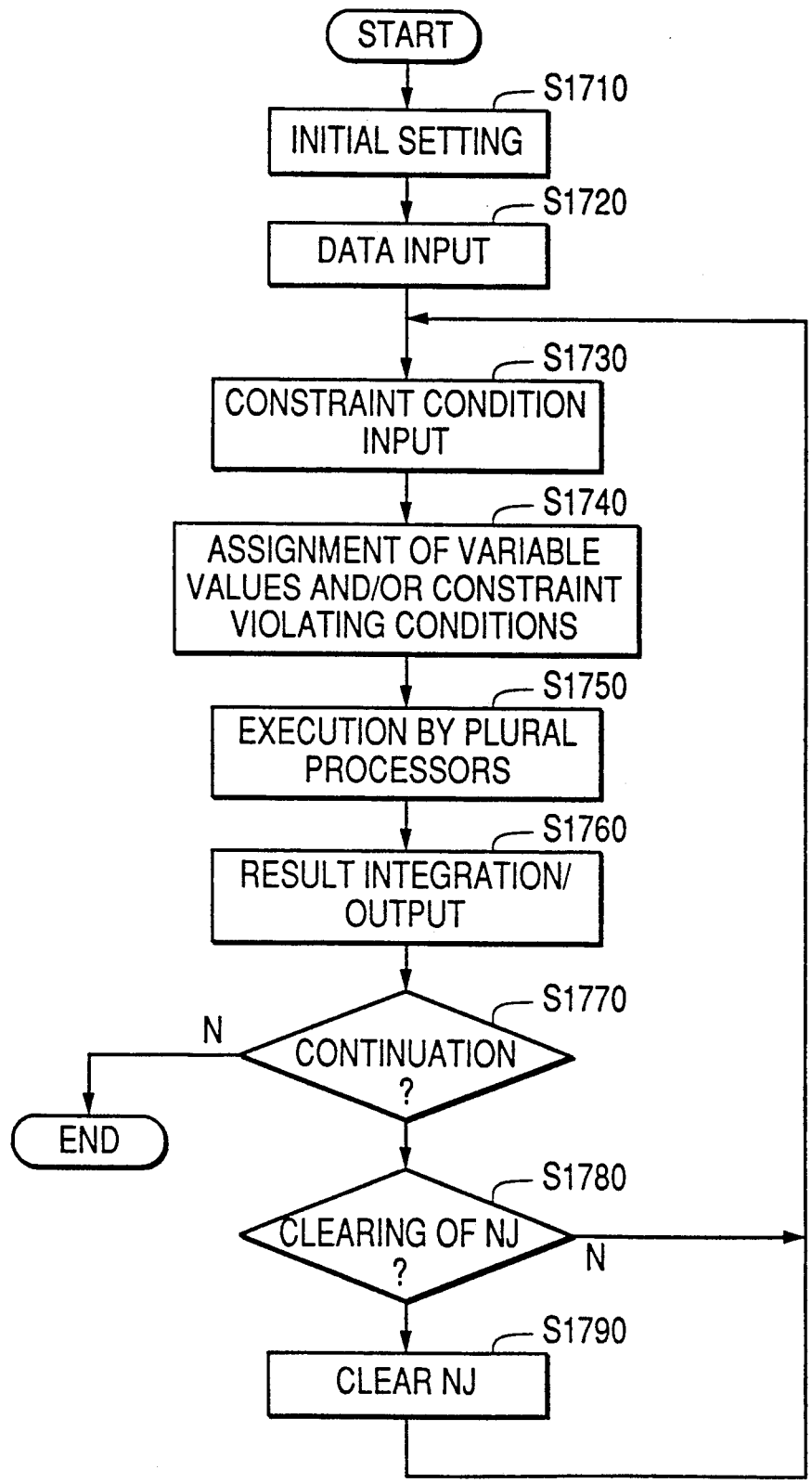
FIG. 17 illustrates a schematic flow of the parallel processing system shown in FIG. 14.

FIG. 17 illustrates a schematic flow of the parallel processing system shown in FIG. 14.

S1710: After the process starts, an initial setting is made for a table for controlling a constraint violating condition and others. The process continues to S1720.

S1720: Relevant data (such as attribute values of respective variables) are inputted. The process continues to S1730.

S1730: Constraint violating conditions (constraint meeting conditions) formed from a set of inequalities supplied from the user are inputted. The process continues to S1740.

S1740: Variable values and/or constraint violating conditions are assigned to respective ones of plural processors in any of the methods shown in FIGS. 16A through 16D. The process continues to S1750.

S1750: The processors simultaneously execute respective constraint satisfaction processes for the assigned variable values and/or the assigned constraint violating conditions. The process continues to S1760.

S1760: When the plural processors finish their respective processes, their results are integrated and outputted. The process continues to S1770.

S1770: It is judged whether or not to continue the process. If the judgment is negative (N), a final result is obtained and outputted as the solution, and the processes are terminated. If the judgment is affirmative (Y), the process continues to S1780.

S1780: The user is asked whether or not he wished to clear the constraint violating condition NJ. If he answers affirmatively (Y), the process continues to S1790. If he answers negatively (N), the process reverts to S1730 in a loop form.

S1790: After the constraint violating condition NJ is cleared, the process reverts to S1730 in a loop form.

Figure 18:
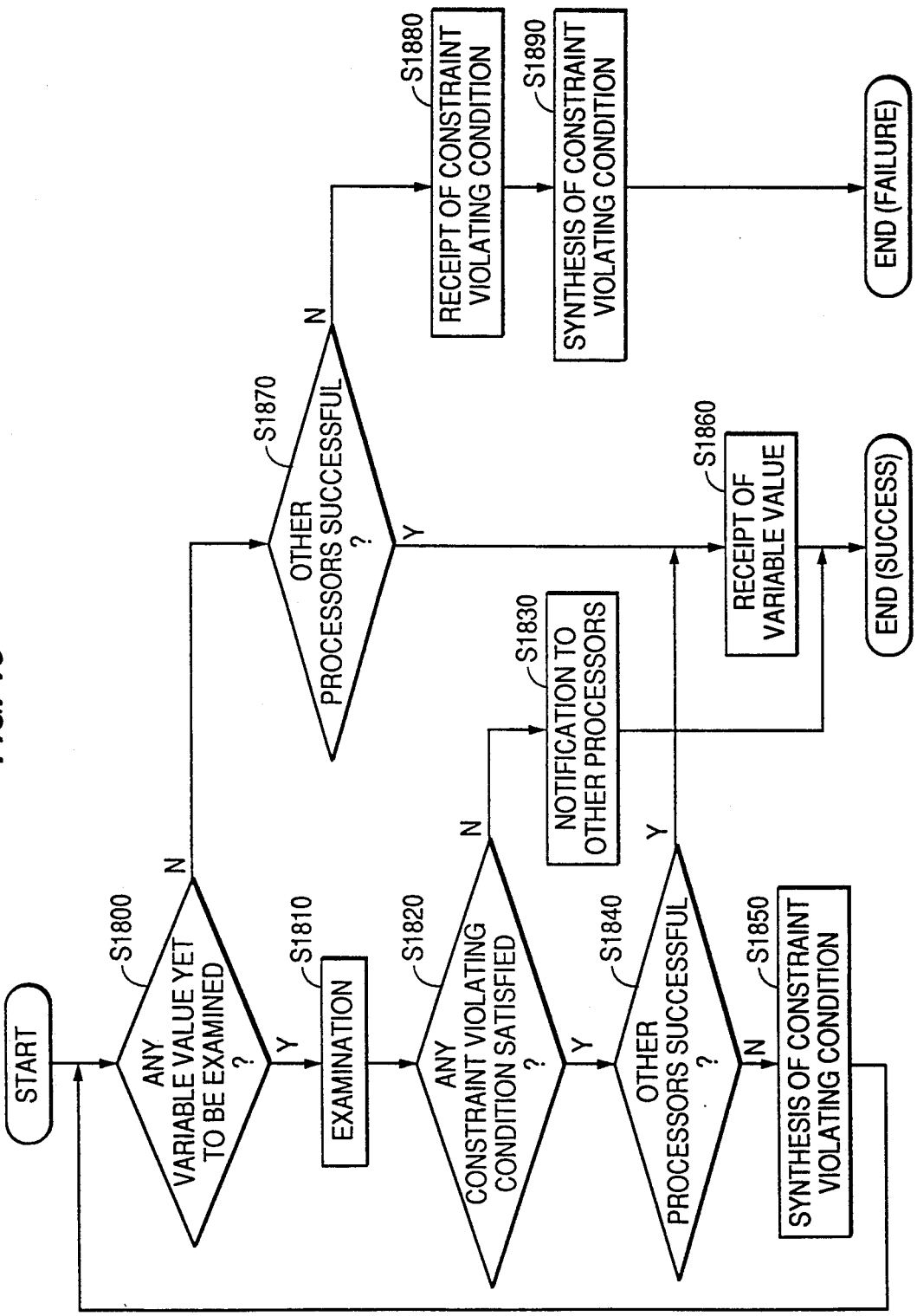
FIG. 18 is a flowchart for changing and selecting a variable value by the parallel processing system shown in FIG. 16A.

FIG. 18 is a flowchart for changing and selecting a variable value by the parallel processing system shown in FIG. 16A.

The flows shown in FIG. 18 correspond to a case shown in FIG. 16A where plural processors share the variable values. Respective processors similarly process different variable values assigned.

S1800: After the process starts, it is judged whether or not any variable value is yet to be examined. If the judgment is affirmative (Y), the process continues to S1810. If the judgment is negative (N), the process skips to S1870.

S1810: Respective constraint violating conditions stored in the constraint violating condition storer are examined for their satisfactions. The process continues to S1820.

S1820: It is judged whether or not any constraint violating condition is satisfied. If the judgment is negative (N), the process continues to S1830. If the judgment is affirmative (Y), the process skips to S1840.

S1830: Other processors are notified that no satisfied constraint violating condition is found. The process ends as a success.

S1840: It is judged whether or not other processors succeed in changing/selecting a variable value by receiving their detection results. If the judgment is negative (N), the process continues to S1850. If the judgment is affirmative (Y), the process skips to S1860.

S1850: A new constraint violating condition is synthesized. The process reverts to S1800 in a loop form to examine the next variable value.

S1860: Variable values successfully changed or selected by other processors are received. The variable value change process or the variable value selection process ends as a success.

S1870: It is judged whether or not other processors have succeeded in changing or selecting a variable value based on their notifications. If the judgment is affirmative (Y), the process proceeds to S1860. If the judgment is negative (N), the process continues on to S1880.

S1880: Because a constraint violating condition is satisfied by another processor, the constraint violating condition is received, when the variable value is changed or selected.

S1890: A new constraint violating condition is synthesized and registered. The process ends as a failure.

Although this example causes the results of other processors to be judged each time, an arrangement can also be made such that an interruption made by the communicator 1470 shown in FIG. 14 causes the results of other processors to be judged when they are received.

FIG. 19 is a flowchart for examining a constraint violating condition for the parallel processing system shown in FIG. 16B. The flows shown in FIG. 19 correspond to a case shown in FIG. 16B where plural processors share the variable values. Respective processors similarly process different variable values assigned.

S1900: After the process starts, it is judged whether or not there is any constraint violating condition yet to be examined. If the judgment is affirmative (Y), the process continues to S1910. If the judgment is negative (N), the process skips to S1940.

S1910: The constraint violating condition not yet examined is examined. The process continues to S1920.

S1920: It is judged whether or not the constraint violating condition is satisfied. If the judgment is affirmative (Y), the process continues to S1930. If the judgment is negative (N), the process reverts to S1900 in a loop form.

S1930: Another processor is notified of the satisfied constraint violating condition. The process ends for the current variable value and continues for the next variable value. A new constraint violating condition can also be synthesized at this time.

S1940: It is judged whether or not any constraint violating condition is satisfied at another processor when the examination results of other processors are received. If the judgment is affirmative (Y), the process continues to S1950. If the judgment is negative (N), because the variable value change or selection succeeds, the current process ends and the next process starts to examine whether or not any unknown variable value remains.

S1950: The constraint violating condition satisfied by another processor is received. The process continues to S1960.

S1960. A new constraint violating condition is synthesized. The process ends for the current variable value and continues for the next variable value.

When a satisfied constraint violating condition is received from another processor before all the locally stored constraint violating condition is examined, the currently executed examination may be interrupted.

Processors can also parallelly examine constraint violating conditions in similarly coordinated manners, even when a plurality of processors share respective variable values and constraint violating conditions as shown in FIG. 16C, or respective partial constraint violating conditions forming a constraint violating condition as their logical product.

As described above, by individually assigning variable values and constraint violating conditions to respective processors, the time required for examining constraint violating conditions, which takes up the bulk in processing a combination problem, can be reduced commensurately with the number of the processors.

What is claimed:

1. A combination problem solving apparatus for solving constrained combination satisfaction problems by having a computer perform a process to determine discrete values of respective variables in which a constraint is given by a set of inequalities and equalities and for solving combination optimization problems by having the computer determine the discrete values of the respective variables to minimize or maximize a value of a given objective function, said combination problem solving apparatus, inside said computer comprising:

an initial constraint violating inequality creator for creating constraint violating inequalities reciprocal to an externally supplied set of inequalities (comprising inequalities and equalities);

a variable value changer for changing a variable value including an initial and a current variable value by comparing a constraint satisfaction of a current value to another value;

a variable value selector for selecting the variable value such that not all constraint violating conditions are satisfied;

a constraint violating condition creator for creating a new constraint violating condition obtained as a logical produce of simplified inequalities by digitizing a variable appearing in a constraint violating condition created from a constraint violating inequality when non of the values meet the constraints produced by said variable value changer and said variable value selector (i.e. when at least one (1) constraint violating condition is satisfied);

a memory, connected to said constraint violating creator and storing the constraint violating inequalities created by said initial constraint violating inequality creator and the new constraint violating condition created by said constraint violating condition creator; and controller means for receiving the initial current variable value, for iterating the process, and for stopping the process when a solution is determined.

2. The combination problem solving apparatus according to claim 1, wherein:

said constraint violating condition storer deletes an already stored constraint violating condition stronger than a new constraint violating condition when said constraint violating condition is stored.

3. The combination problem solving apparatus according to claim 1, wherein:

said initial constraint violating inequality creator creates two (2) constraint violating inequalities equivalent to an equality when said externally supplied set of inequalities includes said equality.

4. The combination problem solving apparatus according to claim 1, wherein said initial constraint violating inequality creator obtains a solution for a combination optimization problem by repeating an operation of a combination satisfaction problem solving means comprising:

means for creating a variable inequality corresponding to an objective function supplied externally in addition to constraint violating inequalities when said combination problem solving apparatus solves a combination optimization problem to minimize (maximize) the value of said objective function;

means for solving a constrained combination satisfaction problem for the constraints defined by the inequalities to which a variable inequality are added; and means for updating a constraint value of said variable inequality corresponding to said objective function to a value obtained by subtracting (adding) a predetermined positive number from (to) an obtained objective function value.

5. The combination problem solving apparatus according to claim 1, wherein:
when said combination problem solving apparatus solves a problem in which not all variable values are known from the beginning and a new variable value is added, said constraint violating condition creator attaches a flag indicating that there exists no more variable value corresponding to a created constraint violating condition stored in said constraint violating condition storer, and cancels said flag upon using a new variable value for the corresponding value.

6. The combination problem solving apparatus according to claim 1, wherein:
when any of the variable value combinations set by said variable value changer and said variable value selector do not satisfy the constraint, i.e. when one of the constraint violating inequalities is satisfied, said constraint violating condition creator creates a constraint violating condition from a partial derivative coefficient of a function in an inequality, thereby efficiently solving a problem expressed by an inequality having a monotonic function.

7. The combination problem solving apparatus according to claim 1, wherein:
a plurality of processors are used to parallelly process a constrained combination satisfaction problem or a constrained combination optimization problem to improve the processing speed by individually assigning said variable values changed by said variable value changer and selected by said variable value selector to respective processors.

8. The combination problem solving apparatus according to claim 1, wherein:
a plurality of processors are used to parallelly process a constrained combination satisfaction problem or a constrained combination optimization problem to improve the processing speed by individually assigning said constraint violating conditions to respective processors.

9. The combination problem solving apparatus according to claim 1, wherein:
a plurality of processors are used to parallelly process a constrained combination satisfaction problem or a constrained combination optimization problem to improve the processing speed by individually assigning said variable values changed by said variable value changer and selected by said variable value selector as well as said constraint violating conditions to respective processors.

10. The combination problem solving apparatus according to claim 1, wherein:
a plurality of processors are used to parallelly process a constrained combination satisfaction problem or a constrained combination optimization problem to improve the processing speed by individually assigning conjuncts of said constraint violating conditions to respective processors.

11. A combination problem solving apparatus for solving constrained combination satisfaction problems by having a computer perform a process to determine discrete values of respective variables in which a constraint is given by a set of inequalities and equalities, and for solving combination optimization problems by having the computer determine the discrete values of the respective variables to minimize or maximize a value of a given objective function, said combination problem solving apparatus inside said computer comprising:

an initial constraint meeting inequality creator for creating constraint meeting inequalities indicating a satisfaction of constraints from an externally supplied set or inequalities (comprising inequalities and equalities);

a variable value changer for changing a variable value including an initial and a current variable value for comparing a constraint satisfaction of a current value to another value;

a variable value selector for selecting the variable value such that not all constraint meeting conditions are satisfied;

a constraint meeting condition creator for creating a new constraint meeting condition obtained as a logical sum of simplified inequalities by digitizing a variable appearing in a constraint meeting condition created from a constraint meeting inequality when non of the values meet the constraints produced by said variable value changer and said variable value selector (i.e. when at least one (1) constraint meeting condition is not satisfied);

a memory, connected to said constraint meeting condition creator and storing the constraint meeting inequality created by said initial constraint meeting inequality creator and the new constraint meeting condition created by said constraint meeting condition creator; and controller means for receiving the initial current variable value, for iterating the process, and for stopping the process when a solution is determined.

12. The combination problem solving apparatus according to claim 11, wherein:
said constraint meeting condition storer deletes an already stored constraint meeting condition weaker than a new constraint meeting condition when said constraint meeting condition is stored.

13. The combination problem solving apparatus according to claim 11, wherein:
said initial constraint meeting inequality creator creates two (2) constraint meeting inequalities equivalent to an equality when said externally supplied set of inequalities includes said equality.

14. The combination problem solving apparatus according to claim 11, wherein said initial constraint meeting inequality creator obtains a solution to a combination optimization problem by repeating an operation of a combination satisfaction problem solving means comprising:

means for creating a variable inequality corresponding to an objective function supplied externally in addition to a constraint meeting inequality when said combination problem solving apparatus solves a combination optimization problem to minimize (maximize) the value of said objective function;

means for solving a constrained combination satisfaction problem for the constraints defined by the inequalities to which a variable inequality is added; and means for updating a constraint value of said variable inequality corresponding to said objective function to a value obtained by subtracting (adding) a predetermined positive number from (to) an obtained objective function value.

15. The combination problem solving apparatus according to claim 11, wherein:
when said combination problem solving apparatus solves a problem in which not all variable values are known from the beginning and a new variable value is added, said constraint meeting condition creator attaches a flag indicating that there remains a variable value corresponding to a created constraint meeting condition stored in said constraint meeting condition storer, and turns said flag on using a new variable value for the corresponding value.

16. The combination problem solving apparatus according to claim 11, wherein:
when any of the variable value combinations set by said variable value changer and said variable value selector does not satisfy the required condition, i.e. when one of the constraint meeting inequalities is not satisfied, said constraint meeting condition creator creates a constraint meeting condition from a partial derivative coefficient of a function in an inequality, thereby efficiently solving a problem expressed by an inequality having a monotonic function.

17. The combination problem solving apparatus according to claim 11, wherein:
a plurality of processors are used to parallelly process a constrained combination satisfaction problem or a constrained combination optimization problem for improving a processing speed by individually assigning to respective processors said variable values changed by said variable value changer and selected by said variable value selector.

18. The combination problem solving apparatus according to claim 11, wherein:
a plurality of processors are used to parallelly process a constrained combination satisfaction problem or a constrained combination optimization problem for improving a processing speed by individually assigning said constraint meeting conditions to respective processors.

19. The combination problem solving apparatus according to claim 11, wherein:
a plurality of processors are used to parallelly process a constrained combination satisfaction problem or a constrained combination optimization problem to improve a processing speed by individually assigning to respective processors said variable values changed by said variable value changer and selected by said variable value selector as well as said constraint meeting conditions.

20. The combination problem solving apparatus according to claim 11, wherein:
a plurality of processors are used to parallelly process a constrained combination satisfaction problem or a constrained combination optimization problem to improve a processing speed by individually assigning disjunctions of said constraint meeting conditions to respective processors.

* * * * *